United States Patent
Sugizaki

(10) Patent No.: US 10,797,093 B2
(45) Date of Patent: Oct. 6, 2020

(54) IMAGING ELEMENT, MANUFACTURING METHOD OF IMAGING ELEMENT, METAL THIN FILM FILTER, AND ELECTRONIC DEVICE

(71) Applicant: Sony Semiconductor Solutions Corporation, Kanagawa (JP)

(72) Inventor: Taro Sugizaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/465,172

(22) PCT Filed: Dec. 12, 2017

(86) PCT No.: PCT/JP2017/044626
§ 371 (c)(1),
(2) Date: May 30, 2019

(87) PCT Pub. No.: WO2018/110570
PCT Pub. Date: Jun. 21, 2018

(65) Prior Publication Data
US 2019/0341412 A1 Nov. 7, 2019

(30) Foreign Application Priority Data
Dec. 13, 2016 (JP) .................. 2016-241253

(51) Int. Cl.
*H01L 27/146* (2006.01)
(52) U.S. Cl.
CPC .. *H01L 27/14621* (2013.01); *H01L 27/14603* (2013.01); *H01L 27/14645* (2013.01)
(58) Field of Classification Search
CPC ........... H01L 27/1462; H01L 27/14605; H01L 27/14603; H01L 27/14621; H01L 27/322; H01L 27/14645; G02B 5/1809
See application file for complete search history.

(56) References Cited

U.S. PATENT DOCUMENTS

2005/0103983 A1* 5/2005 Yamaguchi ....... H01L 27/14685
250/214.1
2008/0170143 A1 7/2008 Yoshida
(Continued)

FOREIGN PATENT DOCUMENTS

EP 2432019 A1 3/2012
JP 2010-165718 A 7/2010
(Continued)

OTHER PUBLICATIONS

International Search Report and Written Opinion dated Mar. 6, 2018 in connection with International Application No. PCT/JP2017/044626.

(Continued)

*Primary Examiner* — Changhyun Yi
(74) *Attorney, Agent, or Firm* — Wolf, Greenfield & Sacks, P.C.

(57) ABSTRACT

According to some aspects, an imaging device is provided comprising a photoelectric conversion layer configured to receive light and to produce an electric charge in response to the received light, including a first filter region corresponding to a first pixel of the imaging device, the first filter region having a first thickness and a plurality of through holes formed therein, wherein the first filter region transmits light incident on the first filter region with a first peak transmission wavelength, and a second filter region corresponding to a second pixel of the imaging device, the second filter region having a second thickness greater than the first thickness and having a plurality of through holes formed therein, wherein the second filter region transmits light incident on the second filter region with a second peak transmission wavelength that is greater than the first peak transmission wavelength.

20 Claims, 41 Drawing Sheets

(56) References Cited

U.S. PATENT DOCUMENTS

| | | | |
|---|---|---|---|
| 2009/0146198 A1* | 6/2009 | Joe | H01L 27/14621 257/292 |
| 2010/0059663 A1* | 3/2010 | Desieres | G01J 3/36 250/226 |
| 2010/0176280 A1 | 7/2010 | Yokogawa | |
| 2010/0220377 A1 | 9/2010 | Yamada et al. | |
| 2012/0061553 A1 | 3/2012 | Yokogawa | |
| 2012/0075688 A1 | 3/2012 | Yamada et al. | |
| 2012/0319222 A1 | 12/2012 | Ozawa et al. | |
| 2014/0191113 A1* | 7/2014 | Atwater | H01L 31/0232 250/208.1 |
| 2015/0206912 A1 | 7/2015 | Kanamori et al. | |

FOREIGN PATENT DOCUMENTS

| | | |
|---|---|---|
| WO | WO 2005/013369 A1 | 2/2005 |
| WO | WO 2006/028128 A1 | 3/2006 |
| WO | WO 2005/013369 A1 | 9/2006 |
| WO | WO 2006-028128 A1 | 5/2008 |
| WO | WO 2009/011439 A1 | 1/2009 |
| WO | WO 2012/032939 A1 | 3/2012 |
| WO | WO 2016/016635 A1 | 2/2016 |

OTHER PUBLICATIONS

International Search Report and Written Opinion dated Feb. 28, 2018 in connection with International Application No. PCT/JP2017/044627.

Ahn et al., Fabrication of a 50 nm half-pitch wire grid polarizer using nanoimprint lithography, Nanotechnology, Jul. 2005, vol. 16, No. 9, p. 1874, https://www.researchgate.net/publication/231087783_Fabrication_of_a_50_nm_half-pitch_wire_grid_polarizer_using_nanoimprint_lithography, retrieved Mar. 27, 2017.

Catrysse et al, Integrated color pixels in 0.18-microm complementary metal oxide semiconductor technology. J. Opt. Soc. Am. A, Dec. 2003, vol. 20, No. 12, pp. 2293-2306.

Goldsmith, P.F., Quasioptical Frequency Selective Components, Planar Structures, In: Quasioptical Systems: Gaussian Beam Quasioptical. Propogation and Applications, 1998, Chapter 9:242-251.

International Preliminary Report on Patentability dated Jun. 27, 2019 in connection with International Application No. PCT/JP2017/044627.

International Preliminary Report on Patentability dated Jun. 27, 2019 in connection with International Application No. PCT/JP2017/044626.

* cited by examiner

FIG. 32
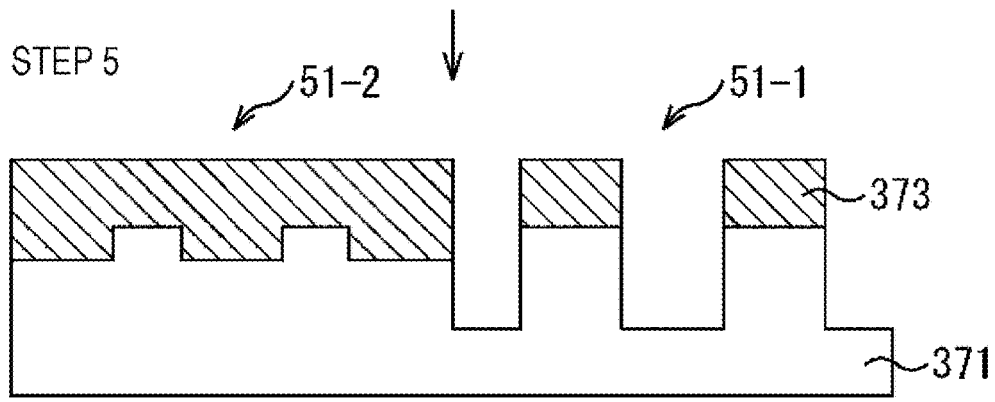
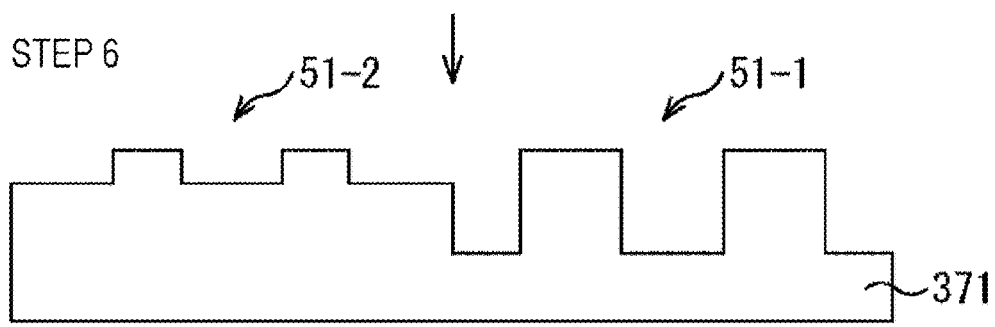
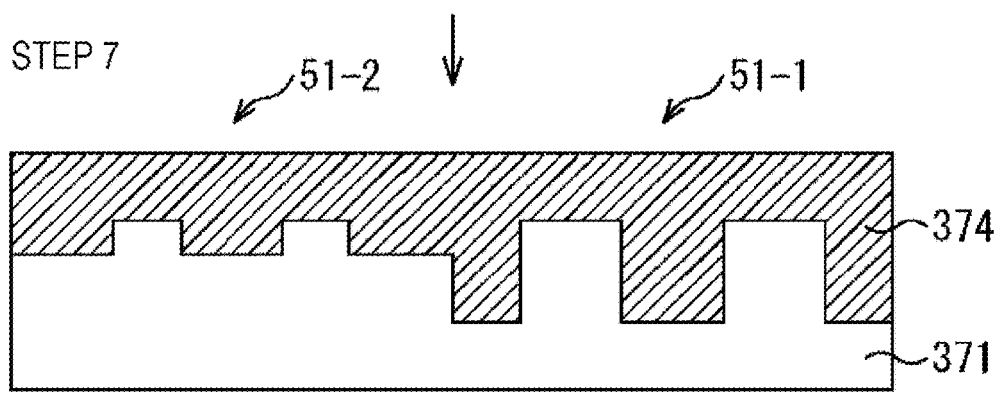
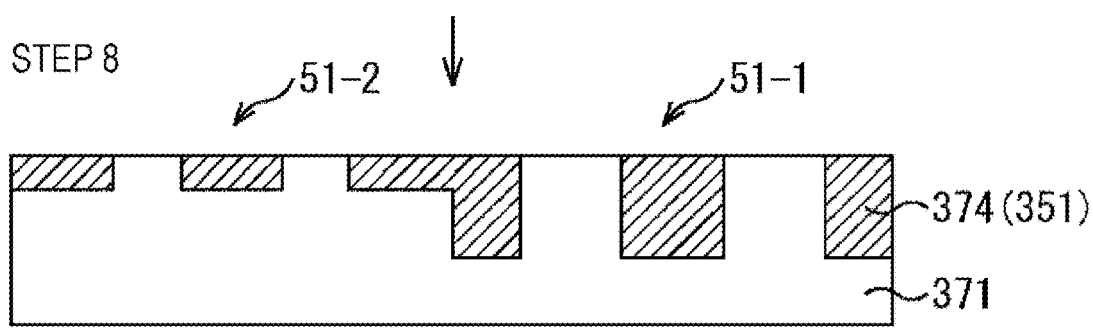

FIG. 35

| DETECTION TARGET | DETECTION ITEM | PEAK WAVELENGTH | HALF WIDTH |
|---|---|---|---|
| MYOGLOBIN | TASTINESS COMPONENT | 580-630nm | 30-50nm |
| OLEIC ACID | FRESHNESS | 970nm | 50-100nm |
| CHLOROPHYLL | FRESHNESS | 650-700nm | 50-100nm |

FIG. 36

| FRUIT | DETECTION TARGET | DETECTION ITEM | PEAK WAVELENGTH | HALF WIDTH |
|---|---|---|---|---|
| MELON RAIDEN | SUGAR CONTENT | FLESH LIGHT PATH LENGTH | 880nm | 20-30nm |
| | | SUCROSE | 910nm | 40-50nm |
| MELON RAIDEN RED | SUGAR CONTENT | SUCROSE | 915nm | 40-50nm |
| | | MOISTURE | 955nm | 20-30nm |
| APPLE | SUGAR CONTENT | SUCROSE | 912nm | 40-50nm |
| | MOISTURE | WATER | 844nm | 30nm |
| MANDARIN ORANGE | SUGAR CONTENT | SUCROSE | 914nm | 40-50nm |

FIG. 37

| DETECTION TARGET | PEAK WAVELENGTH | HALF WIDTH |
|---|---|---|
| PET | 1669nm | 30-50nm |
| PS | 1688nm | 30-50nm |
| PE | 1735nm | 30-50nm |
| PVC | 1716-1726nm | 30-50nm |
| PP | 1716-1735nm | 30-50nm | ively filter incident light according to wavelengths of the light, and a photoelectric conversion layer configured to receive light filtered by the filter layer and to produce an electric charge in response to the received light, wherein the filter layer includes a first filter region corresponding to a first pixel of the imaging device, the first filter region having a first thickness and a plurality of through holes formed therein, wherein the first filter region transmits light incident on the first filter region with a first peak transmission wavelength, and a second filter region corresponding to a second pixel of the imaging device, the second filter region having a second thickness greater than the first thickness and having a plurality of through holes formed therein, wherein the second filter region transmits light incident on the second filter region with a second peak transmission wavelength that is greater than the first peak transmission wavelength.

IMAGING ELEMENT, MANUFACTURING METHOD OF IMAGING ELEMENT, METAL THIN FILM FILTER, AND ELECTRONIC DEVICE

TECHNICAL FIELD

A technology according to an embodiment of the present disclosure (hereinafter, also referred to as the present technology) relates to an imaging element, a manufacturing method of an imaging element, a metal thin film filter, and an electronic device, and in particular, relates to an imaging element, a manufacturing method of an imaging element, a metal thin film filter, and an electronic device, which are suitable to be used for detecting light in a narrow wavelength band.

CROSS REFERENCE TO RELATED APPLICATIONS

This is a U.S. National Stage Application under 35 U.S.C. § 371, based on International Application No. PCT/JP2017/044626, filed Dec. 12, 2017, which claims priority to Japanese Priority Patent Application JP 2016-241253 filed on Dec. 13, 2016, each of which is hereby incorporated by reference in its entirety.

BACKGROUND ART

In the related art, an imaging element detecting light in a predetermined narrow wavelength band (a narrow band) (hereinafter, also referred to as narrow band light) by using a plasmon filter is proposed (for example, refer to PTL 1).

CITATION LIST

Patent Literature

PTL 1: JP 2010-165718A

SUMMARY OF INVENTION

Technical Problem

However, in a plasmon filter having a hole array structure, a wavelength band (a transmission band) of light to be transmitted is shifted to a short wavelength side as a pitch between holes formed on a metal thin film (hereinafter, referred to as a hole pitch) narrows, and the transmission band is shifted to a long wavelength side as the hole pitch widens.

On the other hand, in a certain region where the hole pitch narrows to some extent, and the transmission band is the short wavelength, the sensitivity of the plasmon filter decreases. In addition, a width in the vicinity of a peak wavelength of spectral characteristics of the plasmon filter (hereinafter, referred to as a peak width) and a half width widen as the hole pitch widens and the transmission band is the long wavelength. As a result thereof, there is a concern that a detection accuracy of narrow band light decreases.

The present technology has been made in consideration of such circumstances described above, and is capable of improving a detection accuracy of narrow band light.

Solution to Problem

According to the present disclosure, an imaging device is provided comprising a filter layer configured to selectively filter incident light according to wavelengths of the light, and a photoelectric conversion layer configured to receive light filtered by the filter layer and to produce an electric charge in response to the received light, wherein the filter layer includes a first filter region corresponding to a first pixel of the imaging device, the first filter region having a first thickness and a plurality of through holes formed therein, wherein the first filter region transmits light incident on the first filter region with a first peak transmission wavelength, and a second filter region corresponding to a second pixel of the imaging device, the second filter region having a second thickness greater than the first thickness and having a plurality of through holes formed therein, wherein the second filter region transmits light incident on the second filter region with a second peak transmission wavelength that is greater than the first peak transmission wavelength.

Further according to the present disclosure, an imaging device is provided comprising a filter layer configured to selectively filter incident light according to wavelengths of the light, and a photoelectric conversion layer configured to receive light filtered by the filter layer and to produce an electric charge in response to the received light, wherein the filter layer includes a first filter region corresponding to a first pixel of the imaging device, the first filter region having a first thickness and a dot array formed therein, wherein the first filter region transmits light incident on the first filter region with a first peak absorption wavelength, an a second filter region corresponding to a second pixel of the imaging device, the second filter region having a second thickness greater than the first thickness and having a dot array formed therein, wherein the second filter region transmits light incident on the second filter region with a second peak absorption wavelength that is greater than the first peak absorption wavelength.

Advantageous Effects of Invention

According to the first aspect, the fourth aspect, or the fifth aspect of the present technology, it is possible to improve a detection accuracy of light in a narrow wavelength band.

According to the second aspect or the third aspect of the present technology, it is possible to form a metal thin film filter of which a film thickness of a conductor thin film is different according to a pixel. As a result thereof, it is possible to improve the detection accuracy of the light in the narrow wavelength band.

Furthermore, the effects described above are not necessarily limited, and may be any effect described in the present disclosure.

BRIEF DESCRIPTION OF DRAWINGS

FIG. 32 is a diagram for illustrating the manufacturing method of the plasmon filter of FIG. 30.

FIG. 35 is a diagram illustrating an example of a detection band in a case where the tastiness or the freshness of food is detected.

FIG. 36 is a diagram illustrating an example of a detection band in a case where a sugar content or the moisture of fruit is detected.

FIG. 37 is a diagram illustrating an example of a detection band in a case where plastic is sorted.

DESCRIPTION OF EMBODIMENTS

Hereinafter, aspects for carrying out the disclosure (hereinafter, referred to as an "embodiment") will be described in detail by using the drawings. Furthermore, the embodiments will be described in the following sequence.

1. First Embodiment
2. Second Embodiment
3. Modification Example
4. Application Example 1. First Embodiment First, an embodiment of an imaging device of the present technology will be described with reference to FIGS. 1 to 22.

<Configuration Example of Imaging Device>

Figure 1:
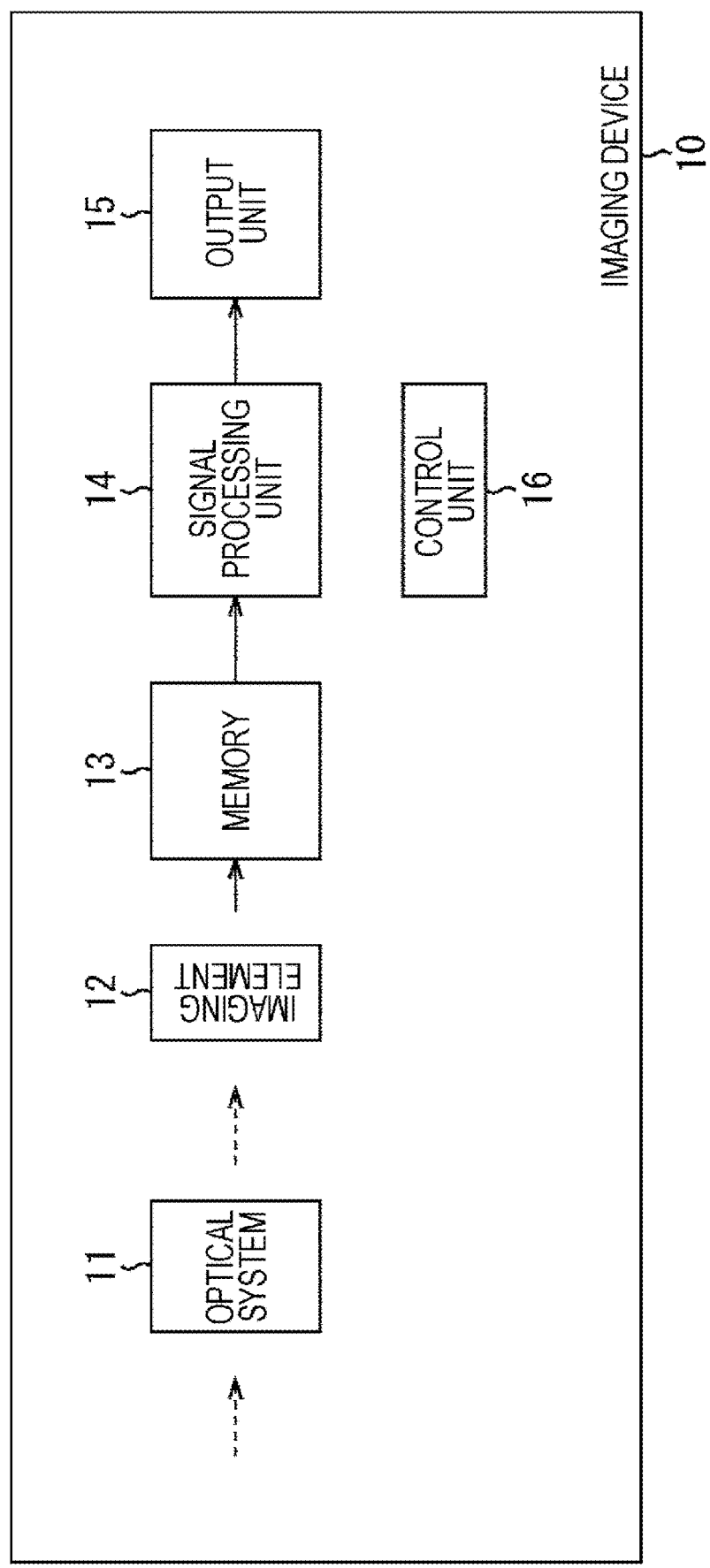
FIG. 1 is a block diagram illustrating an embodiment of an imaging device to which the present technology is applied.

FIG. 1 is a block diagram illustrating a first embodiment, which is one type of electronic devices to which the present technology is applied.

An imaging device 10 of FIG. 1, for example, is formed of a digital camera which is capable of imaging both of a still image and a moving image. In addition, the imaging device 10, for example, is formed of a multispectral camera which is capable of detecting light (multi-spectrum) of four or more wavelength bands (four or more bands) greater than three wavelength bands (three bands) of the related art of R (red), G (green), and B (blue) or Y (yellow), M (magenta), and C (cyan), based on three primary colors or a color-matching function.

The imaging device 10 includes an optical system 11, an imaging element 12, a memory 13, a signal processing unit 14, an output unit 15, and a control unit 16.

The optical system 11, for example, includes a zoom lens, a focus lens, a diaphragm, and the like, which are not illustrated, and allows light from the outside to be incident on the imaging element 12. In addition, as necessary, various filters such as a polarization filter are disposed on the optical system 11.

The imaging element 12, for example, is formed of a complementary metal oxide semiconductor (CMOS) image sensor. The imaging element 12 receives incident light from the optical system 11, and performs photoelectric conversion, and thus, outputs image data corresponding to the incident light.

The memory 13 temporarily stores the image data which is output from the imaging element 12.

The signal processing unit 14 performs signal processing (for example, processing such as elimination of a noise and adjustment of a white balance) using the image data stored in the memory 13, and thus, supplies the image data to the output unit 15.

The output unit 15 outputs the image data from the signal processing unit 14. For example, the output unit 15 includes a display (not illustrated) configured of a liquid crystal or the like, and displays a spectrum (an image) corresponding to the image data from the signal processing unit 14 as a so-called through image. For example, the output unit 15 includes a driver (not illustrated) driving a recording medium such as a semiconductor memory, a magnetic disk, and an optical disk, and records the image data from the signal processing unit 14 in a recording medium. For example, the output unit 15 functions as a communication interface for performing communication with respect to an external device (not illustrated), and transmits the image data from the signal processing unit 14 to the external device in a wireless manner or a wired manner.

The control unit 16 controls each of the units of the imaging device 10 according to an operation or the like of a user.

<Configuration Example of Circuit of Imaging Element>

Figure 2:
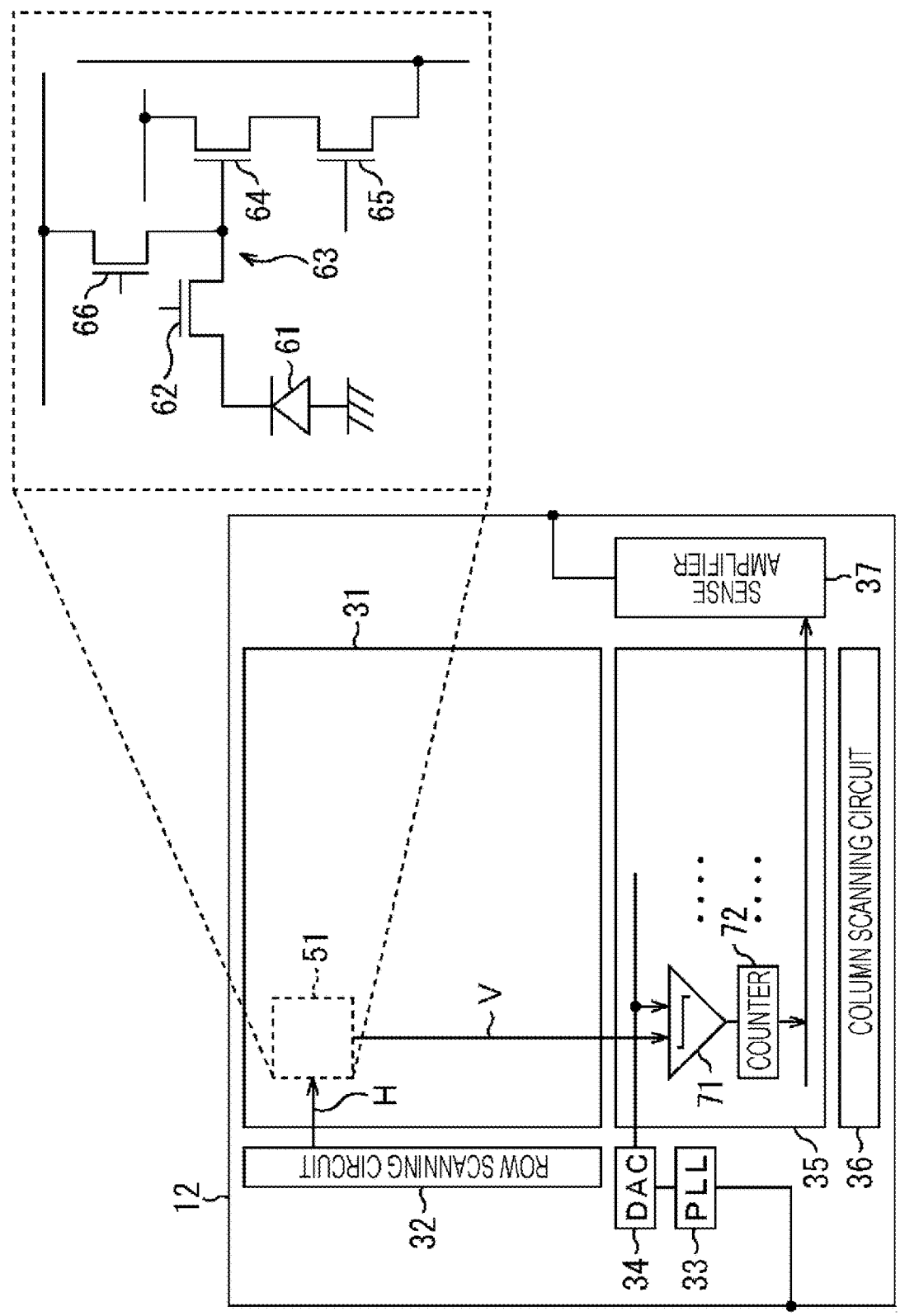
FIG. 2 is a block diagram illustrating a configuration example of a circuit of an imaging element.

FIG. 2 is a block diagram illustrating a configuration example of a circuit of the imaging element 12 of FIG. 1.

The imaging element 12 includes a pixel array 31, a row scanning circuit 32, a phase locked loop (PLL) 33, a digital analog converter (DAC) 34, a column analog digital converter (ADC) circuit 35, a column scanning circuit 36, and a sense amplifier 37.

A plurality of pixels 51 are two-dimensionally arranged in the pixel array 31.

The pixel 51 includes a horizontal signal line H which is connected to the row scanning circuit 32, a photodiode 61 which is disposed in each point where the photodiode 61 intersects with a perpendicular signal line V connected to the column ADC circuit 35, and performs photoelectric conversion, and several types of transistors for reading out an accumulated signal. That is, the pixel 51, as enlargedly illustrated on the right side of FIG. 2, includes the photodiode 61, a transfer transistor 62, a floating diffusion 63, an amplification transistor 64, a selection transistor 65, and a reset transistor 66.

An electric charge accumulated in the photodiode 61 is transferred to the floating diffusion 63 through the transfer transistor 62. The floating diffusion 63 is connected to a gate of the amplification transistor 64. In a case where the pixel 51 is a target from which a signal is read out, the selection transistor 65 is turned on from the row scanning circuit 32 through the horizontal signal line H, and the amplification transistor 64 is subjected to source follower driving according to the signal of the selected pixel 51, and thus, the signal is read out to the perpendicular signal line V as a pixel signal corresponding to an accumulation electric charge amount of the electric charge accumulated in the photodiode 61. In addition, the pixel signal is reset by turning on the reset transistor 66.

The row scanning circuit 32 sequentially outputs a driving (for example, transferring, selecting, resetting, or the like) signal for driving the pixel 51 of the pixel array 31 for each row.

The PLL 33 generates and outputs a clock signal of a predetermined frequency which is necessary for driving each of the units of the imaging element 12, on the basis of the clock signal supplied from the outside.

The DAC 34 generates and outputs a lamp signal in the shape of being returned to a predetermined voltage value after a voltage drops from a predetermined voltage value at a certain slope (in the shape of approximately a saw).

The column ADC circuit 35 includes a comparator 71 and a counter 72 as many as the number corresponding to the number of columns of the pixel 51 of the pixel array 31, extracts a signal level from the pixel signal output from the pixel 51 by a correlated double sampling (CDS) operation, and outputs pixel data. That is, the comparator 71 compares the lamp signal supplied from the DAC 34 with the pixel signal (a brightness value) output from the pixel 51, and supplies a comparison result signal obtained as the result thereof to the counter 72. Then, the counter 72 counts a counter clock signal of a predetermined frequency according to the comparison result signal output from the comparator 71, and thus, the pixel signal is subjected to A/D conversion.

The column scanning circuit 36 sequentially supplies a signal of outputting the pixel data to the counter 72 of the column ADC circuit 35 at a predetermined timing.

The sense amplifier 37 amplifies the pixel data which is supplied from the column ADC circuit 35, and outputs the pixel data to the outside of the imaging element 12.

<First Embodiment of Imaging Element>

Figure 3:
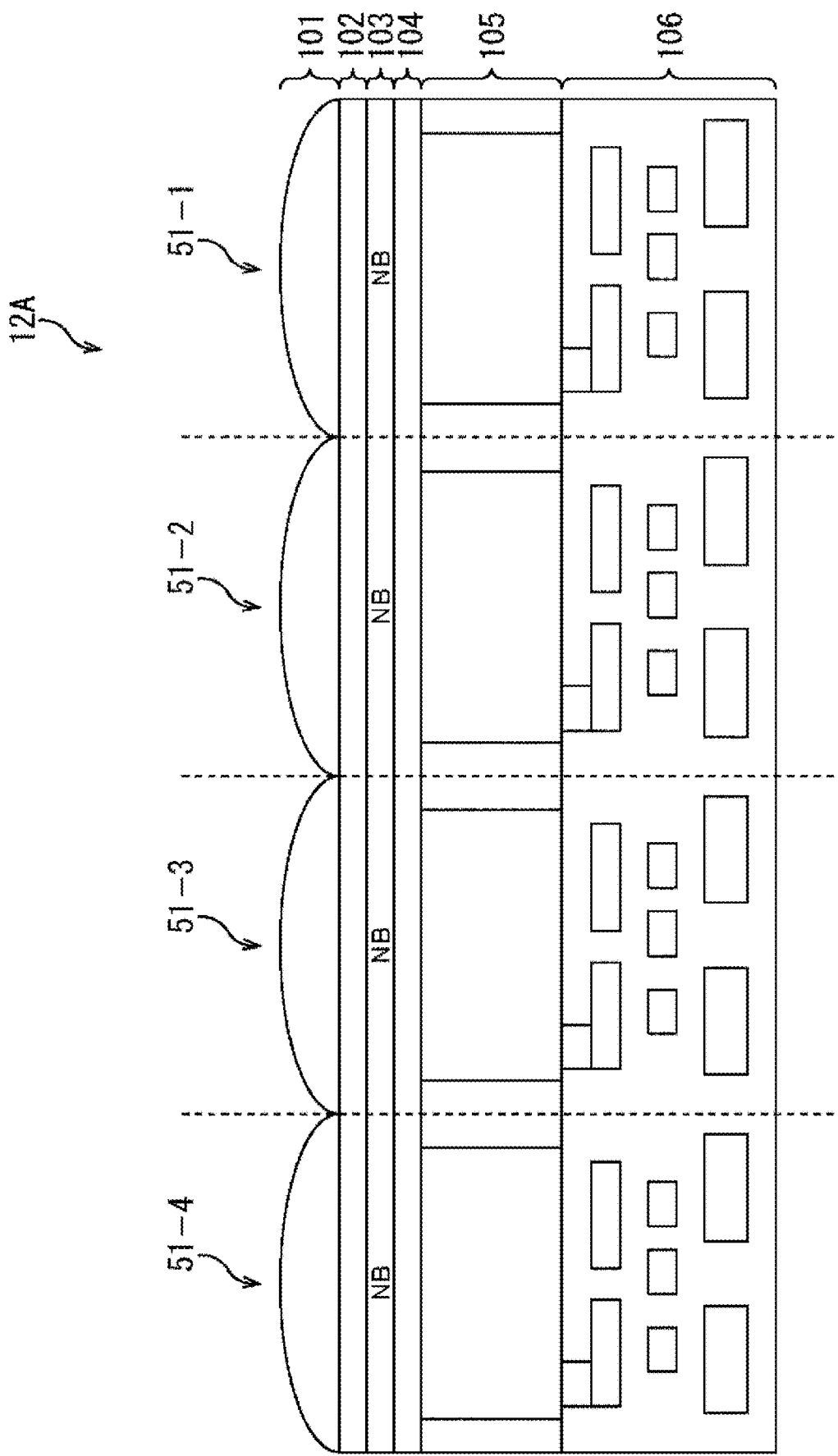
FIG. 3 is a sectional view schematically illustrating configuration example of a first embodiment of the imaging element.

FIG. 3 schematically illustrates a configuration example of a sectional surface of an imaging element 12A, which is a first embodiment of the imaging element 12 of FIG. 1. FIG. 3 illustrates sectional surfaces of four pixels of a pixel 51-1 to a pixel 51-4 of the imaging element 12. Furthermore, hereinafter, in a case where it is not necessary to distinguish the pixel 51-1 to the pixel 51-4 from each other, the pixel will be simply referred to as the pixel 51.

An on-chip microlens 101, an interlayer film 102, a narrow band filter layer 103, an interlayer film 104, a photoelectric conversion element layer 105, and a signal wiring layer 106 are laminated in each of the pixels 51, in this order from the above. That is, the imaging element 12 is formed of a back-side illumination type CMOS image sensor in which the photoelectric conversion element layer 105 is disposed on an incident side of light from the signal wiring layer 106.

The on-chip microlens 101 is an optical element for condensing light into the photoelectric conversion element layer 105 of each of the pixels 51.

The interlayer film 102 and the interlayer film 104 are formed of a dielectric body such as SiO2. As described below, it is desirable that dielectric constants of the interlayer film 102 and the interlayer film 104 are as low as possible.

In the narrow band filter layer 103, a narrow band filter NB, which is an optical filter transmitting narrow band light in a predetermined narrow wavelength band (a narrow band), is disposed in each of the pixels 51. For example, a plasmon filter using front plasmon, which is one type of metal thin film filters using a thin film formed of a metal such as aluminum, is used in the narrow band filter NB. In addition, a transmission band of the narrow band filter NB is set for each of the pixels 51. The type (the number of bands) of the transmission band of the narrow band filter NB is arbitrary, and for example, the number of bands is set to be greater than or equal to 4.

Here, the narrow band, for example, is a wavelength band which is narrower than a transmission band of a color filter of the related art of red (R), green (G), and blue (B) or yellow (Y), magenta (M), and cyan (C), based on three primary colors or a color-matching function. In addition, hereinafter, a pixel receiving the narrow band light transmitted through the narrow band filter NB will be referred to as a multispectral pixel or a MS pixel.

The photoelectric conversion element layer 105, for example, includes the photodiode 61 or the like of FIG. 2, receives the light transmitted through the narrow band filter layer 103 (the narrow band filter NB) (the narrow band light), and converts the received light into an electric charge. In addition, the photoelectric conversion element layer 105 is configured such that the pixels 51 are electrically separated from each other by an element separating layer.

Wiring or the like for reading the electric charge which is accumulated in the photoelectric conversion element layer 105 is disposed on the signal wiring layer 106.

<Plasmon Filter>

Next, the plasmon filter which can be used in the narrow band filter NB will be described with reference to FIGS. 4 to 15.

Figure 4:
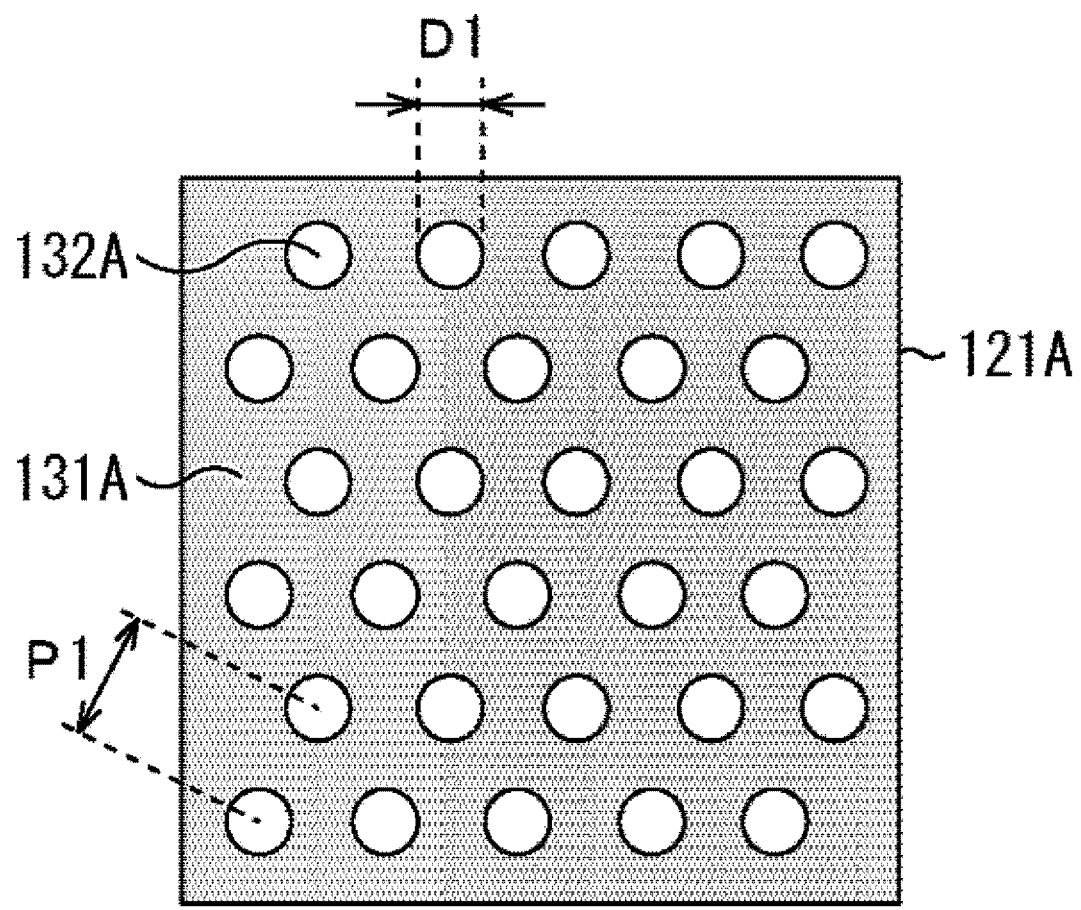
FIG. 4 is a diagram illustrating a configuration example of a plasmon filter having a pore array structure.

FIG. 4 illustrates a configuration example of a plasmon filter 121A having a pore array structure.

The plasmon filter 121A is configured of a plasmon resonator in which holes 132A are arranged in a metal thin film (hereinafter, referred to as a conductor thin film) 131A in the shape of a honeycomb.

Each of the holes 132A penetrates through the conductor thin film 131A, and functions as a waveguide. In general, the waveguide has a cutoff frequency and a cutoff wavelength which are determined according to a shape such as a length of a side or a diameter, and has properties of not allowing light of a frequency less than or equal to the cutoff frequency (a wavelength less than or equal to the cutoff wavelength) to propagate. A cutoff wavelength of the hole 132A mainly depends on an opening diameter D1, and the cutoff wavelength shortens as the opening diameter D1 decreases. Furthermore, the opening diameter D1 is set to a value which is smaller than the wavelength of the transmitted light.

On the other hand, in a case where light is incident on the conductor thin film 131A in which holes 132A are periodically formed during a short period less than or equal to the wavelength of the light, a phenomenon occurs in which light at a wavelength which is longer than the cutoff wavelength of the hole 132A is transmitted. Such a phenomenon will be referred to as an abnormal transmission phenomenon of the plasmon. Such a phenomenon occurs due to the excitation of front plasmon on a boundary between the conductor thin film 131A and the interlayer film 102, which is an upper layer of the conductor thin film 131A.

Here, occurrence conditions of the abnormal transmission phenomenon of the plasmon (a front plasmon resonance) will be described with reference to FIG. 5.

Figure 5:
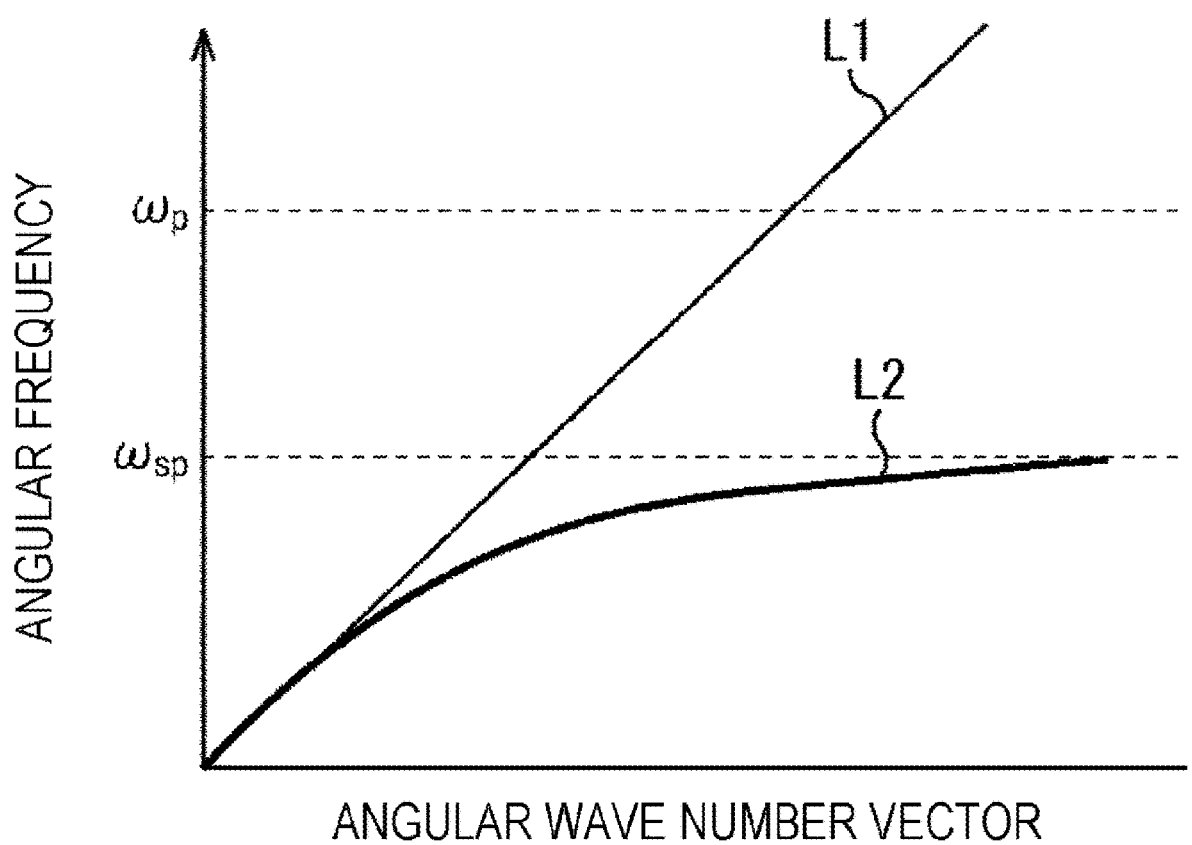
FIG. 5 is a graph illustrating a dispersion relationship of a front plasmon.

FIG. 5 is a graph illustrating a dispersion relationship of the front plasmon. In the graph, a horizontal axis represents an angular wave number vector k, and a vertical axis represents an angular frequency ω. ωp represents a plasma frequency of the conductor thin film 131A. ωsp represents a front plasma frequency on a boundary surface between the interlayer film 102 and the conductor thin film 131A, and is represented by formula (1) described below.

[Math. 1]
$$\omega_{sp} = \frac{\omega_p}{\sqrt{1+\varepsilon_d}} \quad (1)$$

εd represents a dielectric constant of a dielectric body configuring the interlayer film 102.

According to formula (1), the front plasma frequency ωsp increases as the plasma frequency ωp increases. In addition, the front plasma frequency ωsp increases as the dielectric constant εd decreases.

A line L1 represents a dispersion relationship of the light (a write line), and is represented by formula (2) described below.

[Math. 2]
$$\omega = \frac{c}{\sqrt{\varepsilon_d}} k \quad (2)$$

c represents a light speed.

A line L2 represents a dispersion relationship of the front plasmon, and is represented by formula (3) described below.

[Math. 3]
$$\omega = ck\sqrt{\frac{\varepsilon_m + \varepsilon_d}{\varepsilon_m \varepsilon_d}} \quad (3)$$

εm represents a dielectric constant of the conductor thin film 131A.

The dispersion relationship of the front plasmon represented by the line L2 is close to the write line represented by the line L1 in a range where the angular wave number vector k is small, and is close to the front plasma frequency ωsp as the angular wave number vector k increases.

Then, when formula (4) described below is established, the abnormal transmission phenomenon of the plasmon occurs.

[Math. 4]
$$\mathrm{Re}\left[\frac{\omega_{sp}}{c}\sqrt{\frac{\varepsilon_m \varepsilon_d}{\varepsilon_m + \varepsilon_d}}\right] = \left|\frac{2\pi}{\lambda}\sin\theta + iG_x + jG_y\right| \quad (4)$$

λ represents the wavelength of the incident light. θ represents an incident angle of the incident light. Gx and Gy are represented by formula (5) described below.

$$|Gx|=|Gy|=2\pi/a_0 \quad (5)$$

a0 represents a lattice constant of a pore array structure formed of the hole 132A of the conductor thin film 131A.

In formula (4), the left member represents an angular wave number vector of the front plasmon, and the right member represents an angular wave number vector of the conductor thin film 131A during a pore array period. Accordingly, when the angular wave number vector of the front plasmon is identical to the angular wave number vector of the conductor thin film 131A during the pore array period, the abnormal transmission phenomenon of the plasmon occurs. Then, at this time, the value of λ is a resonance wavelength of the plasmon (the transmission wavelength of the plasmon filter 121A).

Furthermore, in formula (4), the angular wave number vector of the front plasmon in the left member is determined according to the dielectric constant εm of the conductor thin film 131A and the dielectric constant εd of the interlayer film 102. On the other hand, the angular wave number vector during the pore array period in the right member is determined according to the incident angle θ of the light and a pitch (a hole pitch) P1 between the adjacent holes 132A of the conductor thin film 131A. Accordingly, the resonance wavelength and the resonance frequency of the plasmon are determined according to the dielectric constant εm of the conductor thin film 131A, the dielectric constant εd of the interlayer film 102, the incident angle θ of the light, and the hole pitch P1. Furthermore, in a case where the incident angle of the light is 0°, the resonance wavelength and the resonance frequency of the plasmon are determined according to the dielectric constant εm of the conductor thin film 131A, the dielectric constant εd of the interlayer film 102, and the hole pitch P1.

Accordingly, the transmission band of the plasmon filter 121A (the resonance wavelength of the plasmon) is changed according to a material and a film thickness of the conductor thin film 131A, a material and a film thickness of the interlayer film 102, a pattern period of the pore array (for example, the opening diameter D1 and the hole pitch P1 of the hole 132A), and the like. In particular, in a case where the material and the film thickness of the conductor thin film 131A and the interlayer film 102 are determined, the transmission band of the plasmon filter 121A is changed according to the pattern period of the pore array, in particular, the hole pitch P1. That is, the transmission band of the plasmon filter 121A is shifted to a short wavelength side as the hole pitch P1 narrows, and the transmission band of the plasmon filter 121A is shifted to a long wavelength side as the hole pitch P1 widens.

Figure 6:
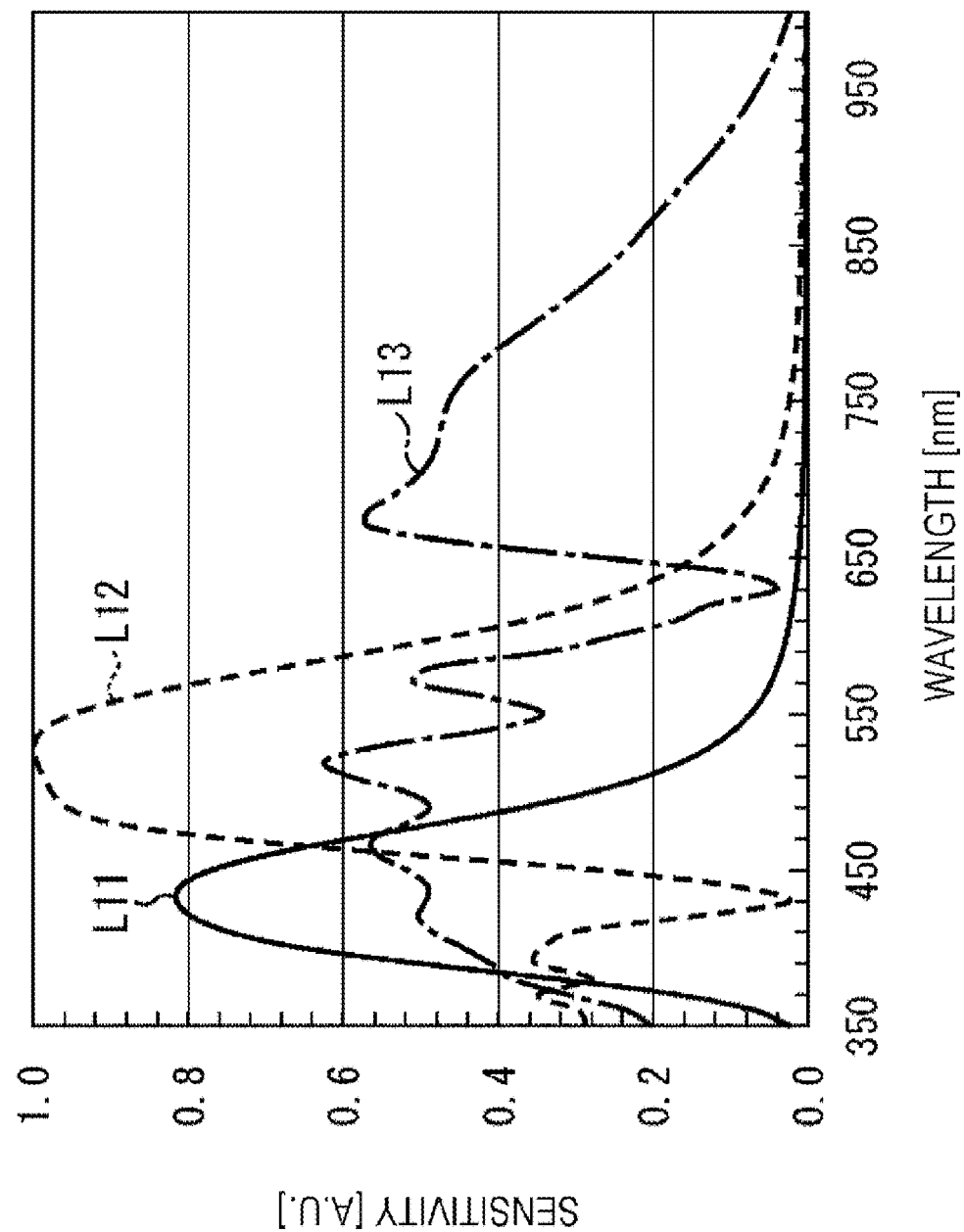
FIG. 6 is a graph illustrating a first example of spectral characteristics of the plasmon filter having the pore array structure.

FIG. 6 is a graph illustrating an example of spectral characteristics of the plasmon filter 121A in a case where the hole pitch P1 is changed. In the graph, a horizontal axis represents a wavelength (the unit is nm), and a vertical axis represents sensitivity (the unit is an arbitrary unit). A line L11 represents spectral characteristics in a case where the hole pitch P1 is set to 250 nm, a line L12 represents spectral characteristics in a case where the hole pitch P1 is set to 325 nm, and a line L13 represents spectral characteristics in a case where the hole pitch P1 is set to 500 nm.

In a case where the hole pitch P1 is set to 250 nm, the plasmon filter 121A mainly transmits light in a wavelength band of a blue color. In a case where the hole pitch P1 is set to 325 nm, the plasmon filter 121A mainly transmits light in a wavelength band of a green color. In a case where the hole pitch P1 is set to 500 nm, the plasmon filter 121A mainly transmits light in a wavelength band of a red color. However, in a case where the hole pitch P1 is set to 500 nm, the plasmon filter 121A transmits a great amount of light in a low wavelength band of a red color according to a waveguide mode described below.

Figure 7:
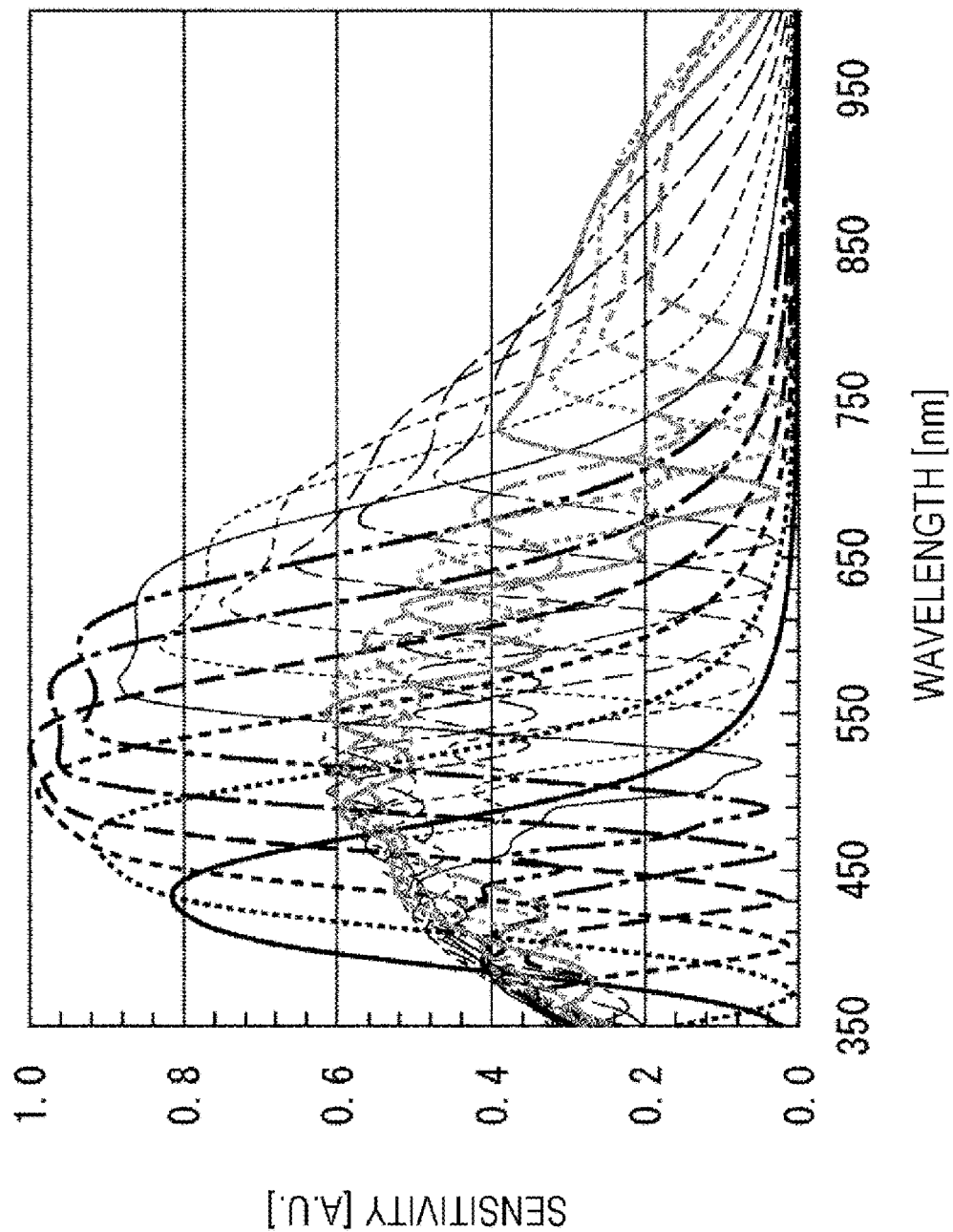
FIG. 7 is a graph illustrating a second example of the spectral characteristics of the plasmon filter having the pore array structure.

FIG. 7 is a graph illustrating another example of the spectral characteristics of the plasmon filter 121A in a case where the hole pitch P1 is changed. In the graph, a horizontal axis represents a wavelength (the unit is nm), and a vertical axis represents sensitivity (the unit is an arbitrary unit). This example illustrates an example of spectral characteristics of sixteen types of plasmon filters 121A in a case where the hole pitch P1 is changed by being divided by 25 nm from 250 nm to 625 nm.

Furthermore, the transmittance of the plasmon filter 121A is mainly determined according to the opening diameter D1 of the hole 132A. The transmittance increases as the opening diameter D1 increases, but color mixture easily occurs. In general, it is desirable that the opening diameter D1 is set such that an opening rate is 50% to 60% of the hole pitch P1.

In addition, as described above, each of the holes 132A of the plasmon filter 121A functions as a waveguide. Accordingly, in the spectral characteristics, there is a case where not only a wavelength component transmitted by the front plasmon resonance (a wavelength component in a plasmon mode) but also a wavelength component transmitted through the hole 132A (the waveguide) (a wavelength component in a waveguide mode) increases, according to a pattern of the pore array of the plasmon filter 121A.

For a given hole pitch P1 of the plasmon filter there is a range of desirable thicknesses of the plasmon filter to maximize light transmittance of the filter for those wavelengths that are transmitted. For instance, a range of desirable thicknesses of the plasmon filter may range between 20% and 80% of the size of the hole pitch P1, or between 30% and 70% of the size of the hole pitch, or between 40% and 60% of the size of the hole pitch.

For example, in a case where the plasmon filter is formed from Aluminum, a desirable range of thicknesses of the plasmon filter for a 350 nm hole pitch is between 100 nm and 300 nm, with a preferred thickness of 200 nm. For an Aluminum plasmon filter with a 550 nm hole pitch, a desirable range of thicknesses of the plasmon filter is between 200 nm and 400 nm, with a preferred thickness of 300 nm.

For a given peak transmission wavelength of the plasmon filter there is a range of desirable thicknesses of the plasmon filter to maximize light transmittance of the filter for those wavelengths that are transmitted. For instance, a range of desirable thicknesses of the plasmon filter may range between 10% and 60% of the peak transmission wavelength, or between 20% and 50% of the peak transmission wavelength, or between 30% and 40% of the peak transmission wavelength.

For example, in a case where the plasmon filter is formed from Aluminum, a desirable range of thicknesses of the plasmon filter when desirable a peak transmission wavelength of 580 nm is between 100 nm and 300 nm, with a preferred thickness of 200 nm. For an Aluminum plasmon filter with a peak transmission wavelength of 700 nm, a desirable range of thicknesses of the plasmon filter is between 150 nm and 350 nm, with a preferred thickness of 250 nm.

Figure 8:
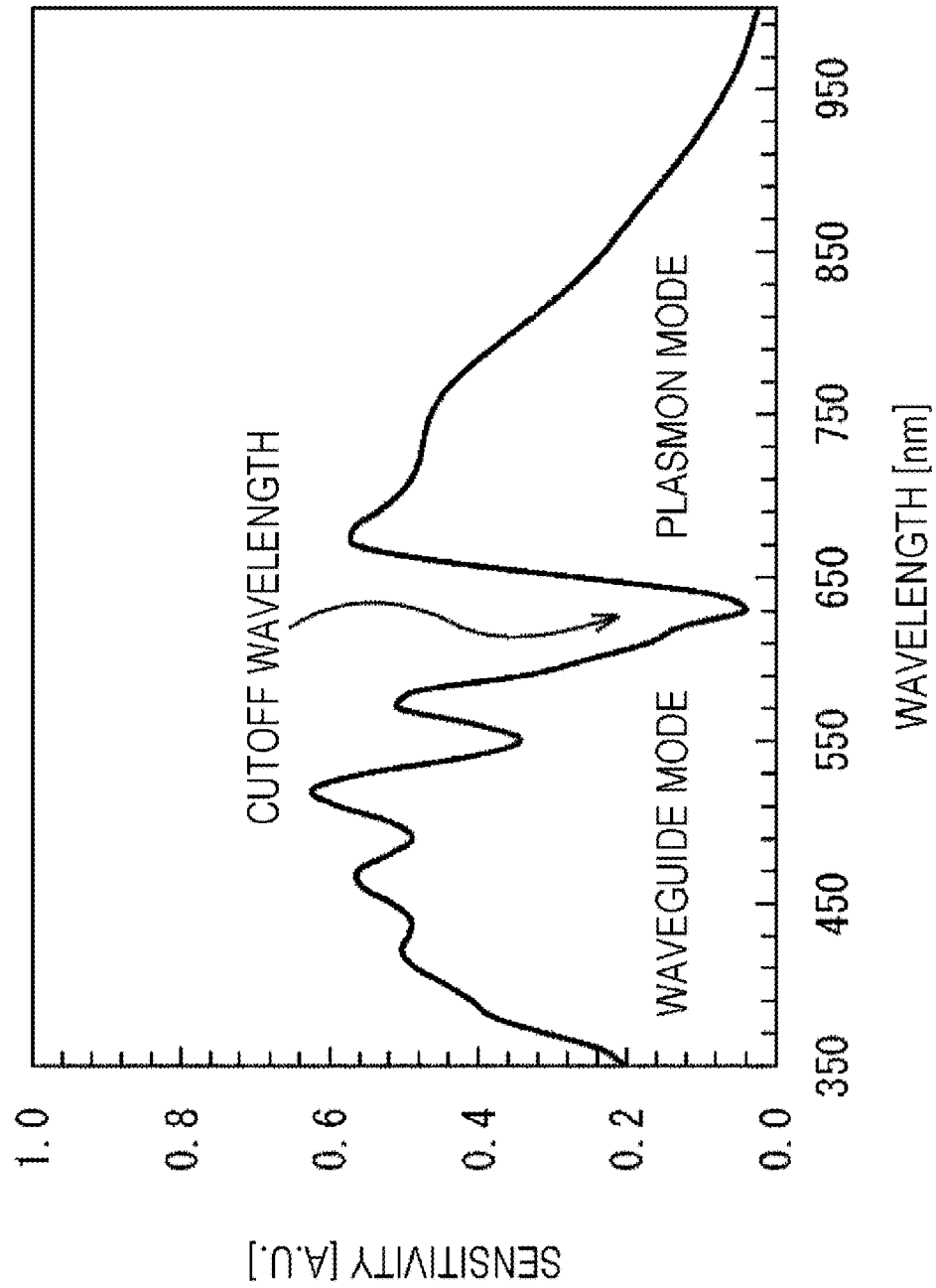
FIG. 8 is a graph illustrating a plasmon mode and a waveguide mode.

FIG. 8 illustrates the spectral characteristics of the plasmon filter 121A in a case where the hole pitch P1 is set to 500 nm, as with the spectral characteristics represented by the line L13 of FIG. 6. In this example, a wavelength side which is longer than the cutoff wavelength in the vicinity of 630 nm is the wavelength component in the plasmon mode, and a wavelength side which is shorter than the cutoff wavelength is the wavelength component in the waveguide mode.

As described above, the cutoff wavelength mainly depends on the opening diameter D1 of the hole 132A, and the cutoff wavelength decreases as the opening diameter D1 decreases. Then, wavelength resolution characteristics of the plasmon filter 121A are improved as a difference between the cutoff wavelength and the peak wavelength in the plasmon mode increases.

In addition, as described above, the front plasma frequency ωsp of the conductor thin film 131A increases as the plasma frequency ωp of the conductor thin film 131A increases. In addition, the front plasma frequency ωsp increases as the dielectric constant εd of the interlayer film 102 decreases. Then, it is possible to set the resonance frequency of the plasmon to be higher as the front plasma frequency ωsp increases, and to set the transmission band of the plasmon filter 121A (the resonance wavelength of the plasmon) to a shorter wavelength band.

Accordingly, in a case where a metal having a smaller plasma frequency ωp is used in the conductor thin film 131A, it is possible to set the transmission band of the plasmon filter 121A to a shorter wavelength band. For example, aluminum, silver, gold, or the like is preferable as the metal. Here, in a case where the transmission band is set to a long wavelength band of infrared light or the like, copper or the like can also be used.

In addition, in a case where a dielectric body having a small dielectric constant εd is used in the interlayer film 102, it is possible to set the transmission band of the plasmon filter 121A to a shorter wavelength band. For example, SiO2, Low-K, or the like is preferable as the dielectric body.

Figure 9:
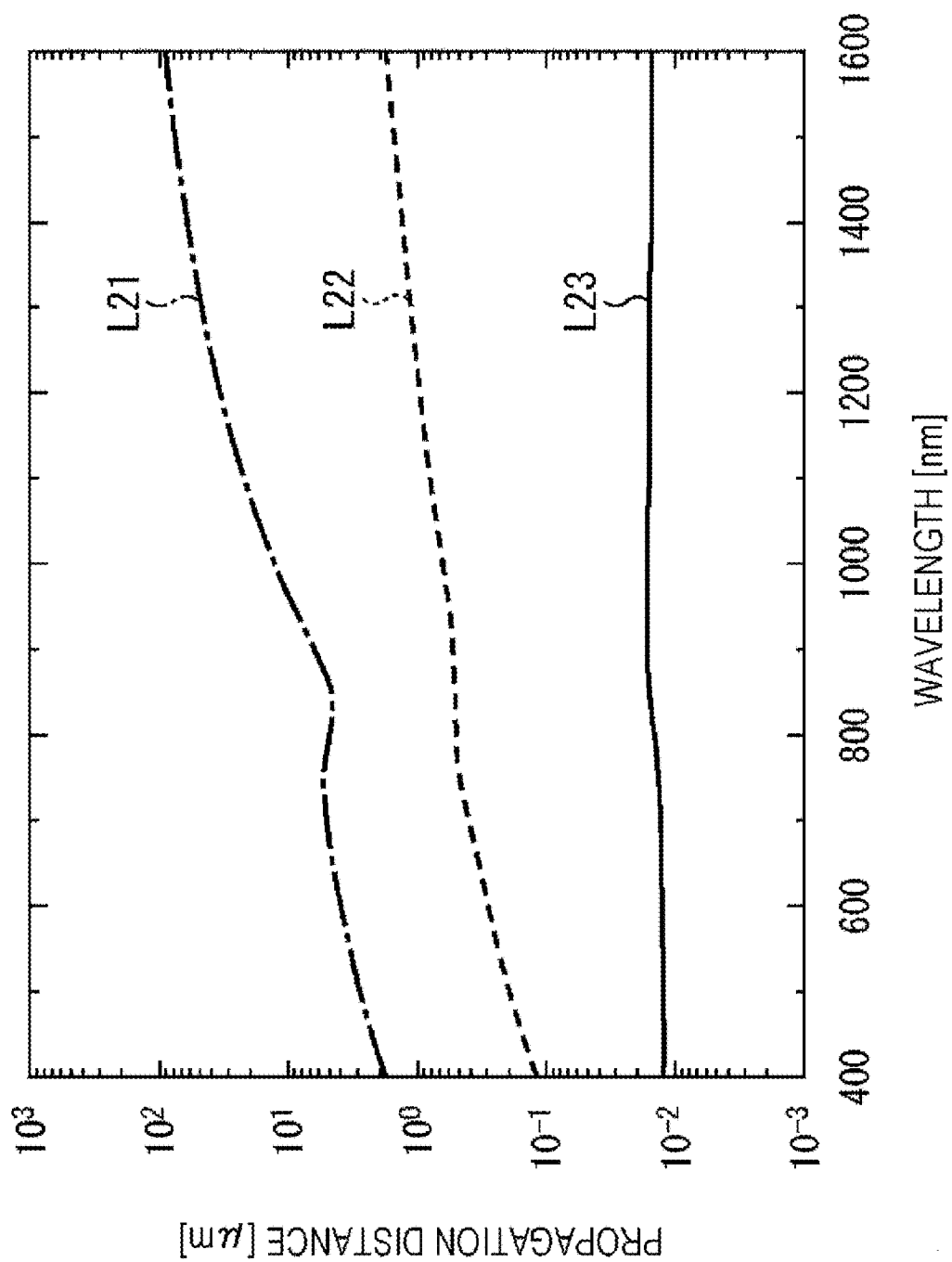
FIG. 9 is a graph illustrating an example of propagation characteristics of the front plasmon.
Figure 10:
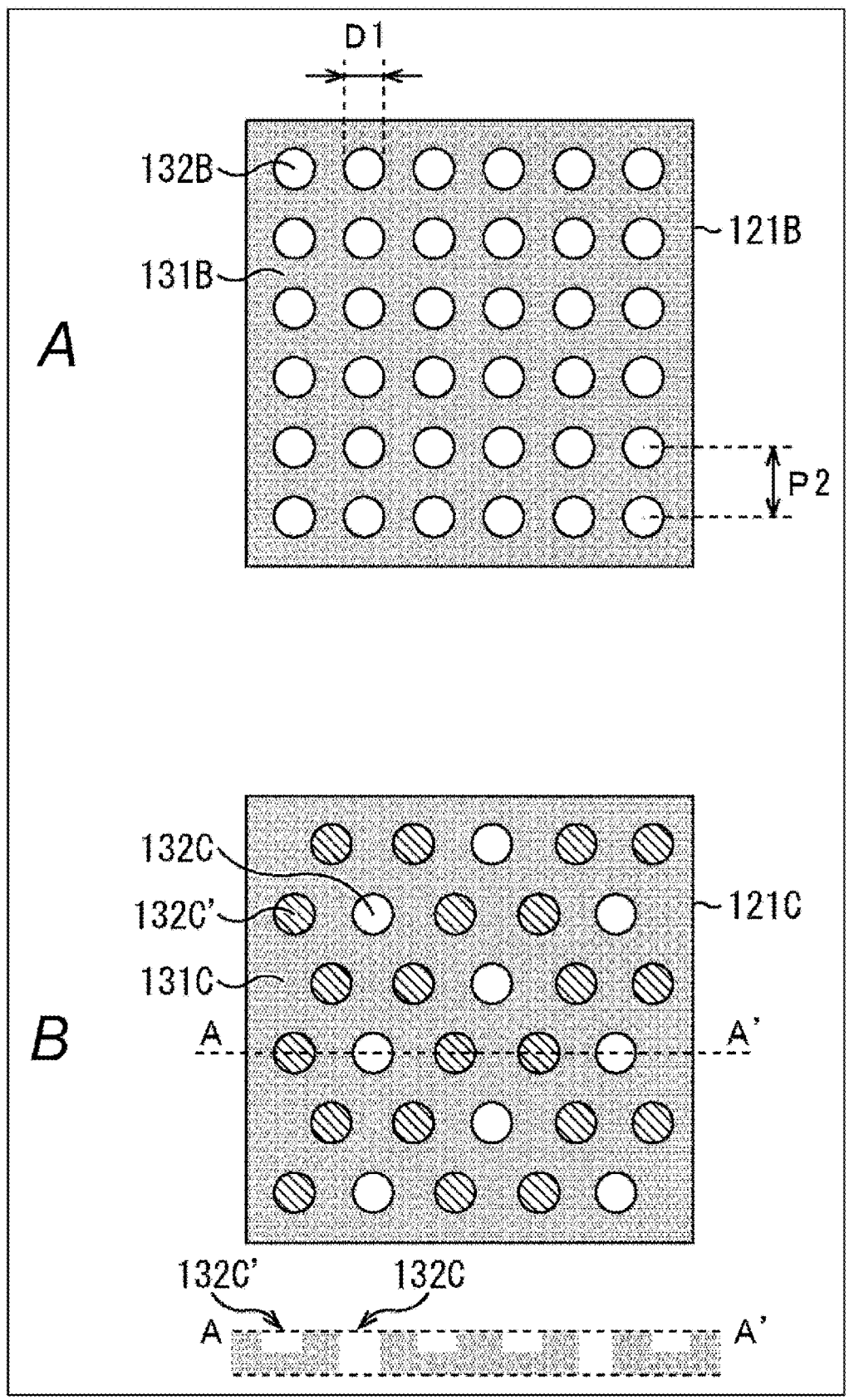
FIGS. 10A and 10B are diagrams illustrating other configuration examples of the plasmon filter having the pore array structure.

In addition, FIG. 9 is a graph illustrating propagation characteristics of the front plasmon on an interface between conductor thin film 131A and the interlayer film 102 in a case where aluminum is used in the conductor thin film 131A, and SiO2 is used in the interlayer film 102. In the graph, a horizontal axis represents the wavelength of the light (the unit is nm), and a vertical axis represents a propagation distance (the unit is μm). In addition, a line L21 represents propagation characteristics in an interface direction, a line L22 represents propagation characteristics in a depth direction of the interlayer film 102 (a direction perpendicular to the interface), and a line L23 represents propagation characteristics in a depth direction of the conductor thin film 131A (a direction perpendicular to the interface).

A propagation distance ΛSPP (λ) in a depth direction of the front plasmon is represented by formula (6) described below.

[Math. 5]

$$\Lambda_{SPP}(\lambda) \equiv \frac{4\pi k_{SPP}}{\lambda} = \frac{4\pi}{\lambda}[m]\left[\sqrt{\frac{\varepsilon_m \varepsilon_d}{\varepsilon_m + \varepsilon_d}}\right] \quad (6)$$

kSPP represents an absorption coefficient of a substance propagated by the front plasmon. εm (λ) represents a dielectric constant of the conductor thin film 131A with respect to light at a wavelength of λ. εd (λ) represents a dielectric constant of the interlayer film 102 with respect to light at the wavelength of λ.

Accordingly, as illustrated in FIG. 9, front plasmon with respect to light at a wavelength of 400 nm propagates in the depth direction from a front surface of the interlayer film 102 formed of SiO2 to approximately 100 nm. Accordingly, the thickness of the interlayer film 102 is set to be greater than or equal to 100 nm, and thus, the front plasmon on the interface between the interlayer film 102 and the conductor thin film 131A is prevented from being affected by a substance laminated on a surface of the interlayer film 102 on a side opposite to the conductor thin film 131A.

In addition, front plasmon with respect to light at a wavelength of 400 nm propagates in the depth direction from a front surface of the conductor thin film 131A formed of aluminum to approximately 10 nm. Accordingly, the thickness of the conductor thin film 131A is set to be greater than or equal to 10 nm, and thus, the front plasmon on the interface between the interlayer film 102 and the conductor thin film 131A is prevented from being affected by the interlayer film 104.

<Other Examples of Plasmon Filter>

Next, other examples of the plasmon filter will be described with reference to FIGS. 10A to 15.

A plasmon filter 121B of FIG. 10A is configured of a plasmon resonator in which holes 132B are arranged in a conductor thin film 131B in the shape of an orthogonal matrix. In the plasmon filter 121B, for example, a transmission band is changed according to a pitch P2 between adjacent holes 132B.

In addition, in the plasmon resonator, it is not necessary that all of the holes penetrate through the conductor thin film, and even in a case where a part of the holes is configured as a non-through which does not penetrate through the conductor thin film, the plasmon resonator functions as a filter.

For example, in FIG. 10B, a plan view and a sectional view (a sectional view taken along A-A' of the plan view) of a plasmon filter 121C configured of a plasmon resonator in which holes 132C formed of through holes and holes 132C' formed of non-through holes are arranged in the conductor thin film 131C in the shape of a honeycomb. That is, holes 132C formed of through holes and holes 132C' formed of non-through holes are periodically arranged in the plasmon filter 121C.

Further, a plasmon resonator of a single layer is basically used as the plasmon filter, and for example, the plasmon filter can be configured of a two-layer plasmon resonator.

Figure 11:
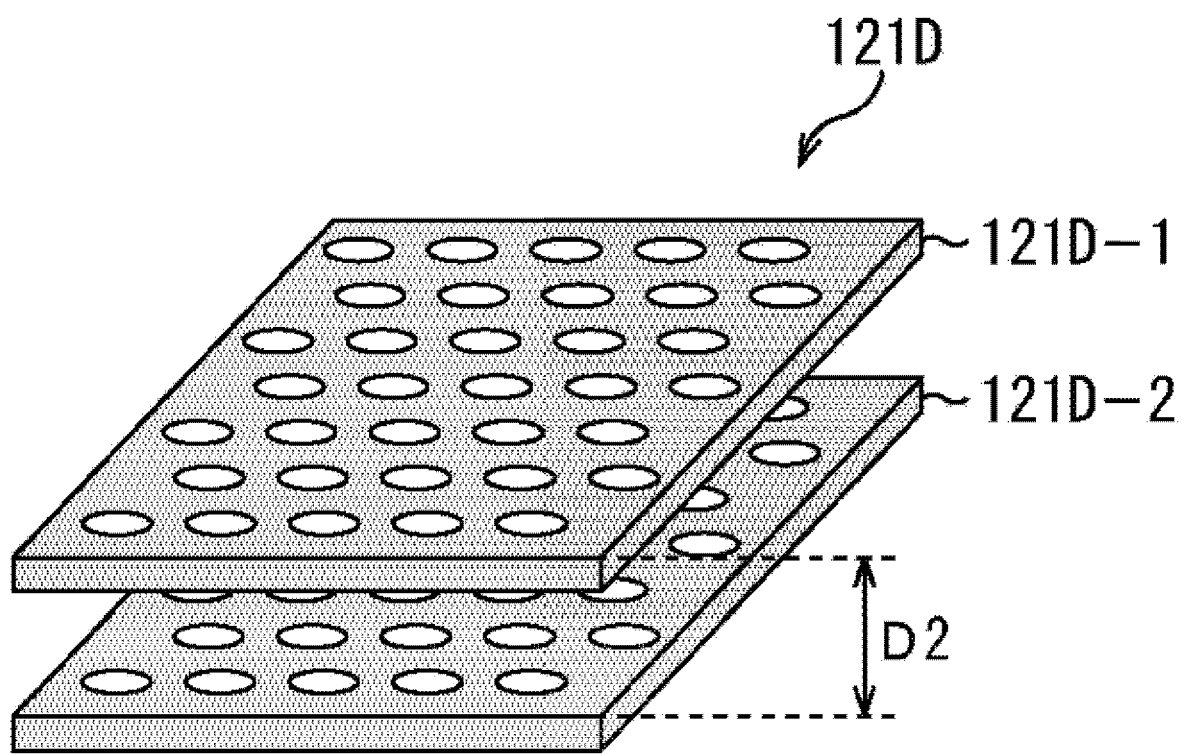
FIG. 11 is a diagram illustrating a configuration example of a plasmon filter having a two-layer structure.
Figure 12:
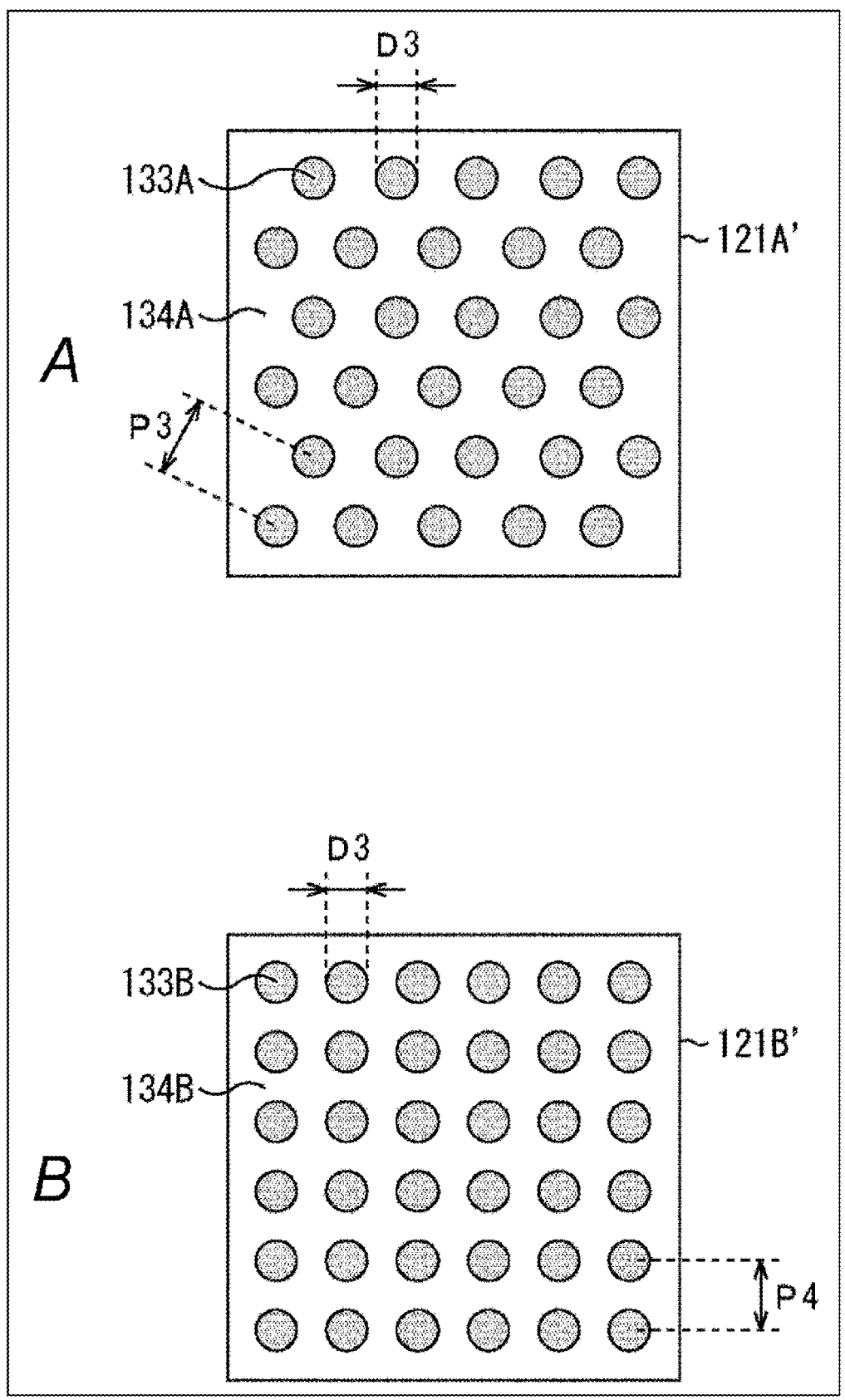
FIGS. 12A and 12B are diagrams illustrating a configuration example of a plasmon filter having a dot array structure.

For example, a plasmon filter 121D illustrated in FIG. 11 is configured of two layers of a plasmon filter 121D-1 and a plasmon filter 121D-2. The plasmon filter 121D-1 and the plasmon filter 121D-2 have a structure in which holes are arranged in the shape of a honeycomb, as with the plasmon resonator configuring the plasmon filter 121A of FIG. 4.

In addition, it is preferable that an interval D2 between the plasmon filter 121D-1 and the plasmon filter 121D-2 is approximately ¼ of a peak wavelength of a transmission band. In addition, in consideration of the freedom in design, it is preferable that the interval D2 is less than or equal to ½ of the peak wavelength of the transmission band.

Furthermore, as with the plasmon filter 121D, the holes are arranged in the same pattern in the plasmon filter 121D-1 and the plasmon filter 121D-2, and for example, the holes may be arranged in patterns similar to each other in a two-layer plasmon resonator structure. In addition, in the two-layer plasmon resonator structure, holes and dots may be arranged in a pattern in which a pore array structure and a dot array structure (described below) are inversed from each other. Further, the plasmon filter 121D has the two-layer structure, and is capable of being multilayered to be three or more layers.

In addition, in the above description, the configuration example of the plasmon filter using the plasmon resonator having the pore array structure has been described, but a plasmon resonator having a dot array structure may be adopted as the plasmon filter.

A plasmon filter having a dot array structure will be described with reference to FIGS. 12A and 12B.

A plasmon filter 121A' of FIG. 12A has a structure which is negatively and positively inversed with respect to the plasmon resonator of the plasmon filter 121A of FIG. 4, that is, is configured of a plasmon resonator in which dots 133A are arranged in a dielectric layer 134A in the shape of a honeycomb. A space between the respective dots 133A is filled with the dielectric layer 134A.

The plasmon filter 121A' absorbs light in a predetermined wavelength band, and thus, is used as a complementary color filter. The wavelength band of the light which is absorbed by the plasmon filter 121A' (hereinafter, referred to as an absorption band) is changed according to a pitch (hereinafter, referred to as a dot pitch) P3 between the adjacent dots 133A. In addition, a diameter D3 of the dot 133A is adjusted according to the dot pitch P3.

A plasmon filter 121B' of FIG. 12B has a structure which is negatively and positively inversed with respect to the plasmon resonator of the plasmon filter 121B of FIG. 10A, that is, is configured of a plasmon resonator structure in which dots 133B are arranged in a dielectric layer 134B in the shape of an orthogonal matrix. A space between the respective dots 133B is filled with the dielectric layer 134B.

An absorption band of the plasmon filter 121B' is changed according to a dot pitch P4 or the like between the adjacent dots 133B. In addition, a diameter D3 of the dot 133B is adjusted according to the dot pitch P4.

Figure 13:
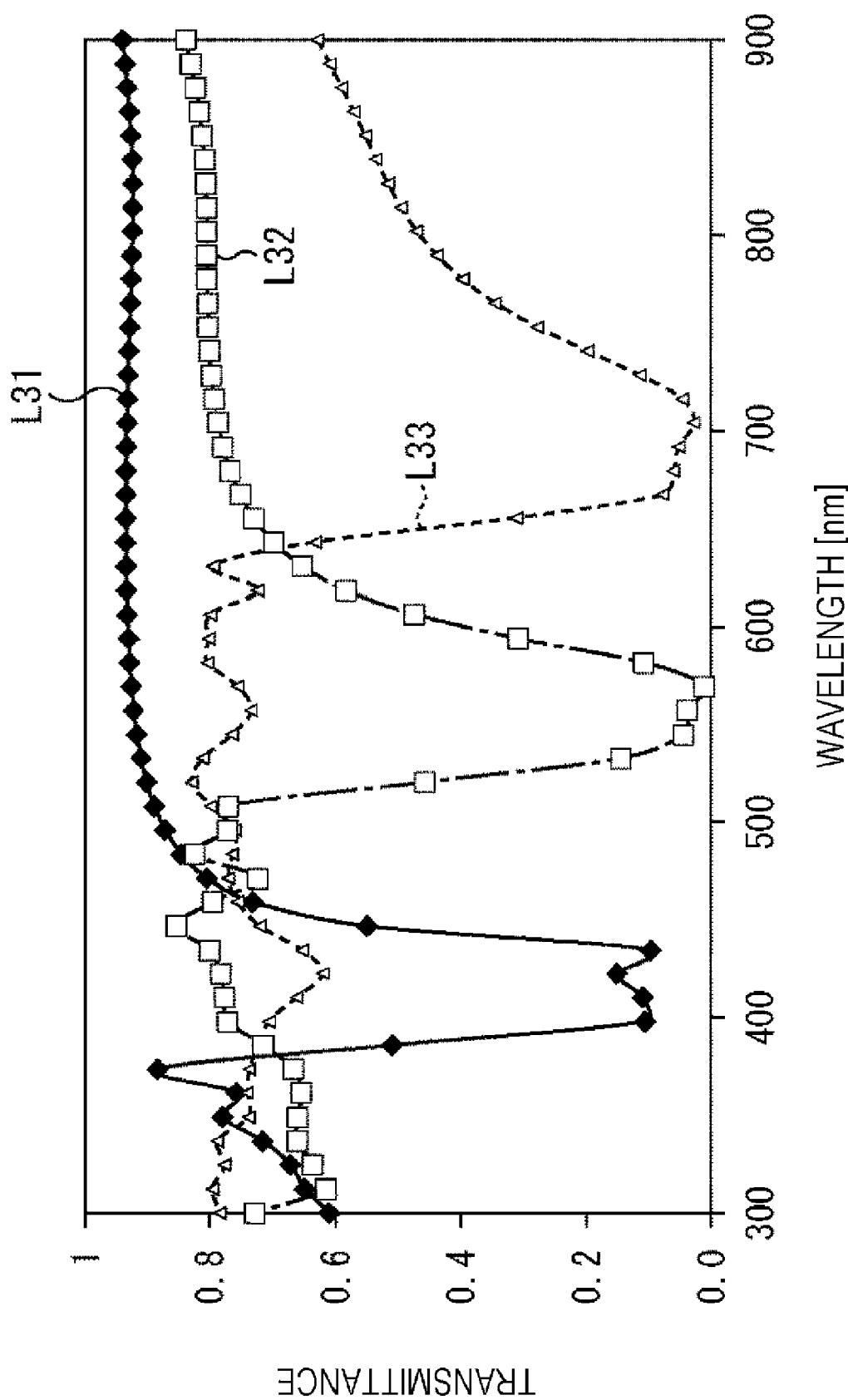
FIG. 13 is a graph illustrating an example of spectral characteristics of the plasmon filter having the dot array structure.

FIG. 13 is a graph illustrating an example of spectral characteristics in a case where the dot pitch P3 of the plasmon filter 121A' of FIG. 12A is changed. In the graph, a horizontal axis represents a wavelength (the unit is nm), and a vertical axis represents transmittance. A line L31 represents spectral characteristics in a case where the dot pitch P3 is set to 300 nm, a line L32 represents spectral characteristics in a case where the dot pitch P3 is set to 400 nm, and a line L33 represents spectral characteristics in a case where the dot pitch P3 is set to 500 nm.

As illustrated in the drawing, the absorption band of the plasmon filter 121A' is shifted to a short wavelength side as the dot pitch P3 narrows, and the absorption band of the plasmon filter 121A' is shifted to a long wavelength side as the dot pitch P3 widens.

Furthermore, in both of the plasmon filters having the pore array structure and the dot array structure, the transmission band or the absorption band can be adjusted by only adjusting the pitch between the holes or the dots in a planar direction. Accordingly, for example, the transmission band or the absorption band can be individually set with respect to each pixel by only adjusting the pitch between the holes or the dots in a lithography process, and the filter can be multicolored through a fewer process.

In addition, the thickness of the plasmon filter is approximately 100 nm to 500 nm, which is approximately similar to that of a color filter of an organic material, and a process affinity is excellent.

Figure 14:
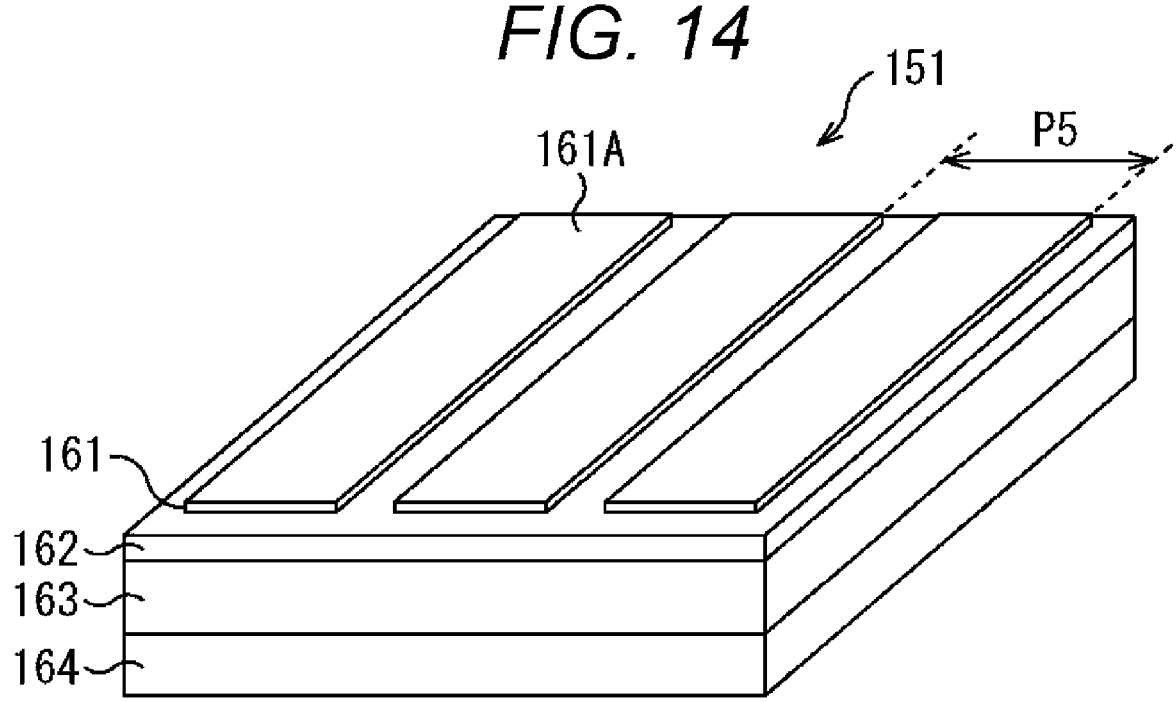
FIG. 14 is a diagram illustrating configuration example of a plasmon filter using GMR.

In addition, a plasmon filter 151 using a guided mode resonant (GMR) illustrated in FIG. 14 can also be used in the narrow band filter NB.

A conductor layer 161, an SiO2 film 162, an SiN film 163, and an SiO2 substrate 164 are laminated in the plasmon filter 151, in this order from the above. The conductor layer 161, for example, is included in the narrow band filter layer 103 of FIG. 3, and the SiO2 film 162, the SiN film 163, and the SiO2 substrate 164, for example, are included in the interlayer film 104 of FIG. 3.

For example, rectangular conductor thin films 161A formed of aluminum are arranged in the conductor layer 161 such that long sides of the conductor thin films 161A are adjacent to each other at a predetermined pitch P5. Then, a transmission band of the plasmon filter 151 is changed according to the pitch P5 or the like.

Figure 15:
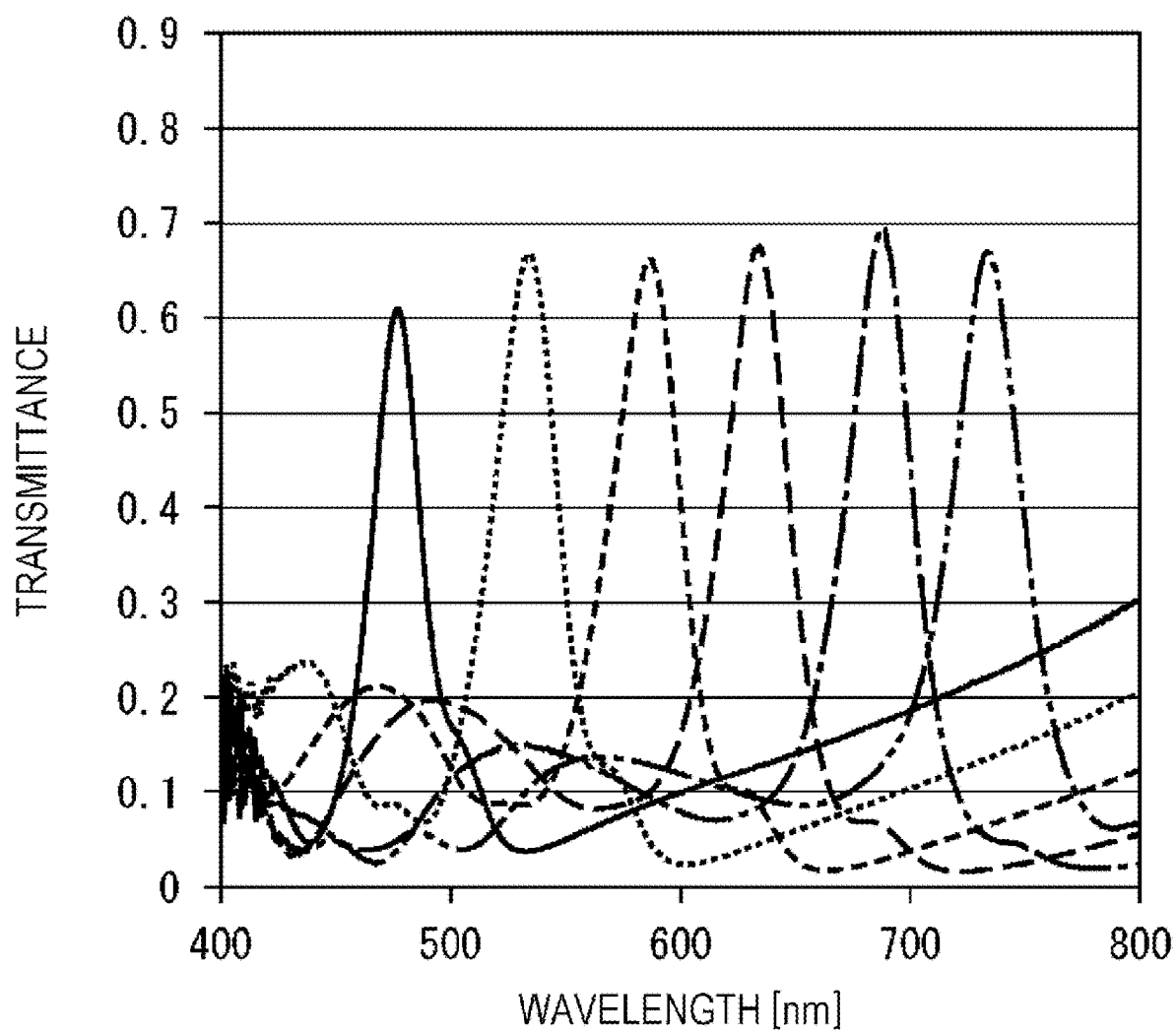
FIG. 15 is a graph illustrating an example of spectral characteristics of the plasmon filter using GMR.

FIG. 15 is a graph illustrating an example of spectral characteristics of the plasmon filter 151 in a case where the pitch P5 is changed. In the graph, a horizontal axis represents a wavelength (the unit is nm), and a vertical axis represents transmittance. This example illustrates an example of spectral characteristics in a case where the pitch P5 is changed to six types of pitches by being divided by 40 nm from 280 nm to 480 nm, and a width of a slit between the adjacent conductor thin films 161A is set to be ¼ of the pitch P5. In addition, a waveform having the shortest peak wavelength of the transmission band represents spectral characteristics in a case where the pitch P5 is set to 280 nm, and the peak wavelength elongates as the pitch P5 widens. That is, the transmission band of the plasmon filter 151 is shifted to a short wavelength side as the pitch P5 narrows, and the transmission band of the plasmon filter 151 is shifted to a long wavelength side as the pitch P5 widens.

The plasmon filter 151 using GMR has excellent affinity with respect to a color filter of an organic material, as with the plasmon filters having the pore array structure and the dot array structure described above.

<Second Embodiment of Imaging Element>

Next, a second embodiment of the imaging element 12 of FIG. 1 will be described with reference to FIGS. 16 to 21.

Figure 16:
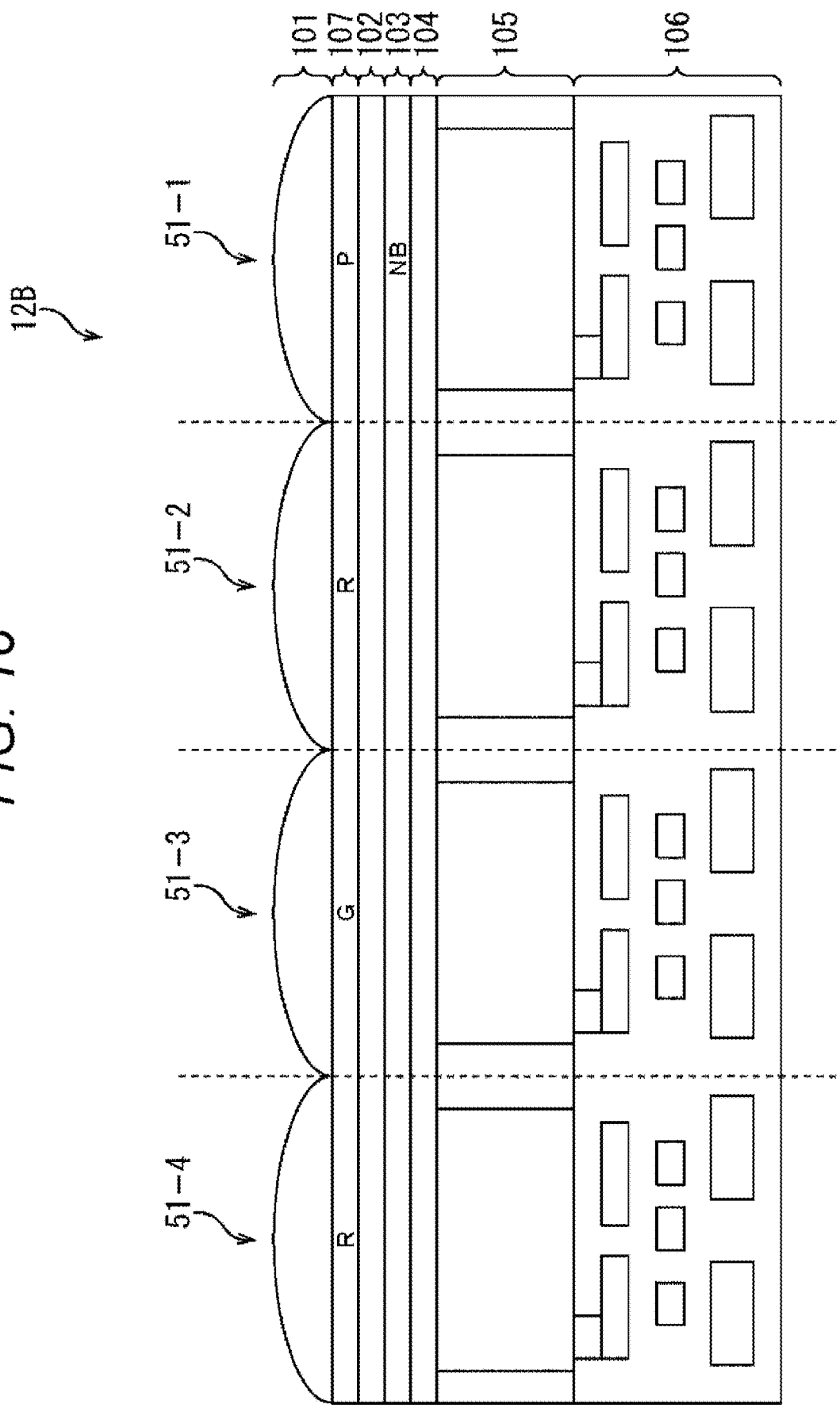
FIG. 16 is a sectional view schematically illustrating a configuration example of a second embodiment of the imaging element.

FIG. 16 schematically illustrates a configuration example of a sectional surface of an imaging element 12B which is the second embodiment of the imaging element 12. Furthermore, in the drawing, the same reference numerals are applied to portions corresponding to the imaging element 12A of FIG. 3, and the description thereof will be suitably omitted.

The imaging element 12B is different from the imaging element 12A in that a color filter layer 107 is laminated between the on-chip microlens 101 and the interlayer film 102.

In the narrow band filter layer 103 of the imaging element 12B, the narrow band filter NB is disposed in a part of the pixels 51 but not all of the pixels 51. The type of the transmission band of the narrow band filter NB (the number of bands) is arbitrary, and for example, the number of bands is set to be greater than or equal to 1.

In the color filter layer 107, a color filter is disposed in each of the pixels 51. For example, in the pixel 51 where the narrow band filter NB is not disposed, any one of a general red color filter R, a general green color filter G, and a general blue color filter B (not illustrated) is disposed. Accordingly, for example, an R pixel in which the red color filter R is disposed, a G pixel in which the green color filter G is disposed, a B pixel in which the blue color filter is disposed, and an MS pixel in which in which the narrow band filter NB is disposed, are arranged in the pixel array 31.

In addition, in the pixel 51 where the narrow band filter NB is disposed, a transmission filter P is disposed on the color filter layer 107. As described below, the transmission filter P is configured of an optical filter transmitting light in a wavelength band including the transmission band of the narrow band filter NB of the same pixel 51 (a low pass filter, a high pass filter, or a band pass filter).

Furthermore, the color filter disposed on the color filter layer 107 may be color filters of both of an organic material and an inorganic material.

Examples of the color filter of the organic material include a dyeing and coloring color filter of a synthetic resin or natural protein, and a color filter containing a dye using a pigment dye or a colorant dye.

Examples of the color filter of the inorganic material include materials such as TiO2, ZnS, SiN, MgF2, SiO2, and Low-k. In addition, for example, a method such as vapor deposition, sputtering, and chemical vapor deposition (CVD) film formation is used for forming the color filter of the inorganic material.

In addition, as described above with reference to FIG. 9, the interlayer film 102 is set to have a film thickness which is capable of preventing the influence of the color filter layer 107 on the front plasmon on an interface between the interlayer film 102 and the narrow band filter layer 103.

Here, the occurrence of flare is suppressed by the transmission filter P disposed on the color filter layer 107. This will be described with reference to FIGS. 17 and 18.

Figure 17:
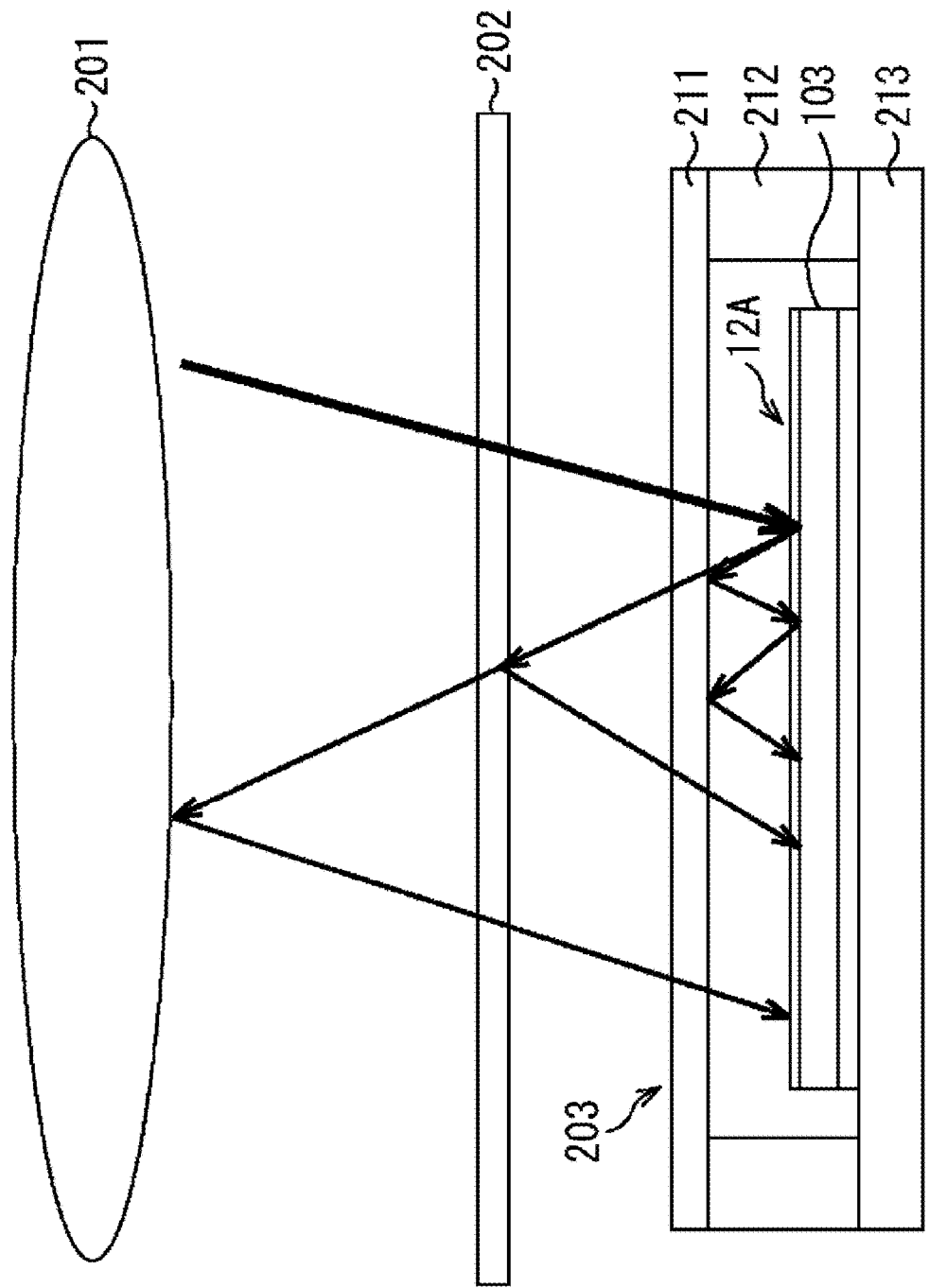
FIG. 17 is a diagram schematically illustrating an aspect of occurrence of flare of the imaging device.

FIG. 17 schematically illustrates an aspect of the occurrence of the flare of the imaging device 10 using the imaging element 12A of FIG. 2 in which the color filter layer 107 is not disposed.

In this example, the imaging element 12A is disposed on a semiconductor chip 203. Specifically, the semiconductor chip 203 is mounted on a substrate 213, and is surrounded by seal glass 211 and a resin 212. Then, light transmitted through a lens 201, an IR cut filter 202, and the seal glass 211, which are disposed in the optical system 11 of FIG. 1, is incident on the imaging element 12A.

Here, in a case where the narrow band filter NB of the narrow band filter layer 103 of the imaging element 12A is formed of a plasmon filter, a conductor thin film formed of metal is formed in the plasmon filter. The conductor thin film has a high reflection rate, and thus, light at a wavelength other than the transmission band is easily reflected. Then, a part of the light reflected on the conductor thin film, for example, as illustrated in FIG. 17, is reflected on the seal glass 211, the IR cut filter 202, or the lens 201, and is incident again on the imaging element 12A. The flare occurs due to the re-incident light. In particular, a plasmon filter using a pore array structure has a low opening rate, and thus, the flare easily occurs.

In order to prevent the reflection light, for example, it is considered that an antireflection film formed of a metal or a material having a high dielectric constant, which is different from the conductor thin film, is used. However, in a case where the plasmon filter uses a front plasmon resonance, and such an antireflection film is in contact with the front surface of the conductor thin film, there is a possibility that the characteristics of the plasmon filter are degraded, and desired characteristics are not obtained.

Figure 18:
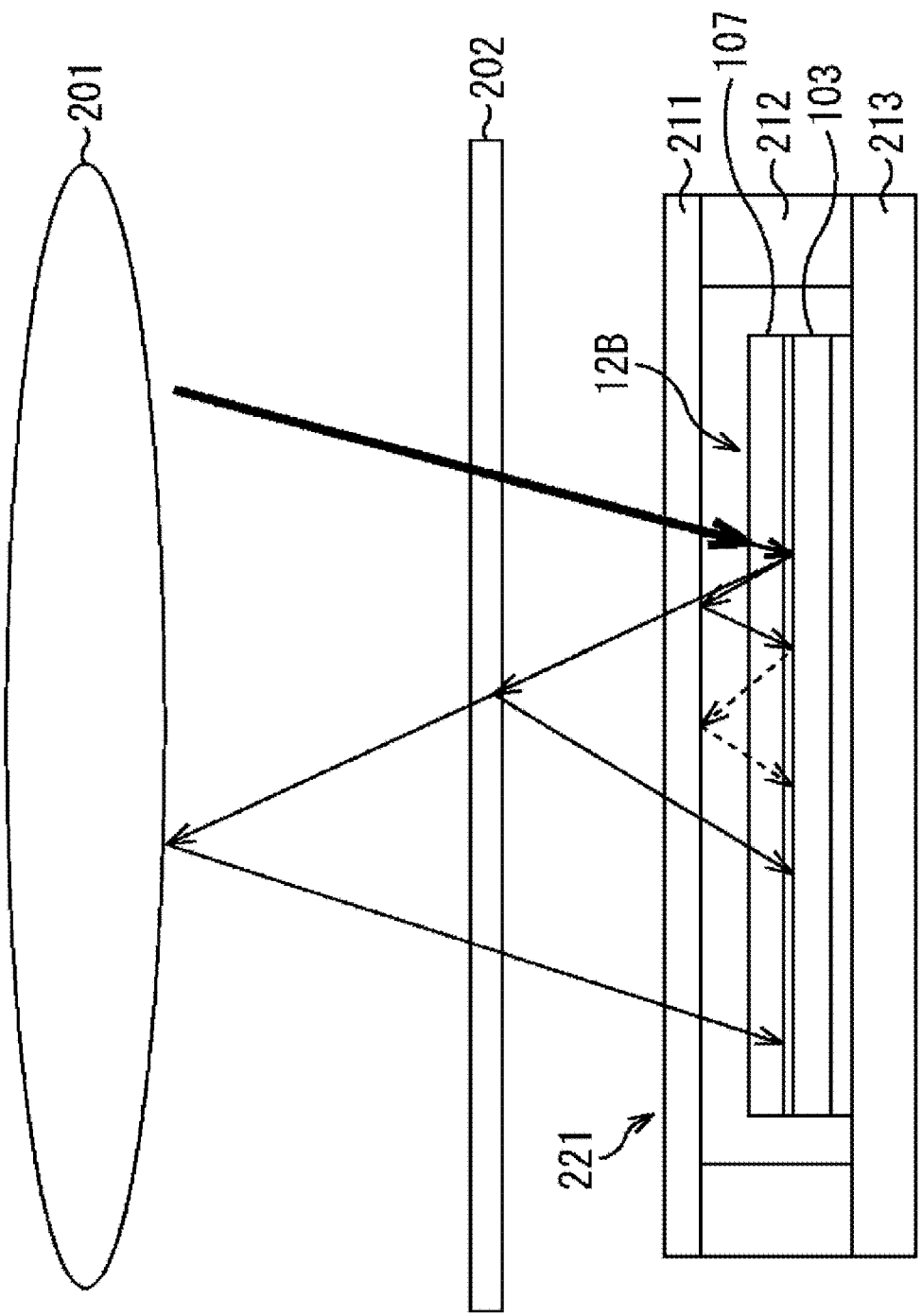
FIG. 18 is a diagram for describing a flare reducing method of the imaging device.

On the other hand, FIG. 18 schematically illustrates an aspect of the occurrence of the flare of the imaging device 10 using the imaging element 12B of FIG. 16, in which the color filter layer 107 is disposed. Furthermore, in the drawing, the same reference numerals are applied to portions corresponding to those of FIG. 17.

The example of FIG. 18 is different from the example of FIG. 17 in that a semiconductor chip 221 is disposed instead of the semiconductor chip 203. The semiconductor chip 221 is different from the semiconductor chip 203 in that the imaging element 12B is disposed instead of the imaging element 12A.

As described above, in the imaging element 12B, the transmission filter P is disposed on an upper side from the narrow band filter NB (an incident side of light). Accordingly, the light incident on the imaging element 12B is incident on the narrow band filter NB, in which a predetermined wavelength band is cutoff, by the transmission filter P, and thus, a light amount of the incident light with respect to the narrow band filter NB is suppressed. As a result thereof, a light amount of the reflection light on the conductor thin film of the narrow band filter NB (the plasmon filter) is also reduced, and thus, the flare is reduced.

Figure 19:
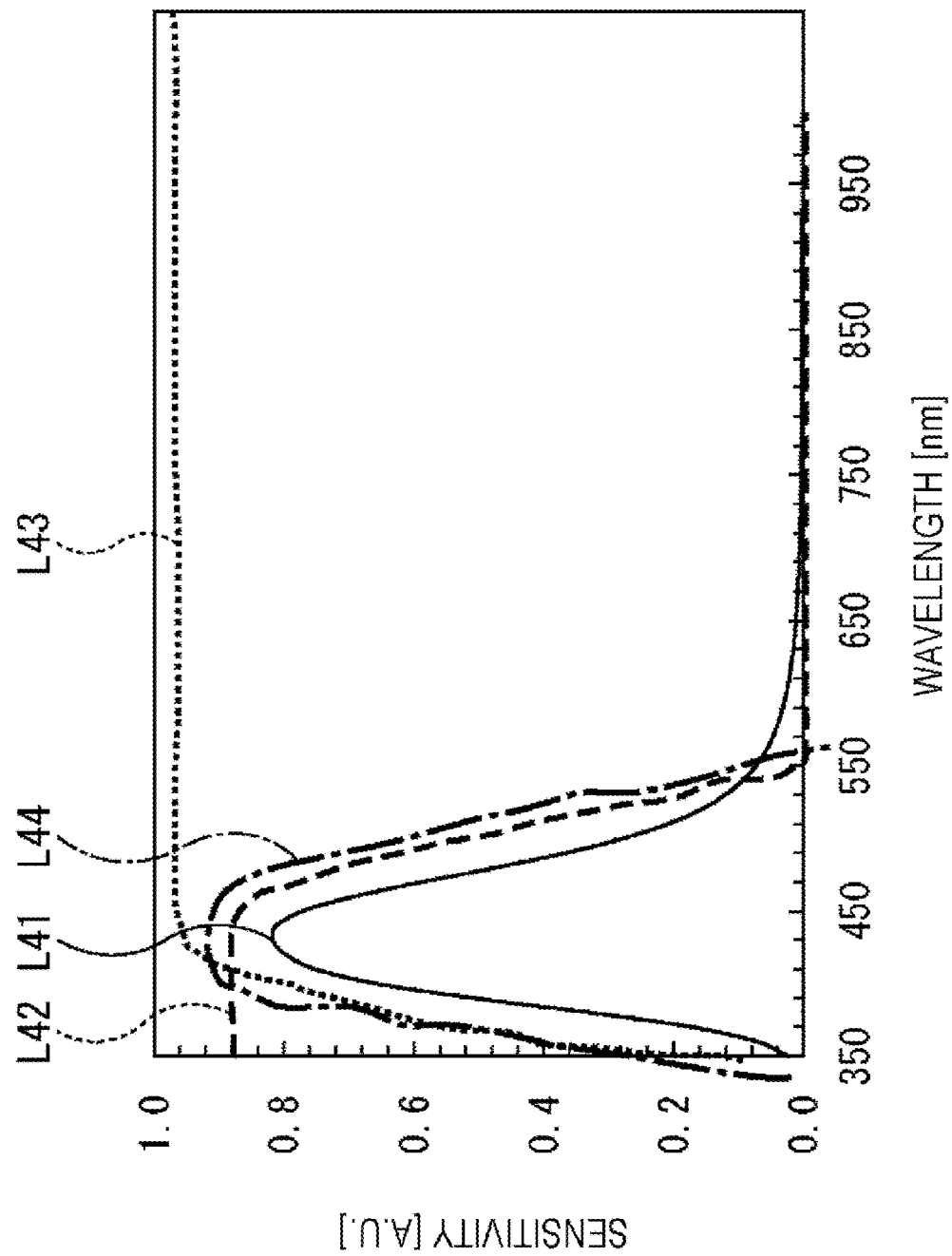
FIG. 19 is a graph illustrating a first example of spectral characteristics of a narrow band filter and a transmission filter.
Figure 20:
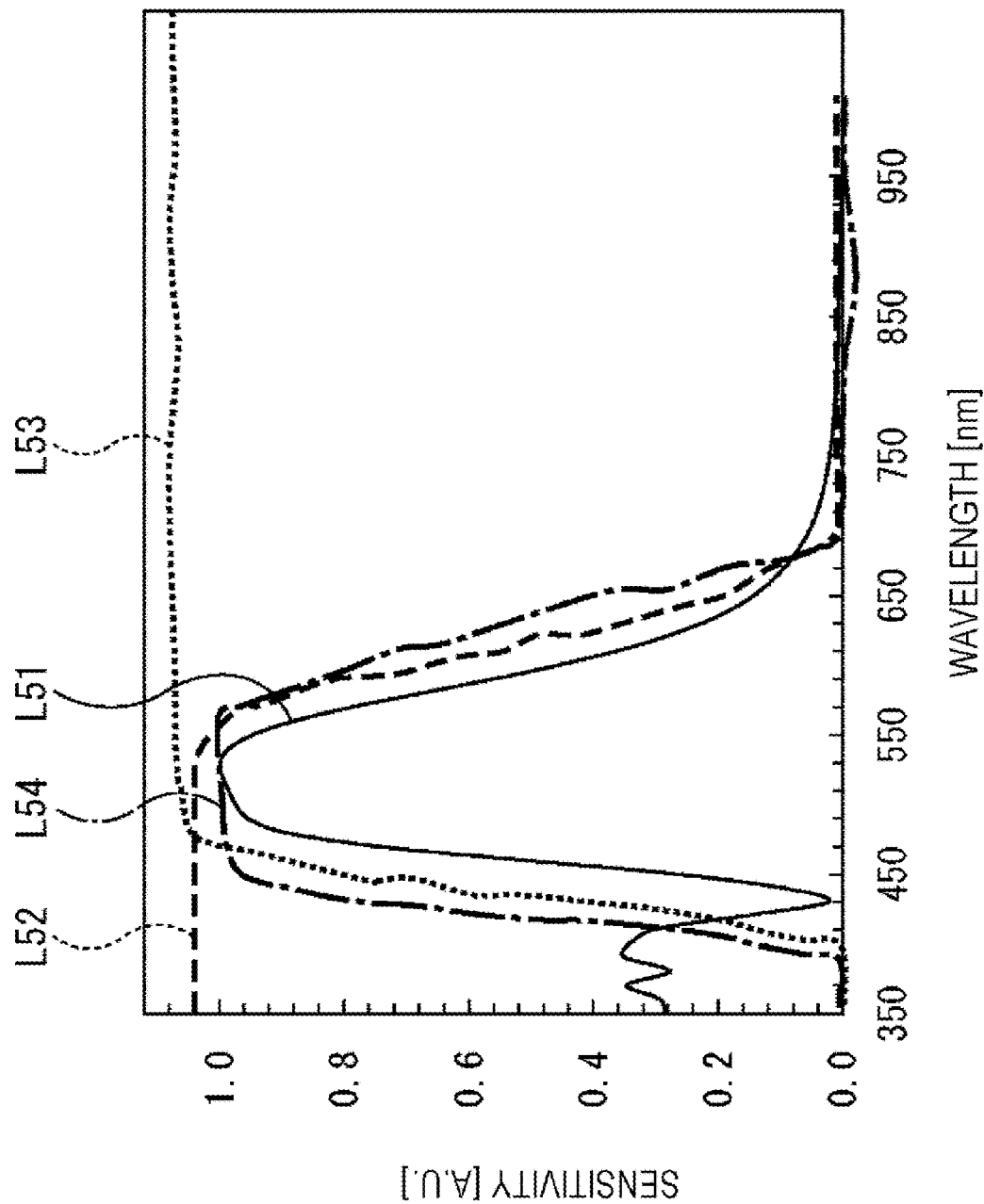
FIG. 20 is a graph illustrating a second example of the spectral characteristics of the narrow band filter and the transmission filter.
Figure 21:
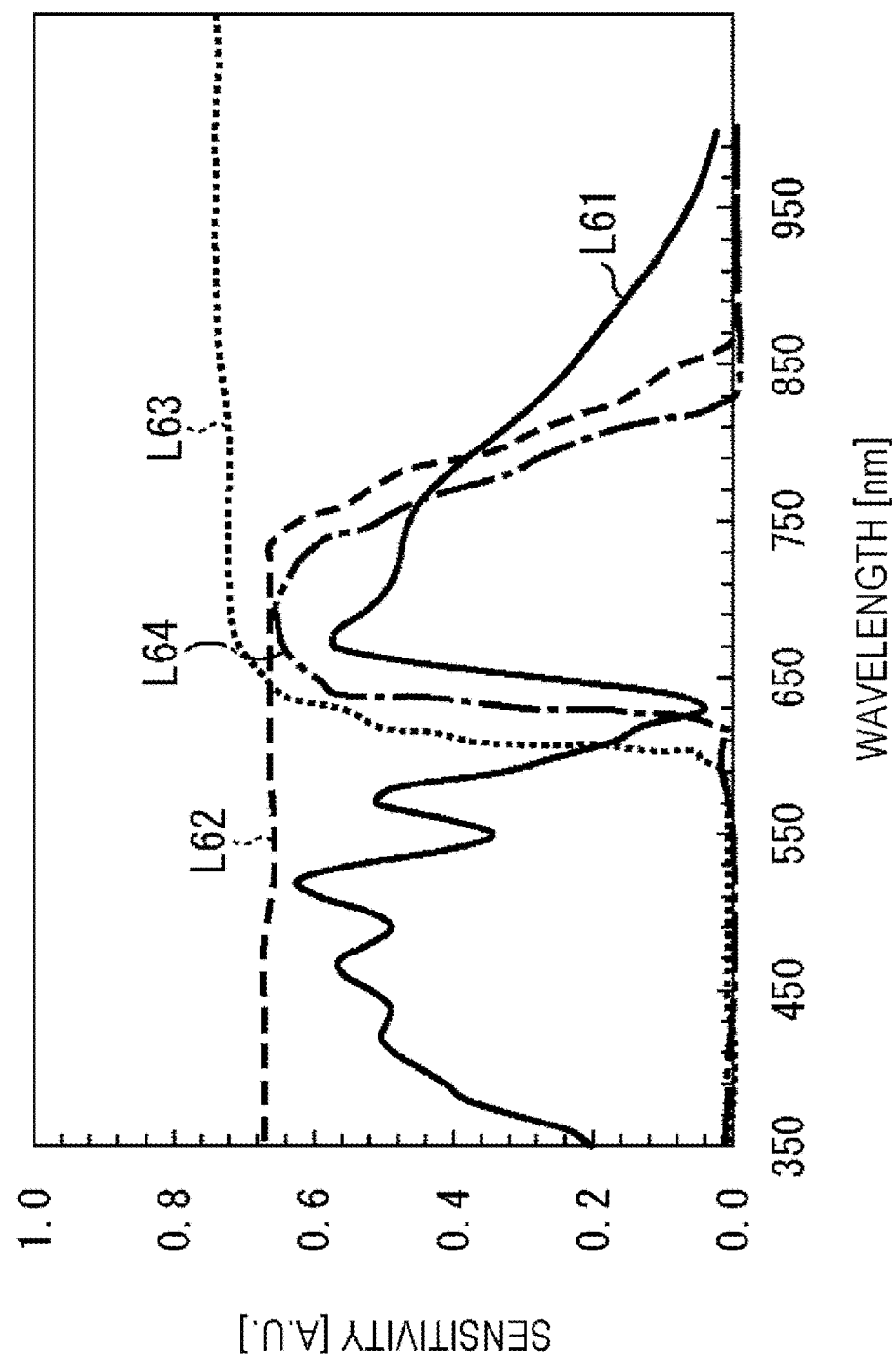
FIG. 21 is a graph illustrating a third example of the spectral characteristics of the narrow band filter and the transmission filter.

FIGS. 19 to 21 illustrate examples of the spectral characteristics of the narrow band filter NB and the spectral characteristics of the transmission filter P disposed on the upper side of the narrow band filter NB. Furthermore, in the graphs of FIGS. 19 to 21, a horizontal axis represents a wavelength (the unit is nm), and a vertical axis represents sensitivity (the unit is an arbitrary unit).

In FIG. 19, a line L41 represents the spectral characteristics of the narrow band filter NB. A peak wavelength of the spectral characteristics of the narrow band filter NB is approximately in the vicinity of 430 nm. A line L42 represents the spectral characteristics of a low pass type transmission filter P. A line L43 represents the spectral characteristics of a high pass type transmission filter P. A line L44 represents the spectral characteristics of a band pass type transmission filter P. The sensitivities of all of the transmission filters P are greater than the sensitivity of the narrow band filter NB in a predetermined wavelength band including the peak wavelength of the spectral characteristics of the narrow band filter NB. Accordingly, it is possible to reduce the light amount of the incident light which is incident on the narrow band filter NB without substantially attenuating the light in the transmission band of the narrow band filter NB, by using any transmission filter P.

In FIG. 20, a line L51 represents the spectral characteristics of narrow band filter NB. A peak wavelength of the spectral characteristics of the narrow band filter NB is approximately in the vicinity of 530 nm. A line L52 represents the spectral characteristics of the low pass type transmission filter P. A line L53 represents the spectral characteristics of the high pass type transmission filter P. A line L54 represents the spectral characteristics of the band pass type transmission filter P. The sensitivities of all of the transmission filters P are greater than the sensitivity of the narrow band filter NB in a predetermined wavelength band including the peak wavelength of the spectral characteristics of the narrow band filter NB. Accordingly, it is possible to reduce the light amount of the incident light which is incident on the narrow band filter NB without substantially attenuating the light in the transmission band of the narrow band filter NB, by using any transmission filter P.

In FIG. 21, a line L61 represents the spectral characteristics of narrow band filter NB. A peak wavelength of the spectral characteristics of the narrow band filter NB in a plasmon mode is approximately in the vicinity of 670 nm. A line L62 represents the spectral characteristics of the low pass type transmission filter P. A line L63 represents the spectral characteristics of the high pass type transmission filter P. A line L64 represents the spectral characteristics of the band pass type transmission filter P. The sensitivities of all of the transmission filters are greater than the sensitivity of the narrow band filter NB in a predetermined wavelength band including the peak wavelength in the plasmon mode of greater than or equal to 630 nm, which is the cutoff wavelength of the spectral characteristics of the narrow band filter NB. Accordingly, it is possible to reduce the light amount of the incident light which is incident on the narrow band filter NB without substantially attenuating the light in the transmission band of the narrow band filter NB in the plasmon mode, by using any transmission filter P. Here, using the high pass type transmission filter P or the band pass type transmission filter P is desirable as the characteristics of a narrow band filter since light in a wavelength band of the narrow band filter NB in a waveguide mode can be cutoff.

Furthermore, in a case where the transmission band of the red color filter R, the green color filter G, or the blue color filter B includes a transmission band of the narrow band filter NB of a lower layer, such filters may be used in the transmission filter P.

In addition, in the example of FIG. 16, an example is described in which the narrow band filter NB is disposed only in a part of the pixels 51, and the narrow band filter NB is capable of being disposed in all of the pixels 51. In this case, in each of the pixels 51, the transmission filter P having a transmission band which includes the transmission band of the narrow band filter NB of the pixel 51 may be disposed on the color filter layer 107.

Further, a combination of the colors of the color filters in the color filter layer 107 is not limited to the example described above, and can be arbitrarily changed.

In addition, in a case where a countermeasure against the flare described above is not necessary, for example, the transmission filter P may be disposed on an upper layer of the narrow band filter NB, or a dummy filter transmitting light at all wavelengths may be disposed.

<Third Embodiment of Imaging Element>

Next, a third embodiment of the imaging element 12 of FIG. 1 will be described with reference to FIG. 22.

Figure 22:
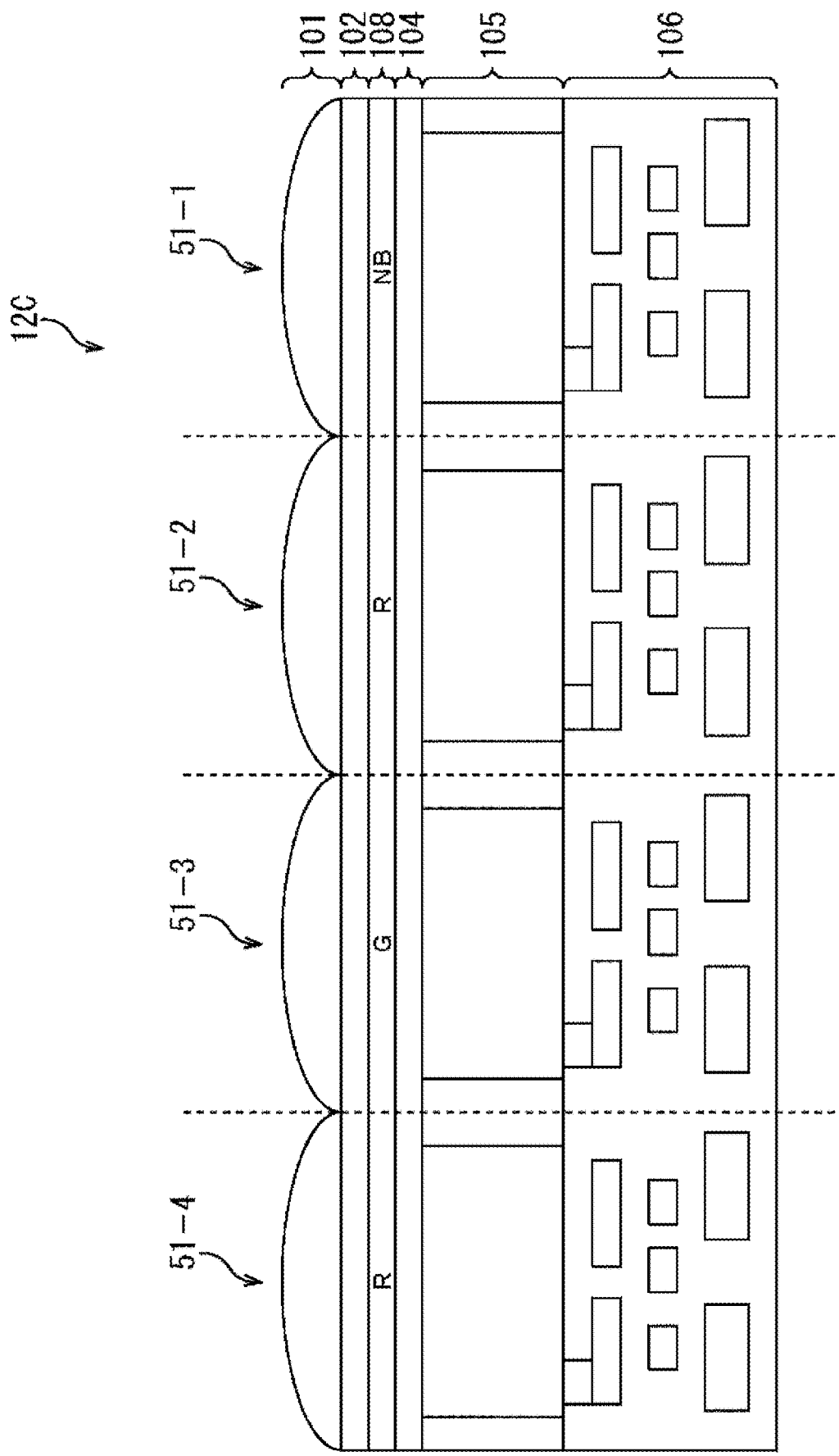
FIG. 22 is a sectional view schematically illustrating a configuration example of a third embodiment of the imaging element.

FIG. 22 schematically illustrates a configuration example of a sectional surface of an imaging element 12C, which is the third embodiment of the imaging element 12. Furthermore, in the drawing, the same reference numerals are applied to portions corresponding to the imaging element 12A of FIG. 3, and the description thereof will be suitably omitted.

The imaging element 12C is different from the imaging element 12A in that a filter layer 108 is disposed instead of the narrow band filter layer 103. In addition, the imaging element 12C is different from the imaging element 12B of FIG. 16 in that the narrow band filter NB and the color filter (for example, the red color filter R, the green color filter G, and the blue color filter B) are disposed in the same filter layer 108.

Accordingly, in a case where the R pixel, the G pixel, the B pixel, and the MS pixel are arranged in the pixel array 31 of the imaging element 12C, the color filter layer 107 can be omitted.

Furthermore, in a case where the color filter of the organic material is used, in order to prevent a damage or the like of the color filter due to heat, for example, the narrow band filter NB is formed first, and final heat processing such as sinter processing is performed at a high temperature, and then, the color filter is formed. On the other hand, in a case where the color filter of the inorganic material is used, basically, there is no necessity to restrict the formation sequence described above.

In addition, in a case where the countermeasure against the flare is performed as in the imaging element 12B of FIG. 16, as with the imaging element 12B, the color filter layer may be laminated between the on-chip microlens 101 and the interlayer film 102. In this case, in the pixel 51 where the narrow band filter NB is disposed on the filter layer 108, the transmission filter P described above is disposed on the color filter layer. On the other hand, in the pixel 51 where the color filter is disposed on the filter layer 108, a filter may be disposed on the color filter layer, or a dummy filter trans- mitting light in all wavelengths or a color filter of the same color as that of the filter layer 108 may be disposed.

2. Second Embodiment

Next, a second embodiment of the present technology will be described with reference to FIGS. 23 to 32.

<Relationship Between Pitch and Thickness of Plasmon Filter and Spectral Characteristics>

FIGS. 23 to 26 are graphs illustrating a relationship between the pitch and the thickness of the plasmon filter and the spectral characteristics.

Each of the graphs of FIGS. 23 to 26 illustrate an example of the spectral characteristics of the plasmon filter in a case where aluminum is used for the conductor thin film, and $SiO_2$ is used for the interlayer film. In each of the graphs, a horizontal axis represents a wavelength (the unit is nm), and a vertical axis represents sensitivity (the unit is an arbitrary unit). In addition, FIGS. 23 to 26 respectively illustrate spectral characteristics in a case where the hole pitch is set to 250 nm, 350 nm, 450 nm, and 550 nm. In addition, in each of the graphs, a waveform of a solid line represents spectral characteristics in a case where the film thickness of the conductor thin film is set to 100 nm, a waveform of a dotted line represents spectral characteristics in a case where the film thickness of the conductor thin film is set to 150 nm, a waveform of a dashed-dotted line represents spectral characteristics in a case where the film thickness of the conductor thin film is set to 200 nm, and a waveform of a dashed-two dotted line represents spectral characteristics in a case where the film thickness of the conductor thin film is set to 250 nm.

As illustrated in each of the graphs, basically, as the hole pitch narrows, and the transmission band is the short wavelength, a peak width and a half width of the transmission band narrow, but the sensitivity (a peak value) decreases. In contrast, basically, as the hole pitch widens, and the transmission band is the long wavelength, the sensitivity (the peak value) increases, but the peak width and the half width of the transmission band widen. Furthermore, in a case where the hole pitch is greater than or equal to 350 nm, a change in the sensitivity according to the hole pitch decreases.

Accordingly, for example, in a case where the transmission band of the plasmon filter is the short wavelength, there is a concern that an SN ratio decrease according to a decrease in the sensitivity. In addition, for example, in a case where the transmission band of the plasmon filter is the long wavelength, the peak width and the half width of the transmission band widen, and thus, there is a concern that color mixture occurs. As a result thereof, there is a concern that a detection accuracy of the narrow band light decreases.

On the other hand, as illustrated in each of the graphs, basically, as the conductor thin film of the plasmon filter becomes thin, the peak width and the half width of the transmission band widen, but the sensitivity (the peak value) increases. In contrast, basically, as the conductor thin film of the plasmon filter becomes thick, the sensitivity (the peak value) decreases, but the peak width and the half width of the transmission band narrow.

Accordingly, it is desirable that the film thickness of the conductor thin film is adjusted according to the hole pitch of the plasmon filter (the transmission band), on the basis of the spectral characteristics. Basically, it is desirable that even though the peak width and the half width of the transmission band slightly widen, the conductor thin film becomes thin, and the sensitivity increases as the hole pitch of the plasmon filter narrows, and the transmission band is the short wavelength. On the other hand, it is desirable that even though the sensitivity slightly decreases, the conductor thin film becomes thick, and the peak width and the half width of the transmission band narrow as the hole pitch of the plasmon filter widens, and the transmission band is the long wavelength.

Figure 23:
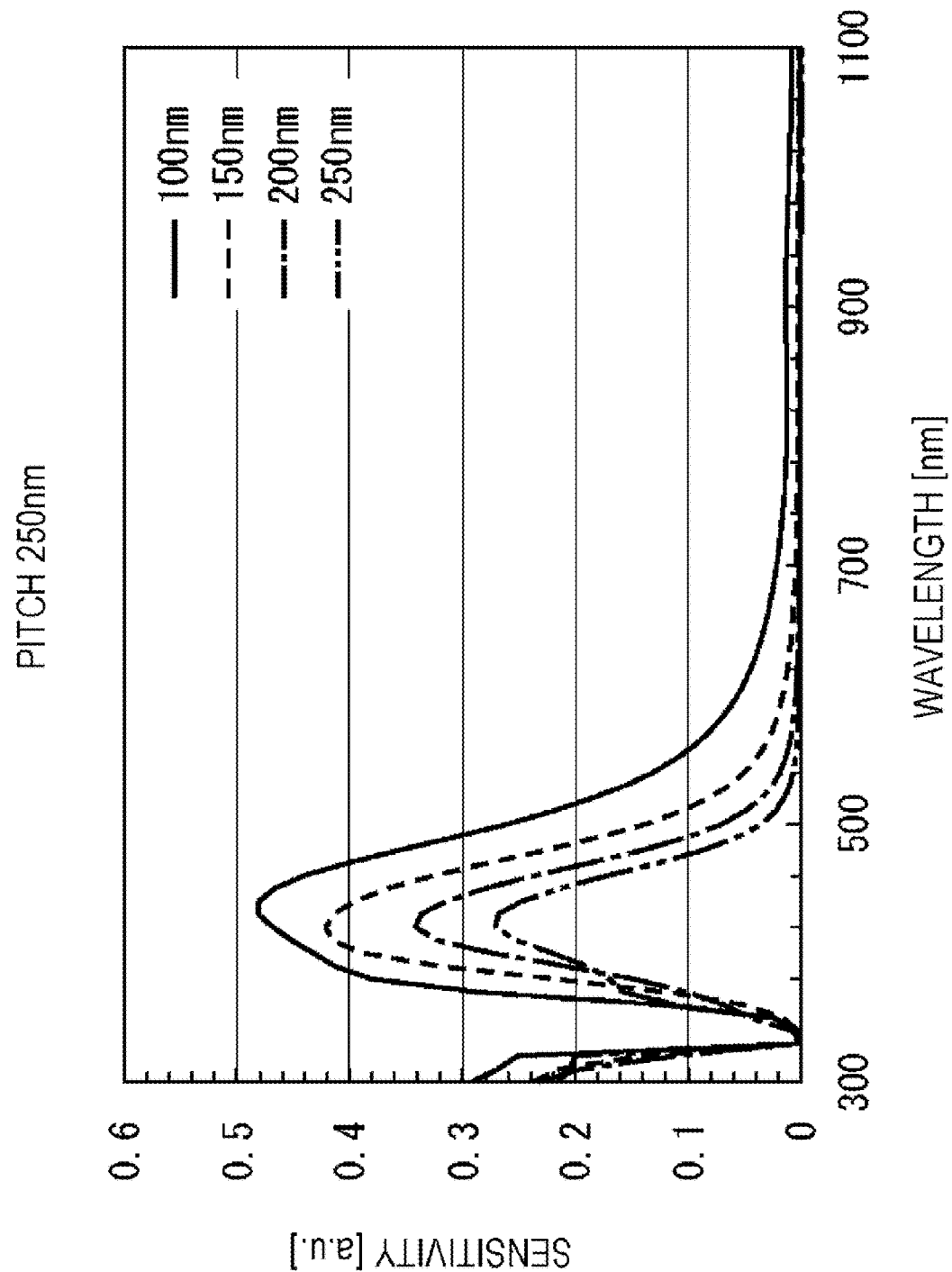
FIG. 23 is a graph illustrating a first example of a relationship between a pitch and a thickness of a plasmon filter and spectral characteristics.
Figure 24:
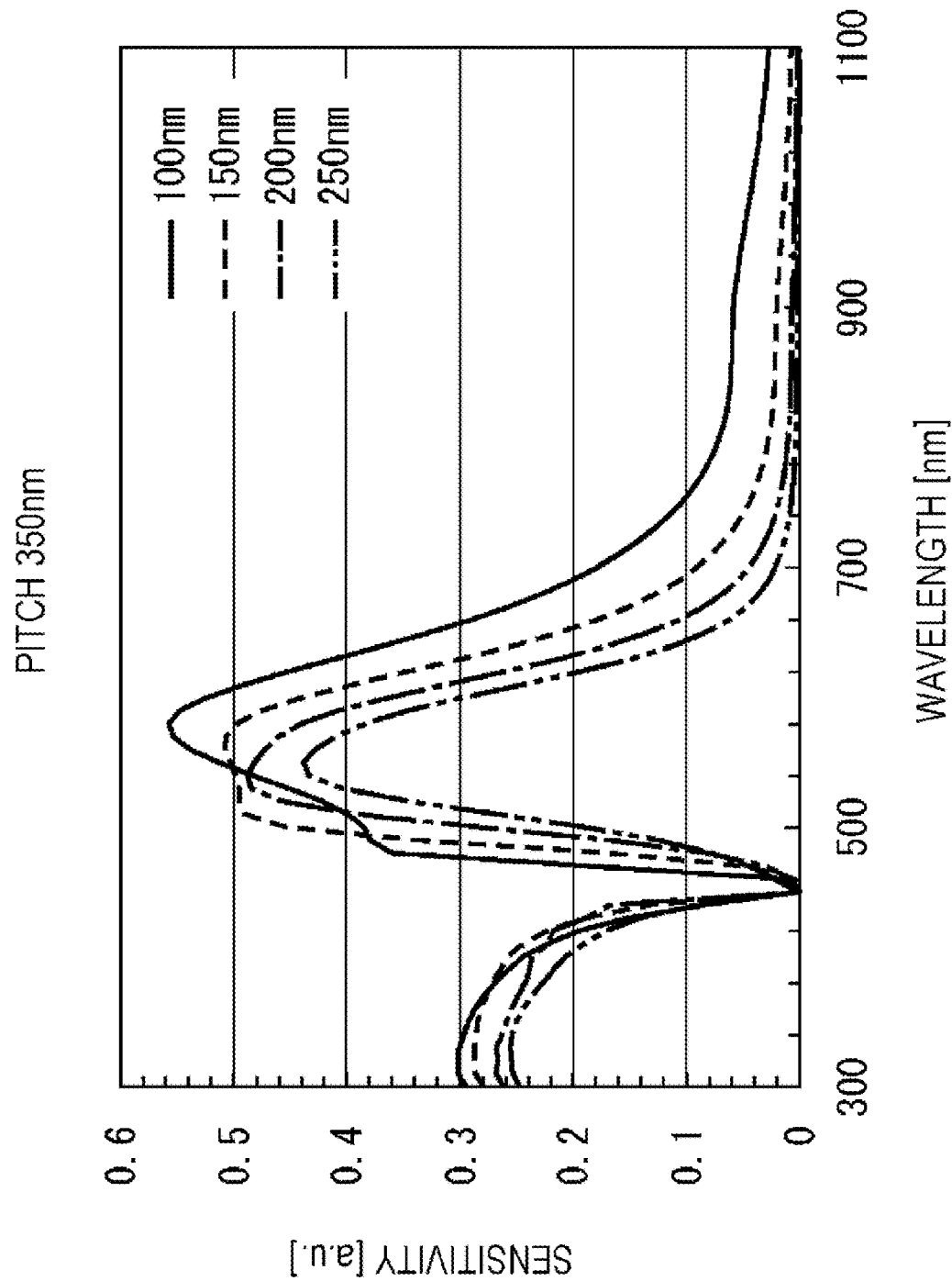
FIG. 24 is a graph illustrating a second example of the relationship between the pitch and the thickness of the plasmon filter and the spectral characteristics.
Figure 25:
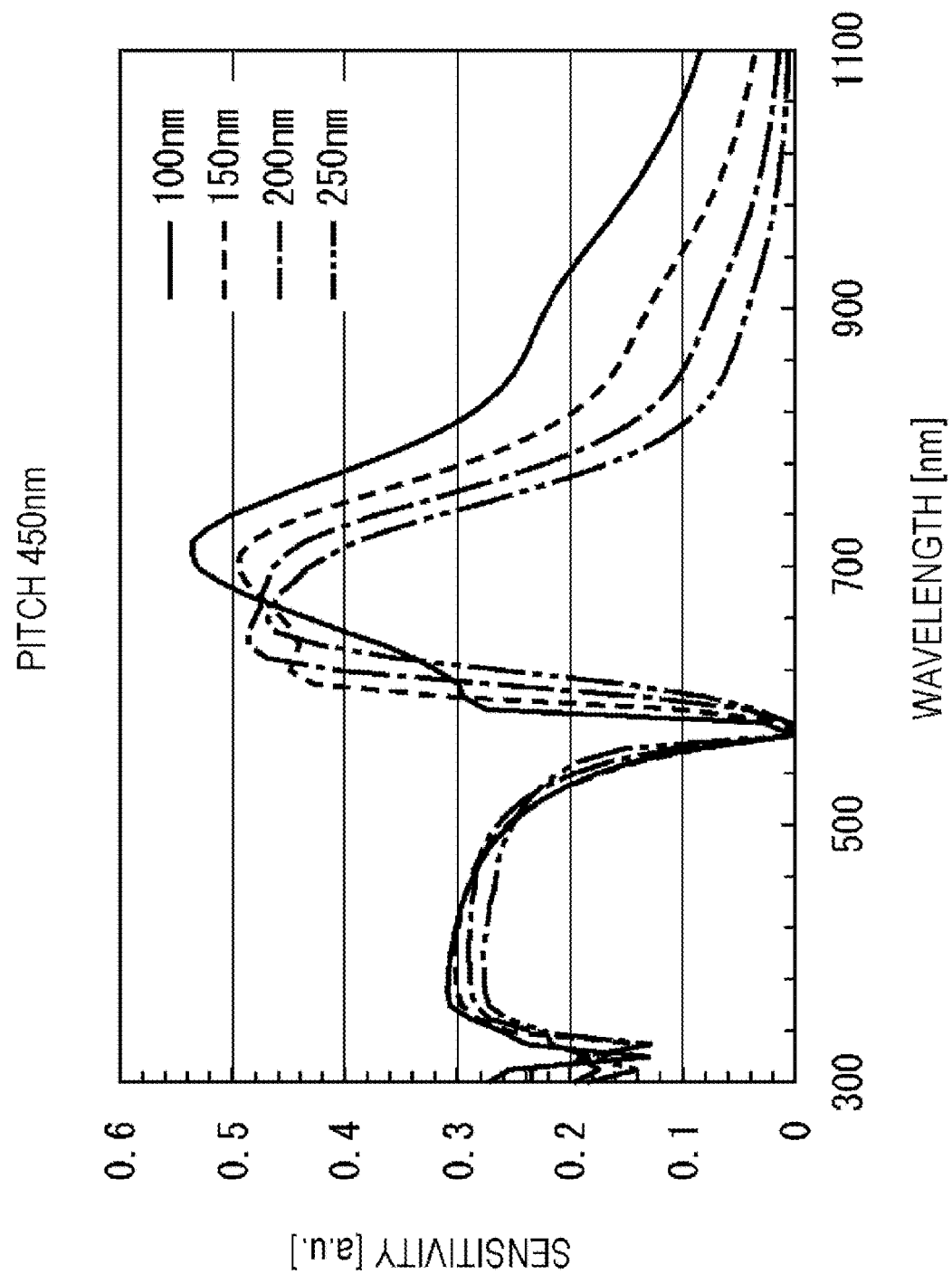
FIG. 25 is a graph illustrating a third example of the relationship between the pitch and the thickness of the plasmon filter and the spectral characteristics.
Figure 26:
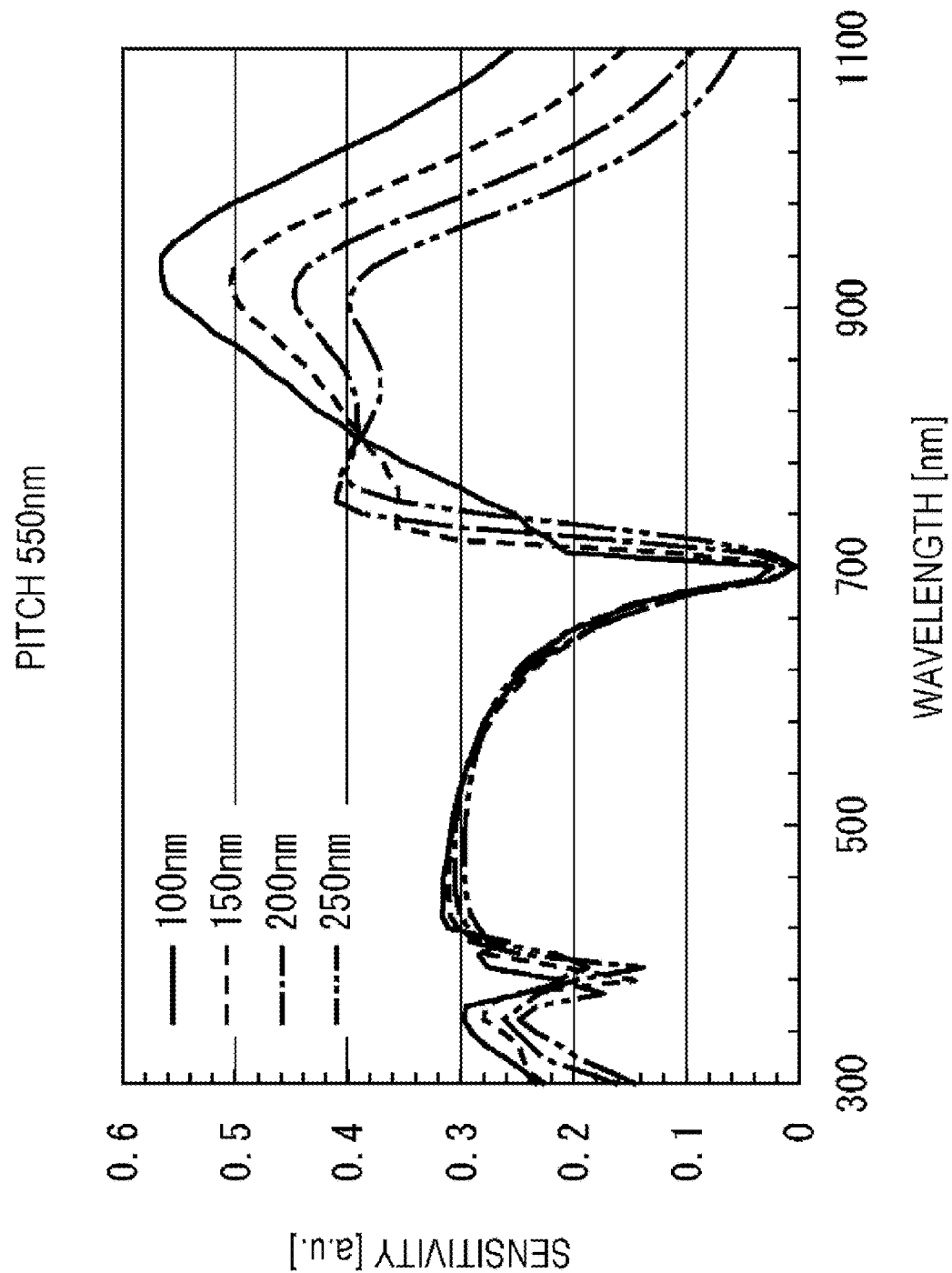
FIG. 26 is a graph illustrating a fourth example of the relationship between the pitch and the thickness of the plasmon filter and the spectral characteristics.

Furthermore, from the peak and the waveform of the spectral characteristics of FIG. 23, in a case where the hole pitch is 250 nm, it is desirable that the film thickness of the conductor thin film is set to 150 nm. From the peak and the waveform of the spectral characteristics of FIG. 24, in a case where the hole pitch is 350 nm, it is desirable that the film thickness of the conductor thin film is set to 200 nm. From the peak and the waveform of the spectral characteristics of FIG. 25, in a case where the hole pitch is 450 nm, it is desirable that the film thickness of the conductor thin film is set to 250 nm. From the peak and the waveform of the spectral characteristics of FIG. 26, in a case where the hole pitch is 550 nm, it is desirable that the film thickness of the conductor thin film is set to 250 nm.

<First Embodiment of Plasmon Filter>

Figure 28:
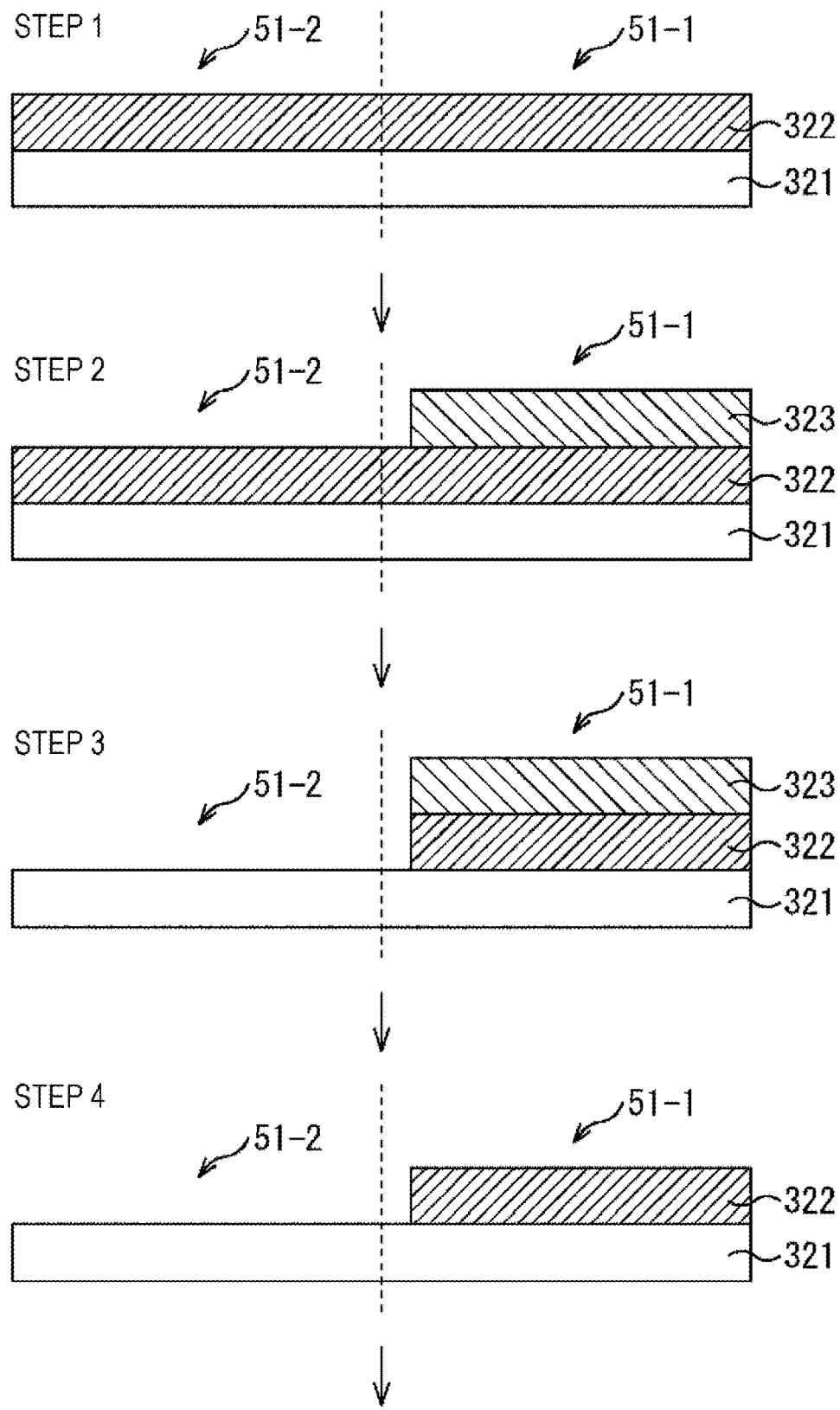
FIG. 28 is a diagram for illustrating a manufacturing method of the plasmon filter of FIG. 27.
Figure 29:
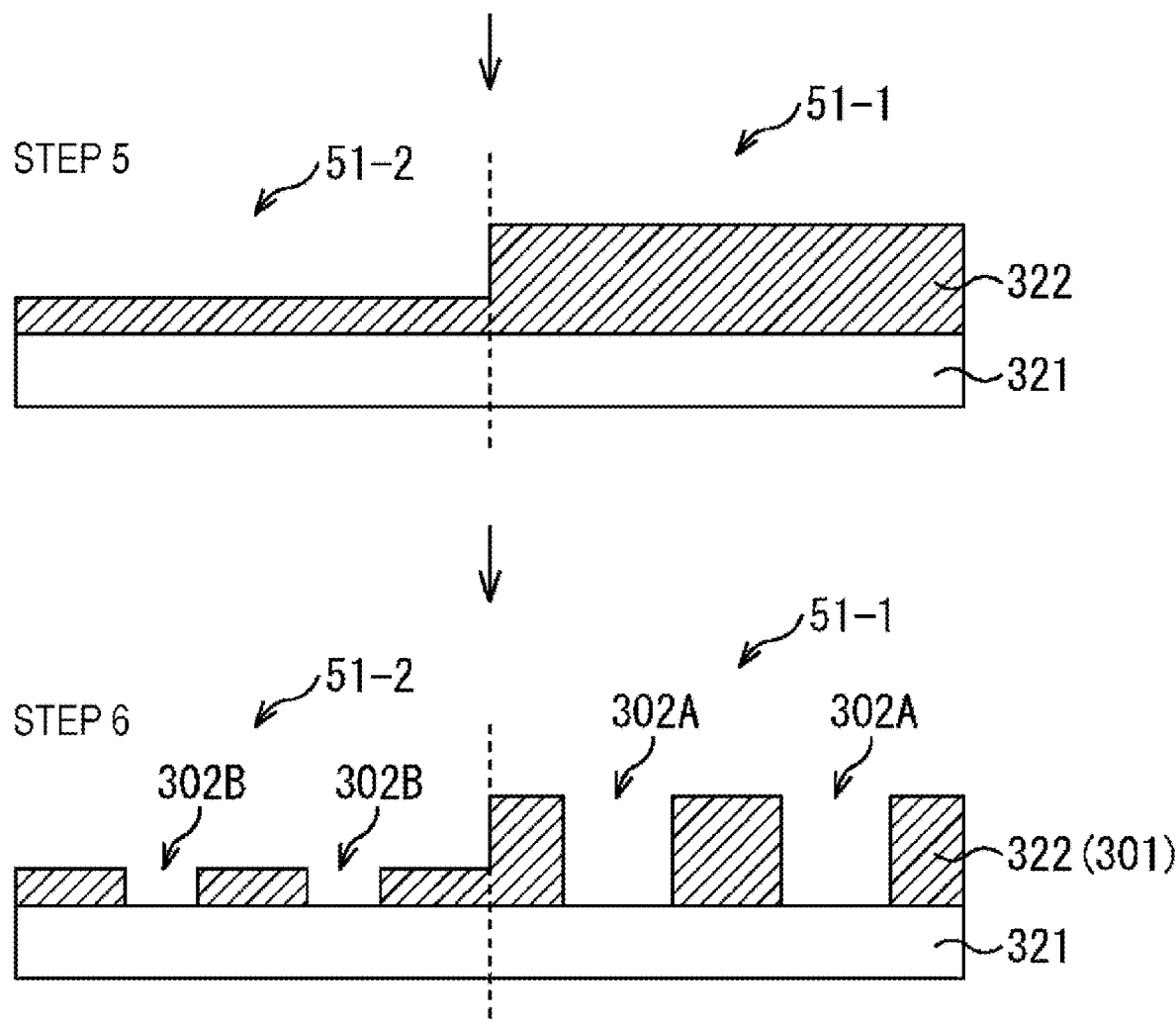
FIG. 29 is a diagram for illustrating the manufacturing method of the plasmon filter of FIG. 27.

Next, a first embodiment of the plasmon filter, in which the film thickness of the conductor thin film is adjusted according to the hole pitch (the transmission band), will be described with reference to FIGS. 27 to 29.

Figure 27:
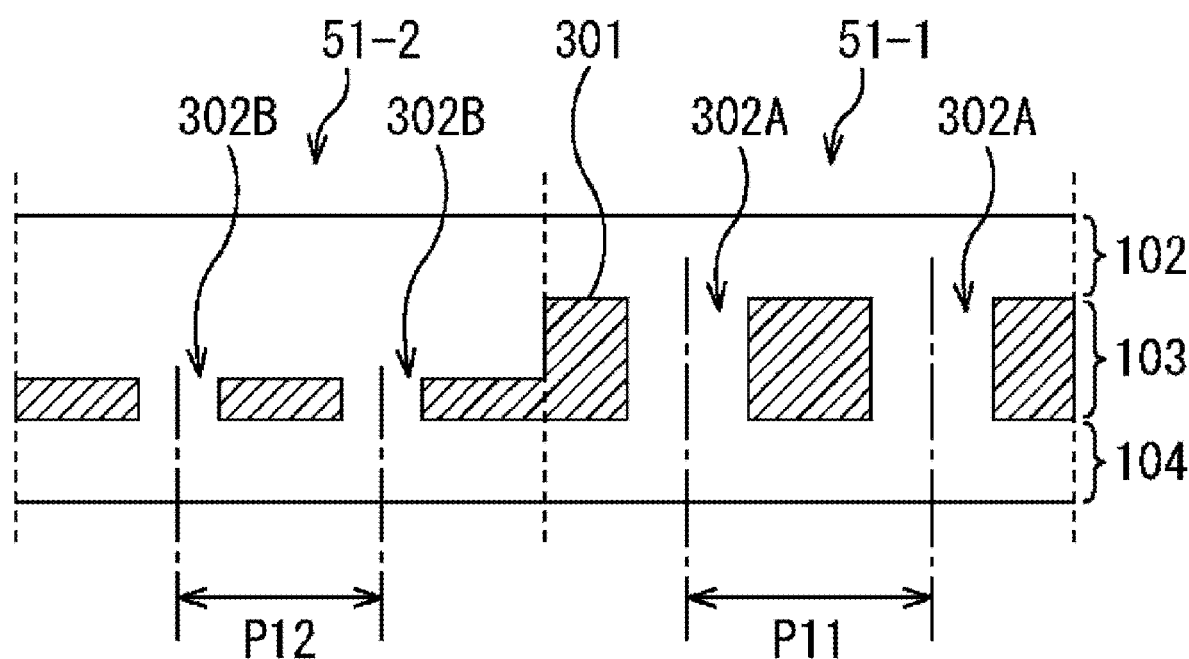
FIG. 27 is a sectional view schematically illustrating a first embodiment of the plasmon filter in which a film thickness of a conductor thin film is adjusted according to a hole pitch.

FIG. 27 is a sectional view schematically illustrating a part of the configuration examples of the interlayer film 102, the narrow band filter layer 103, and the interlayer film 104 of the imaging element 12A of FIG. 3 or the imaging element 12B of FIG. 16.

A conductor thin film 301 configuring the plasmon filter is formed on the narrow band filter layer 103. The conductor thin film 301, for example, is formed of aluminum. In addition, the interlayer film 102 and the interlayer film 104, for example, are formed of SiO2.

In addition, a pitch P11 between adjacent holes 302A of the conductor thin film 301 in the pixel 51-1 is wider than a pitch P12 between adjacent holes 302B of the conductor thin film 301 in the pixel 51-2. Accordingly, a wavelength in the transmission band of the plasmon filter in the pixel 51-1 is longer than a wavelength in the transmission band of the plasmon filter in the pixel 51-2.

On the other hand, a film thickness of the conductor thin film 301 is thicker in the pixel 51-1 than in the pixel 51-2. For example, the film thickness of the conductor thin film 301 in the pixel 51-1 is set to 250 nm, and the film thickness of the conductor thin film 301 in the pixel 51-2 is set to 100 nm. Accordingly, it is possible to narrow the peak width and the half width of the transmission band of the plasmon filter with respect to the pixel 51-1 in which the transmission band is on the long wavelength side. On the other hand, it is possible to increase the sensitivity of the plasmon filter with respect to the pixel 51-2 in which the transmission band is on the short wavelength side.

Next, an example of a manufacturing method of the plasmon filter of FIG. 27 will be described with reference to FIGS. 28 and 29. Furthermore, a dotted line in a vertical direction illustrated in each step represents a boundary between the pixel 51-1 and the pixel 51-2 (hereinafter, referred to as a pixel boundary).

In a step 1, a metal film 322 which, for example, is formed of aluminum and configures the conductor thin film 301 is formed on an oxide film 321 which, for example, is formed of SiO2 and configures the interlayer film 104. A film thickness of the metal film 322, for example, is set to 150 nm.

In a step 2, a resist 323 is applied onto the metal film 322 in the pixel 51-1. At this time, a gap is provided between the pixel boundary and the resist 323. The width of the gap, for example, is set to be less than or equal to a film thickness of a metal film 322 to be formed in a step 5. For example, in a case where the film thickness of the metal film 322 to be formed in the step 5 is 100 nm, when a coverage is 100%, the width of the gap is set to 100 nm, and when the coverage is 50%, the width of the gap is set to 50 nm.

In a step 3, the metal film 322 in a portion other than a portion in which the resist 323 is applied is removed by dry etching. At this time, a gap is generated between the pixel boundary and the metal film 322 due to the gap between the pixel boundary and the resist 323.

In a step 4, the resist 323 is peeled off.

In a step 5, the metal film 322 is further formed on the oxide film 321 and the metal film 322. At this time, the film thickness of the metal film 322 to be formed, for example, is set to 100 nm. Accordingly, the film thickness of the metal film 322 in the pixel 51-1 is 250 nm, and the film thickness of the metal film 322 in the pixel 51-2 is 100 nm. In addition, at this time, the gap between the pixel boundary and the metal film 322, which is generated in the step 3 is filled with the metal film 322.

In a step 6, a hole 302A and a hole 302B are formed on the metal film 322 by etching. Accordingly, the conductor thin film 301 of FIG. 27 is formed. Furthermore, in a case where it is difficult to process holes having different depths once, a shallow hole and a deep hole may be processed by a plurality of times.

After that, even though it is not illustrated, an oxide film formed of SiO2 is formed, the hole 302A and the hole 302B are filled with the oxide film, and the interlayer film 102 is formed.

<Second Embodiment of Plasmon Filter>

Next, a second embodiment of the plasmon filter, in which the film thickness of the conductor thin film is adjusted according to the hole pitch (the transmission band), will be described with reference to FIGS. 30 to 32.

Figure 30:
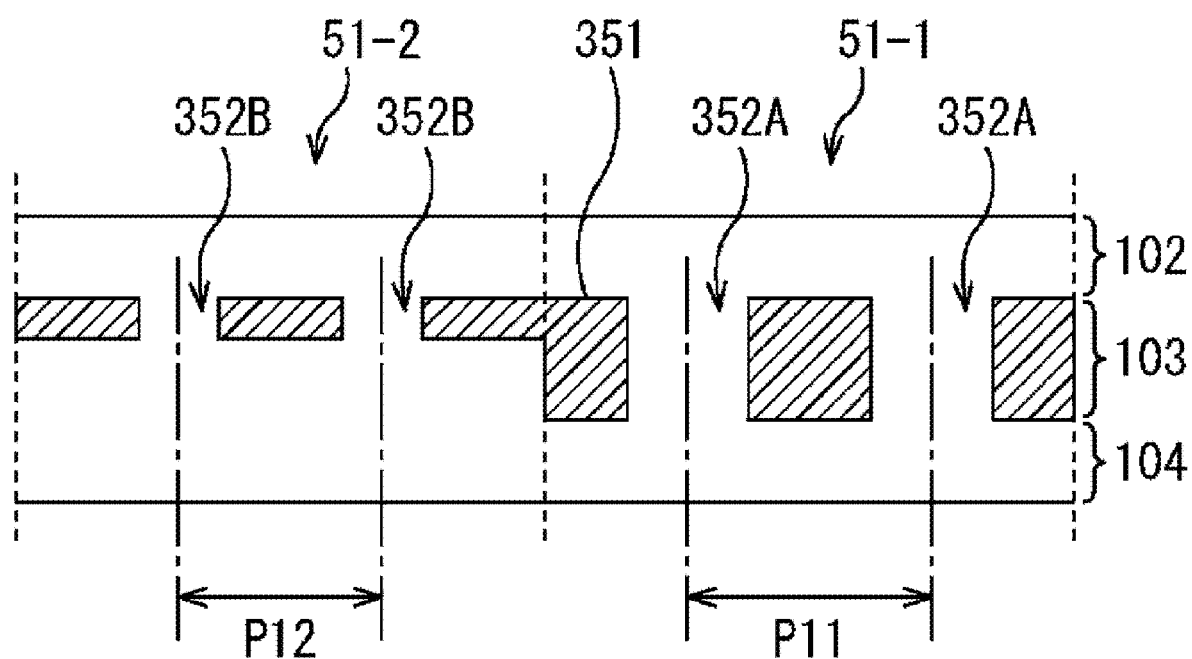
FIG. 30 is a sectional view schematically illustrating a second embodiment of the plasmon filter in which the film thickness of the conductor thin film is adjusted according to the hole pitch.
Figure 31:
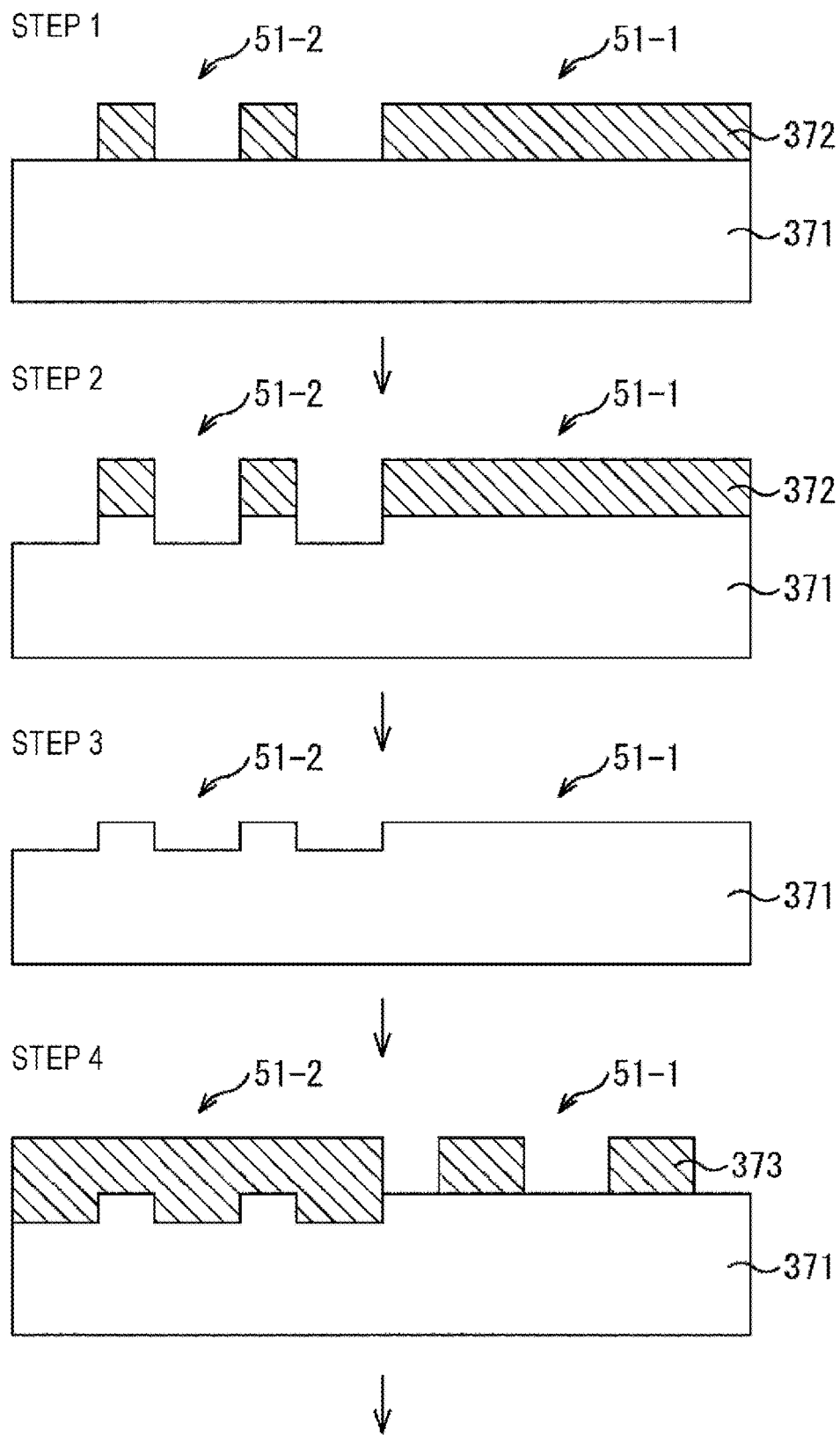
FIG. 31 is a diagram for illustrating a manufacturing method of the plasmon filter of FIG. 30.

FIG. 30 is a sectional view schematically illustrating a part of the configuration examples of the interlayer film 102, the narrow band filter layer 103, and the interlayer film 104 of the imaging element 12A of FIG. 3 or the imaging element 12B of FIG. 16.

Comparing the example of FIG. 30 with the example of FIG. 27, the example of FIG. 30 is different from the example of FIG. 27 in that a conductor thin film 351 is formed in the narrow band filter layer 103 instead of the conductor thin film 301.

Diameters and hole pitches of a hole 352A and a hole 352B of the conductor thin film 351 are respectively identical to the diameters and the hole pitches of the hole 302A and the hole 302B of the conductor thin film 301 of FIG. 27. In addition, a film thickness of the conductor thin film 351 in the pixel 51-1 and a film thickness of the conductor thin film 351 in the pixel 51-2 are respectively identical to the film thickness of the conductor thin film 301 in the pixel 51-1 and the film thickness of the conductor thin film 301 in the pixel 51-2 of FIG. 27. However, the position of the conductor thin film 351 in a depth direction in the pixel 51-2 is different from the position of the conductor thin film 301 in the pixel 51-2 of FIG. 27. This occurs due to a change in a manufacturing step of the plasmon filter.

According to some embodiments, a difference in thickness between pixels 51-1 and 51-2 may be selected based on the hole pitches of the holes 352A and the hole pitches of the holes 352B. For example, the difference between the thickness of the plasmon filter in pixels 51-1 and 51-2 may be calculated to be equal to ((hole pitch of holes 352A)−(hole pitch of holes 352B))÷2.

According to some embodiments, a difference in thickness between pixels 51-1 and 51-2 may be selected based on the peak transmission wavelength through pixel 51-1 and the peak transmission wavelength through pixel 51-2. For example, the difference between the thickness of the plasmon filter in pixels 51-1 and 51-2 may be calculated as ((peak transmission wavelength through pixel 51-1)−(peak transmission wavelength through pixel 51-2))÷2.

Next, an example of a manufacturing method of the plasmon filter of FIG. 30 will be described with reference to FIGS. 31 and 32.

In a step 1, a resist 372 is applied onto an oxide film 371 which, for example, is formed of SiO2 and configures the interlayer film 104. The resist 372 covers the entire front surface of the oxide film 371 in the pixel 51-1, and covers a portion corresponding to the hole 352B on the front surface of the oxide film 371 in the pixel 51-2.

In a step 2, a groove is formed on a portion in the pixel 51-2 in which the conductor thin film 351 of the oxide film 371 is formed (a portion other than the portion corresponding to the hole 352B) by dry etching. The depth of the groove, for example, is set to 100 nm.

In a step 3, the resist 372 is peeled off.

In a step 4, a resist 373 is applied onto the oxide film 371. The resist 373 covers the entire front surface of the oxide film 371 in the pixel 51-2, and covers a portion corresponding to the hole 352A on the front surface of the oxide film 371 in the pixel 51-1.

In a step 5, a groove is formed on a portion in the pixel 51-1 in which the conductor thin film 351 of the oxide film 371 is formed (a portion other than the portion corresponding to the hole 352A) by dry etching. The depth of the groove, for example, is set to 250 nm.

In a step 6, the resist 373 is peeled off.

In a step 7, a metal film 374 is formed on the front surface of the oxide film 371. Accordingly, the grooves of the oxide film 371 in the pixel 51-1 and the pixel 51-2 are filled with the metal film 374.

In a step 8, the metal film 374 is ground by chemical mechanical polishing (CMP) until the front surface of the oxide film 371 is exposed. That is, the metal film 374 is removed up to the front surface of the oxide film 371. Accordingly, the conductor thin film 351 (FIG. 30) formed of the metal film 374 is formed.

After that, even though it is not illustrated, an oxide film formed of SiO2 is formed, and the interlayer film 102 is formed.

Furthermore, a formation procedure of the groove of the oxide film 371 in the pixel 51-1 and the pixel 51-2 may be reversed.

In addition, in the above description, a case where the plasmon filter is formed in the narrow band filter layer 103 of the imaging element 12A of FIG. 3 or the imaging element 12B of FIG. 16 has been described as an example, and similarly, in a case where the plasmon filter is formed in the filter layer 108 of the imaging element 12C of FIG. 22, the film thickness of the conductor thin film can be changed according to the hole pitch (the transmission band).

3. Modification Example

Hereinafter, a modification example of the embodiments of the present technology described above will be described.

For example, the number of types of the film thicknesses of the conductor thin film may be set to be greater than or equal to 3, according to the hole pitch (the transmission band).

In addition, in the plasmon filter having the dot array structure, the film thickness of the conductor thin film (the dot) may be changed according to the dot pitch (the absorption band).

Specifically, as illustrated in FIG. 13, as the dot pitch narrows and the absorption band is shifted to a short wavelength, a peak width and a half width of the absorption band basically narrow, but an absorption rate (a negative peak value of the absorption band) decreases. In contrast, as the dot pitch widens and the absorption band is shifted to a long wavelength, the absorption rate (the negative peak value of the absorption band) is basically improved, but the peak width and the half width of the absorption band widen.

In addition, as the conductor thin film configuring the dot becomes thin, the absorption rate basically decreases, but the peak width and the half width of the absorption band narrow. In contrast, as the conductor thin film configuring the dot becomes thick, the peak width and the half width of the absorption band basically widen, but the absorption rate is improved.

Accordingly, for example, it is desirable that as the dot pitch of the plasmon filter narrows and the absorption band is shifted to the short wavelength, the conductor thin film becomes thick and the absorption rate increases, even though the peak width and the half width of the absorption band slightly widen. In contrast, it is desirable that as the dot pitch of the plasmon filter widens and the absorption band is shifted to the long wavelength, the conductor thin film becomes thin and the peak width and the half width of the transmission band narrow, even though the absorption rate slightly decreases.

Further, for example, in the plasmon filter of the same transmission band (the same hole pitch) or the same absorption band (the same dot pitch), the film thickness of the conductor thin film may be changed for each pixel. Accordingly, it is possible to provide pixels of which the transmission bands or the absorption bands are identical to each other, but the sensitivities or the absorption rates are different from each other. Accordingly, for example, it is possible to improve a detection accuracy of narrow band light in a part of the pixels.

In addition, the present technology is not limited only to the back-side illumination type CMOS image sensor described above, but can be applied to other imaging elements using the plasmon filter. For example, the present technology can be applied to a surface irradiation type CMOS image sensor, a charge coupled device (CCD) image sensor, an image sensor having a photoconductor structure in which an organic photoelectric conversion film, a quantum dot structure, or the like is embedded, and the like.

Figure 33:
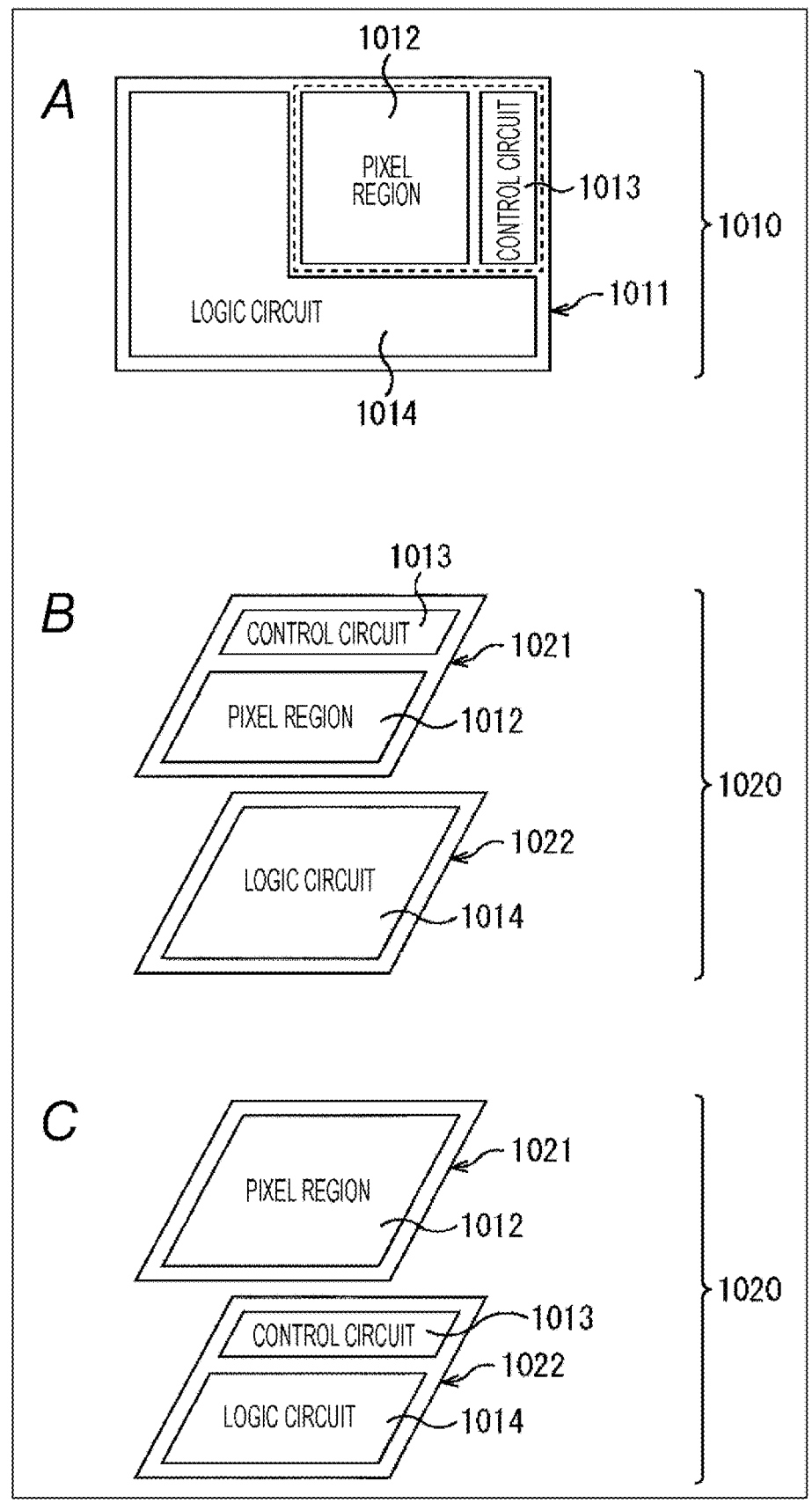
FIGS. 33A to 33C are diagrams illustrating outlines of configuration examples of a laminated solid imaging device to which the present technology can be applied.

In addition, the present technology, for example, can be applied to a laminated solid imaging device illustrated in FIGS. 33A to 33C.

FIG. 33A illustrates a schematic configuration example of a non-laminated solid imaging device. As illustrated in FIG. 33A, a solid imaging device 1010 includes one die (a semiconductor substrate) 1011. A pixel region 1012 in which the pixels are arranged in the shape of an array, a control circuit 1013 performing various controls other than the driving of the pixel, and logic circuit 1014 for signal processing are mounted on the die 1011.

FIGS. 33B and 33C illustrate schematic configuration examples of a laminated solid imaging device. As illustrated in FIGS. 33B and 33C, two dies of a sensor die 1021 and a logic die 1022 are laminated on a solid imaging device 1020, are electrically connected to each other, and are configured as one semiconductor chip.

In FIG. 33B, the pixel region 1012 and the control circuit 1013 are mounted on the sensor die 1021, and the logic circuit 1014 including a signal processing circuit which performs the signal processing is mounted on the logic die 1022.

In FIG. 33C, the pixel region 1012 is mounted on the sensor die 1021, and the control circuit 1013 and the logic circuit 1014 are mounted on the logic die 1024.

Further, the present technology can be applied to a metal thin film filter using a metal thin film other than the plasmon filter, and a possibility that the present technology is applied to photonic crystals using a semiconductor material is considered as an application example.

4. Application Example

Next, an application example of the present technology will be described.

<Application Example of Present Technology>

Figure 34:
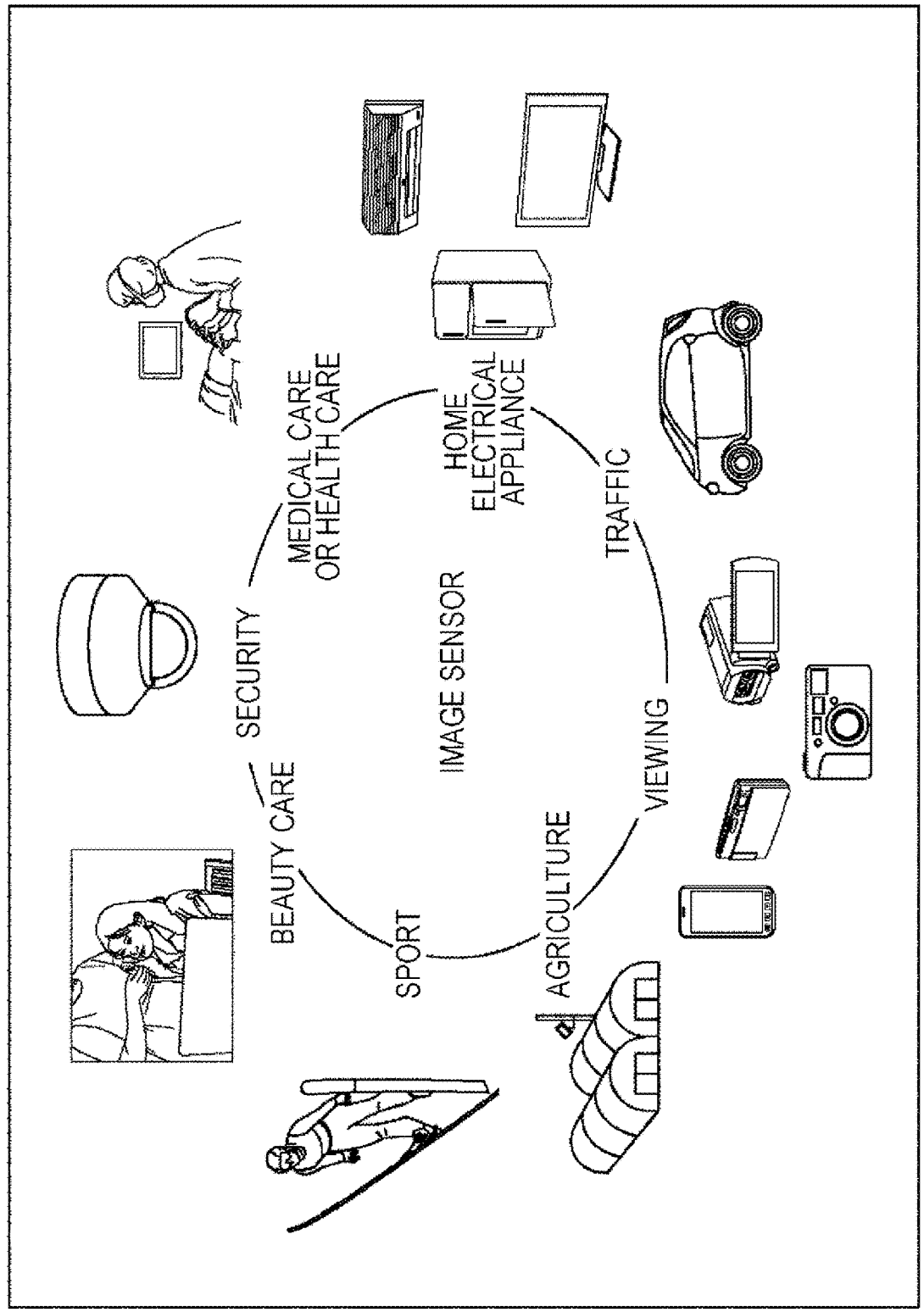
FIG. 34 is a diagram illustrating an application example of the present technology.

For example, as illustrated in FIG. 34, the present technology can be applied to various cases of sensing light such as visible light, infrared light, ultraviolet light, and an X ray.
- a device shooting an image provided for viewing, such as a digital camera or portable device having a camera function
- a device provided for traffic, such as an in-vehicle sensor shooting the front side, the rear side, the circumference, the inside, or the like of the automobile, a monitoring camera monitoring a running vehicle or a road, and a distance measuring sensor measuring a distance between vehicles or the like, in order for a safety operation such as automatic stop, the recognition of the state of a driver, and the like
- a device provided for a home electrical appliance, such as a TV, a refrigerator, and an air conditioner, in order to shoot the gesture of the user, and to perform a device operation according to the gesture
- a device provided for a medical care or a health care, such as an endoscope or a device performing angiography by receiving infrared light
- a device provided for security, such as a monitoring camera for anti-crime and a camera for personal authentication
- a device provided for a beauty care, such as a skin measuring machine shooting the skin and a microscope shooting the scalp
- a device provided for sport, such as an action camera or a wearable camera for sport
- a device provided for agriculture, such as a camera monitoring the state of the cultivation or the crop Hereinafter, a more detailed application example will be described.

For example, the transmission band of the narrow band filter NB of each of the pixels 51 of the imaging device 10 of FIG. 1 is adjusted, and thus, a wavelength band of light which is detected by each of the pixels 51 of the imaging device 10 (hereinafter, referred to as a detection band) can be adjusted. Then, the detection band of each of the pixels 51 is suitably set, and thus, the imaging device 10 can be used for various applications.

For example, FIG. 35 illustrates an example of a detection band in a case where the tastiness or the freshness of the food is detected.

For example, a peak wavelength of a detection band in the case of detecting myoglobin representing a tastiness component of tuna, beef, or the like is in a range of 580 nm to 630 nm, and a half width is in a range of 30 nm to 50 nm. A peak wavelength of a detection band in the case of detecting an oleic acid representing the freshness of the tuna, the beef, or the like is 980 nm, and a half width is in a range of 50 nm to 100 nm. A peak wavelength of a detection band in the case of detecting chlorophyll representing the freshness of leaf vegetable such as *Brassica rapa* is in a range of 650 nm to 700 nm, and a half width is in a range of 50 nm to 100 nm.

FIG. 36 illustrates an example of a detection band in a case where a sugar content or the moisture of a fruit is detected.

For example, a peak wavelength of a detection band in the case of detecting a flesh light path length representing a sugar content of Raiden, which is one breed of melon, is 880 nm, and a half width is in a range of 20 nm to 30 nm. A peak wavelength of a detection band in the case of detecting sucrose representing the sugar content of Raiden is 910 nm, and a half width is in a range of 40 nm to 50 nm. A peak wavelength of a detection band in the case of detecting sucrose representing a sugar content of Raiden Red, which is another breed of melon, is 915 nm, and a half width is in a range of 40 nm to 50 nm. A peak wavelength of a detection band in the case of detecting moisture representing the sugar content of Raiden Red is 955 nm, and a half width is in a range of 20 nm to 30 nm.

A peak wavelength of a detection band in the case of detecting sucrose representing a sugar content of an apple is 912 nm, and a half width is in a range of 40 nm to 50 nm. A peak wavelength of a detection band in the case of detecting water representing the moisture of a mandarin orange is 844 nm, and a half width is 30 nm. A peak wavelength of a detection band in the case of detecting sucrose representing a sugar content of the mandarin orange is 914 nm, and a half width is in a range of 40 nm to 50 nm.

FIG. 37 illustrates an example of a detection band in a case where plastics are sorted.

For example, a peak wavelength of a detection band in the case of detecting poly ethylene terephthalate (PET) is 1669 nm, and a half width is in a range of 30 nm to 50 nm. A peak wavelength of a detection band in the case of detecting poly styrene (PS) is 1688 nm, and a half width is in a range of 30 nm to 50 nm. A peak wavelength of a detection band in the case of detecting poly ethylene (PE) is 1735 nm, and a half width is in a range of 30 nm to 50 nm. A peak wavelength of a detection band in the case of detecting poly vinyl chloride (PVC) is in a range of 1716 nm to 1726 nm, and a half width is in a range of 30 nm to 50 nm. A peak wavelength of a detection band in the case of detecting polypropylene (PP) is in a range of 1716 nm to 1735 nm, and a half width is in a range of 30 nm to 50 nm.

In addition, for example, the present technology can be applied to freshness management of plucked flower.

Further, for example, the present technology can be applied to an inspection of foreign substances which are mixed into the food. For example, the present technology can be applied to the detection of the foreign substances, such as a shell, a hull, a stone, a leaf, a branch, and a wood chip, which are mixed into nuts, such as an almond, a blueberry, and a walnut, or fruits. In addition, for example, the present technology can be applied to the detection of the foreign substances such as plastic pieces mixed into processed food, beverage, or the like.

Further, for example, the present technology can be applied to the detection of a normalized difference vegetation index (NDVI), which is an index of vegetation.

In addition, for example, the present technology can be applied to the detection of a human body on the basis of any one or both of a spectral shape in the vicinity of a wavelength of 580 nm, derived from Hemoglobin of the human skin and a spectral shape in the vicinity of a wavelength of 960 nm, derived from a melanin dye contained in the human skin.

Further, for example, the present technology can be applied to biological detection (biological authentication), fabrication prevention, monitoring, and the like of a user interface and a sign.

<Application Example of Endoscopic Surgery System>

In addition, for example, a technology according to an embodiment of the present disclosure (the present technology) may be applied to an endoscopic surgery system.

Figure 38:
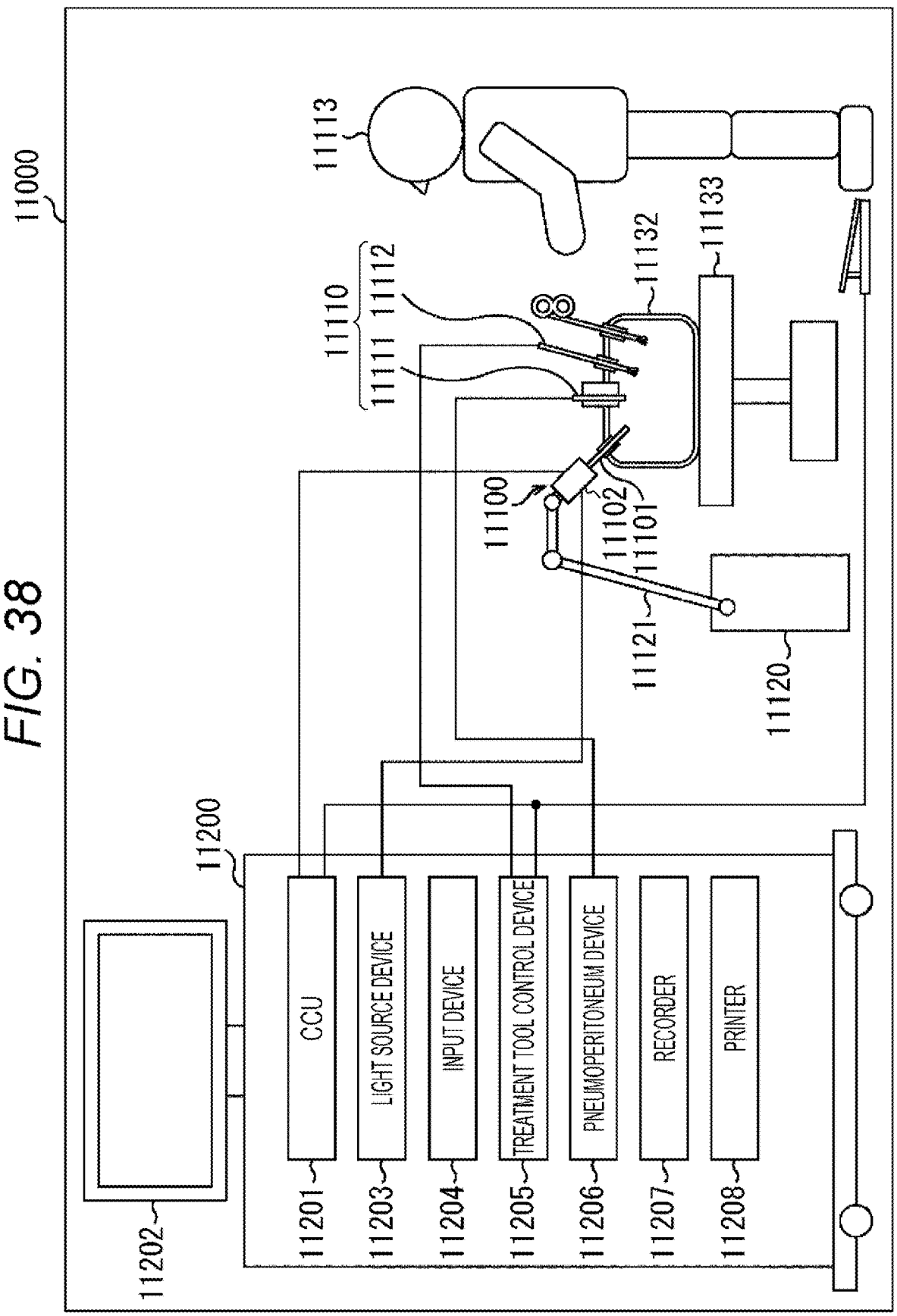
FIG. 38 is a diagram illustrating an example of a schematic configuration of an endoscopic surgery system.

FIG. 38 is a diagram illustrating an example of a schematic configuration of the endoscopic surgery system to which the technology according to an embodiment of the present disclosure (the present technology) is applied.

FIG. 38 illustrates an aspect in which an operator (a medical doctor) 11131 performs a surgery with respect to a patient 11132 on a patient bed 11133 by using an endoscopic surgery system 11000. As illustrated in the drawing, the endoscopic surgery system 11000 is configured of an endoscope 11100, other surgical tools 11110 such as a pneumoperitoneum tube 11111 or an energy treatment tool 11112, a support arm device 11120 supporting the endoscope 11100, and a cart 11200 on which various devices for the surgery under the endoscope are mounted.

The endoscope 11100 is configured of a lens barrel 11101 in which a region having a predetermined length from a tip end is inserted into a body cavity of the patient 11132, and a camera head 11102 connected to a base end of the lens barrel 11101. In the illustrated example, the endoscope 11100 configured as a so-called rigid scope including a rigid lens barrel 11101 is illustrated, and the endoscope 11100 may be configured as a so-called flexible scope including a flexible lens barrel.

An opening portion embedded with an objective lens is disposed on the tip end of the lens barrel 11101. A light source device 11203 is connected to the endoscope 11100, and light generated by the light source device 11203 is guided to the tip end of the lens barrel by a light guide extending in the lens barrel 11101, and is emitted towards an observation target in the body cavity of the patient 11132 through the objective lens. Furthermore, the endoscope 11100 may be a direct view mirror, or may be a perspective view mirror or a side view mirror.

An optical system and an imaging element are disposed on the camera head 11102, and reflection light from the observation target (observation light) is condensed on the imaging element by the optical system. The observation light is subjected to photoelectric conversion by the imaging element, and thus, an electric signal corresponding to the observation light, that is, an image signal corresponding to the observation image is generated. The image signal is transmitted to a camera control unit (CCU) 11201 as RAW data.

The CCU 11201 is configured of a central processing unit (CPU), a graphics processing unit (GPU), or the like, and integrally controls the operations of the endoscope 11100 and a display device 11202. Further, the CCU 11201 receives the image signal from the camera head 11102, and performs various image processings for displaying an image based on the image signal with respect to the image signal, such as developing processing (demosaic processing).

The display device 11202 displays the image based on the image signal, which is subjected to the image processing by the CCU 11201, according to the control from the CCU 11201.

The light source device 11203, for example, is configured of a light source such as a light emitting diode (LED), and supplies irradiation light at the time of shooting a surgical site or the like to the endoscope 11100.

An input device 11204 is an input interface with respect to the endoscopic surgery system 11000. It is possible for the user to perform various information inputs or instruction inputs with respect to the endoscopic surgery system 11000 through the input device 11204. For example, the user inputs an instruction or the like to the effect of changing imaging conditions of the endoscope 11100 (the type of irradiation light, a magnification, a focal point distance, and the like).

A treatment tool control device 11205 controls the drive of the energy treatment tool 11112, such as the cauterization of tissues, and the incision or the sealing of a blood vessel. A pneumoperitoneum device 11206 feeds gas in the body cavity through the pneumoperitoneum tube 11111, in order to inflate the body cavity of the patient 11132 to ensure a visual field of the endoscope 11100 and an operation space of the operator. A recorder 11207 is a device which is capable of recording various information items relevant to the surgery. A printer 11208 is a device which is capable of printing various information items relevant to the surgery in various formats such as a text, an image, or a graph.

Furthermore, the light source device 11203 supplying the irradiation light at the time of shooting the surgical site to the endoscope 11100, for example, can be configured of a white light source which is configured of an LED, a laser light source, or a combination thereof. In a case where the white light source is configured of a combination of RGB laser light sources, an output intensity and an output timing of each color (each wavelength) can be controlled with a high accuracy, and thus, a white balance of the imaged image can be adjusted in the light source device 11203. In addition, in this case, the RGB laser light source irradiates the observation target with each laser light ray in time division, and controls the driving of the imaging element of the camera head 11102 in synchronization with the irradiation timing, and thus, it is also possible to image an image corresponding to each of RGB in time division. According to the method described above, it is possible to obtain a color image even in a case where the color filter is not disposed in the imaging element.

In addition, the light source device 11203 may control the driving such that the light intensity to be output is changed for each predetermined time. The driving of the imaging element of the camera head 11102 is controlled in synchronization with a timing at which the light intensity is changed, an image is acquired in time division, and the image is synthesized, and thus, it is possible to generate an image in a high dynamic range without having so-called black defects and overexposure.

In addition, the light source device 11203 may be configured to be capable of supplying light in a predetermined wavelength band corresponding to special light observation. In the special light observation, for example, light in a narrow band, compared to the irradiation light (that is, white light) at the time of normal observation, is emitted by using wavelength dependency of light absorption in the body tissues, and thus, so-called narrow band light observation (narrow band imaging) shooting a predetermined tissue of the blood vessel or the like on a surface layer of a mucous membrane with a high contrast is performed. Alternatively, in the special light observation, fluorescent light observation may be performed in which an image is obtained by fluorescent light generated by emitting excitation light. In the fluorescent light observation, the body tissues are irradiated with the excitation light, and thus, the fluorescent light from the body tissues can be observed (self-fluorescent light observation), or a reagent such as indocyanine green (ICG) is locally injected into the body tissues, and the body tissues are irradiated with excitation light corresponding to the wavelength of the fluorescent light of the reagent, and thus, a fluorescent image can be obtained. The light source device 11203 can be configured to be capable of supplying the narrow band light and/or the excitation light corresponding to the special light observation.

Figure 39:
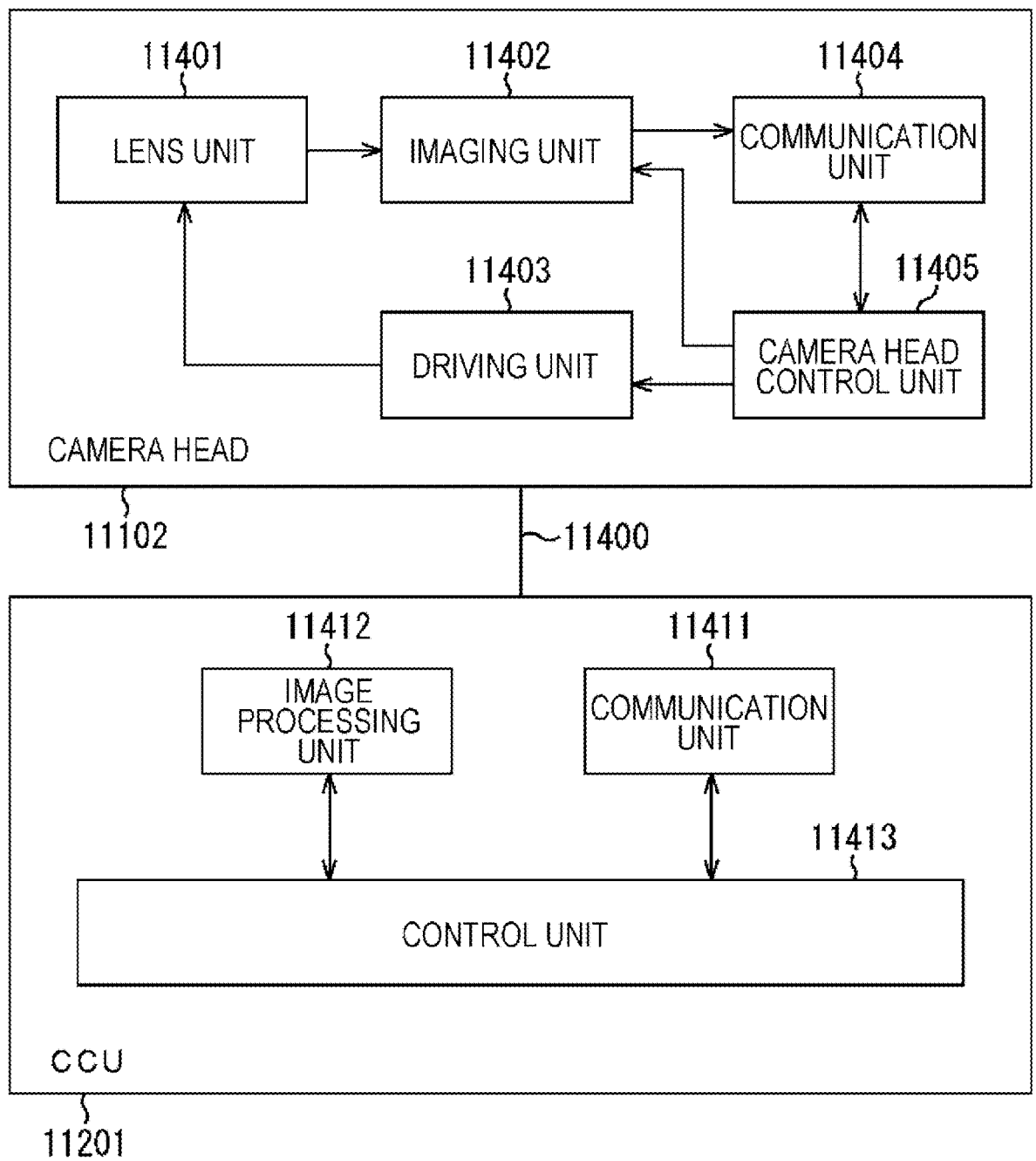
FIG. 39 is a block diagram illustrating an example of a functional configuration of a camera head and CCU.

FIG. 39 is a block diagram illustrating an example of functional configurations of the camera head 11102 and the CCU 11201 illustrated in FIG. 38.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are connected to each other to communicate with each other by a transmission cable 11400.

The lens unit 11401 is an optical system which is disposed in a connection portion with respect to the lens barrel 11101. The captured observation light from the tip end of the lens barrel 11101 is guided to the camera head 11102, and is incident on the lens unit 11401. The lens unit 11401 is configured of a combination of a plurality of lenses including a zoom lens and a focus lens.

The imaging element configuring the imaging unit 11402 may be one imaging element (a so-called single-plate type imaging element), or may be a plurality of imaging elements (a so-called multi-plate type imaging element). In a case where the imaging unit 11402 is configured of the multi-plate type imaging element, for example, image signals corresponding to each of RGB are generated by each of the imaging elements, and are synthesized, and thus, a color image may be obtained. Alternatively, the imaging unit 11402 may be configured to include a pair of imaging elements for acquiring image signals for a right eye and a left eye, which correspond to three-dimensional (3D) display. By performing the 3D display, it is possible for the operator 11131 to more accurately grasp the depth of the body tissues in the surgical site. Furthermore, in a case where the imaging unit 11402 is configured of the multi-plate type imaging element, a plurality of lens units 11401 can also be disposed corresponding to each of the imaging elements.

In addition, the imaging unit 11402 may not be necessarily disposed on the camera head 11102. For example, the imaging unit 11402 may disposed in the lens barrel 11101 immediately behind the objective lens.

The driving unit 11403 is configured of an actuator, and moves the zoom lens and the focus lens of the lens unit 11401 along an optical axis by a predetermined distance, according to the control from the camera head control unit 11405. Accordingly, the magnification and the focal point of the imaged image obtained by the imaging unit 11402 can be suitably adjusted.

The communication unit 11404 is configured of a communication device for transmitting and receiving various information items with respect to the CCU 11201. The communication unit 11404 transmits the image signal obtained from the imaging unit 11402 to the CCU 11201 through the transmission cable 11400, as RAW data.

In addition, the communication unit 11404 receives a control signal for controlling the driving the camera head 11102 from the CCU 11201, and supplies the control signal to the camera head control unit 11405. The control signal, for example, includes information relevant to the imaging conditions, such as information to the effect of designating a frame rate of the imaged image, information to the effect of designating an exposure value at the time of imaging, and/or information to the effect of designating the magnification and the focal point of the imaged image.

Furthermore, the imaging conditions such as the frame rate or the exposure value, the magnification, and the focal point, described above, may be suitably designated by the user, or may be automatically set by the control unit 11413 of the CCU 11201 on the basis of the acquired image signal. In the latter case, a so-called auto exposure (AE) function, an auto focus (AF) function, and an auto white balance (AWB) function are mounted on the endoscope 11100.

The camera head control unit 11405 controls the driving of the camera head 11102 on the basis of the control signal from the CCU 11201, which is received through the communication unit 11404.

The communication unit 11411 is configured of a communication device for transmitting and receiving various information items with respect to the camera head 11102. The communication unit 11411 receives the image signal transmitted through the transmission cable 11400 from the camera head 11102.

In addition, the communication unit 11411 transmits the control signal for controlling the driving of the camera head 11102 to the camera head 11102. The image signal or the control signal can be transmitted by telecommunication, light communication, or the like.

The image processing unit 11412 performs various image processings with respect to the image signal, which is the RAW data transmitted from the camera head 11102.

The control unit 11413 performs various controls relevant to the imaging of the surgical site or the like using the endoscope 11100 and the display of the imaged image obtained by imaging the surgical site or the like. For example, the control unit 11413 generates the control signal for controlling the driving of the camera head 11102.

In addition, the control unit 11413 displays the imaged image, on which the surgical site or the like is reflected, on the display device 11202, on the basis of the image signal which is subjected to the image processing by the image processing unit 11412. At this time, the control unit 11413 may recognize various objects in the imaged image by using various image recognition technologies. For example, the control unit 11413 detects the shape, the color, or the like of the edge of the object which is included in the imaged image, and thus, is capable of recognizing a surgical tool such as forceps, a specific organic site, bleed, mist at the time of using the energy treatment tool 11112, or the like. The control unit 11413 may display various surgery assistance information items by superimpose the information on the image of the surgical site, by using the recognition result, at the time of displaying the imaged image on the display device 11202. The surgery assistance information is displayed by being superimposed, and is presented to the operator 11131, and thus, it is possible to reduce a load on the operator 11131, and it is possible for the operator 11131 to reliably perform the surgery.

The transmission cable 11400 connecting the camera head 11102 and the CCU 11201 to each other is an electric signal cable corresponding to the communication of the electric signal, an optical fiber corresponding to the light communication, or a composite cable thereof.

Here, in the illustrated example, the communication is performed in a wired manner by using the transmission cable 11400, and the communication between the camera head 11102 and the CCU 11201 may be performed in a wireless manner.

As described above, an example of the endoscopic surgery system which can be obtained by applying the technology according to an embodiment of the present disclosure thereto has been described. In the configurations described above, the technology according to an embodiment of the present disclosure, for example, can be obtained by being applied to the camera head 11102 or the imaging unit 11402 of the camera head 11102. Specifically, for example, the imaging element 12 of FIG. 1 can be applied to the imaging unit 11402. It is possible to obtain a more specific and high accurate surgical site image by applying the technology according to an embodiment of the present disclosure to the imaging unit 11402, and thus, it is possible for the operator to reliably confirm the surgical site.

Furthermore, here, the endoscopic surgery system has been described as an example, but the technology according to an embodiment of the present disclosure, for example, may be applied to a microscope surgery system or the like in addition to the endoscopic surgery system.

<Application Example to Movable Body>

In addition, for example, the technology according to an embodiment of the present disclosure may be realized as a device mounted on any type of movable body such as an automobile, an electric automobile, a hybrid electric automobile, a motorcycle, a bicycle, a personal mobility, an airplane, a drone, a ship, and a robot.

Figure 40:
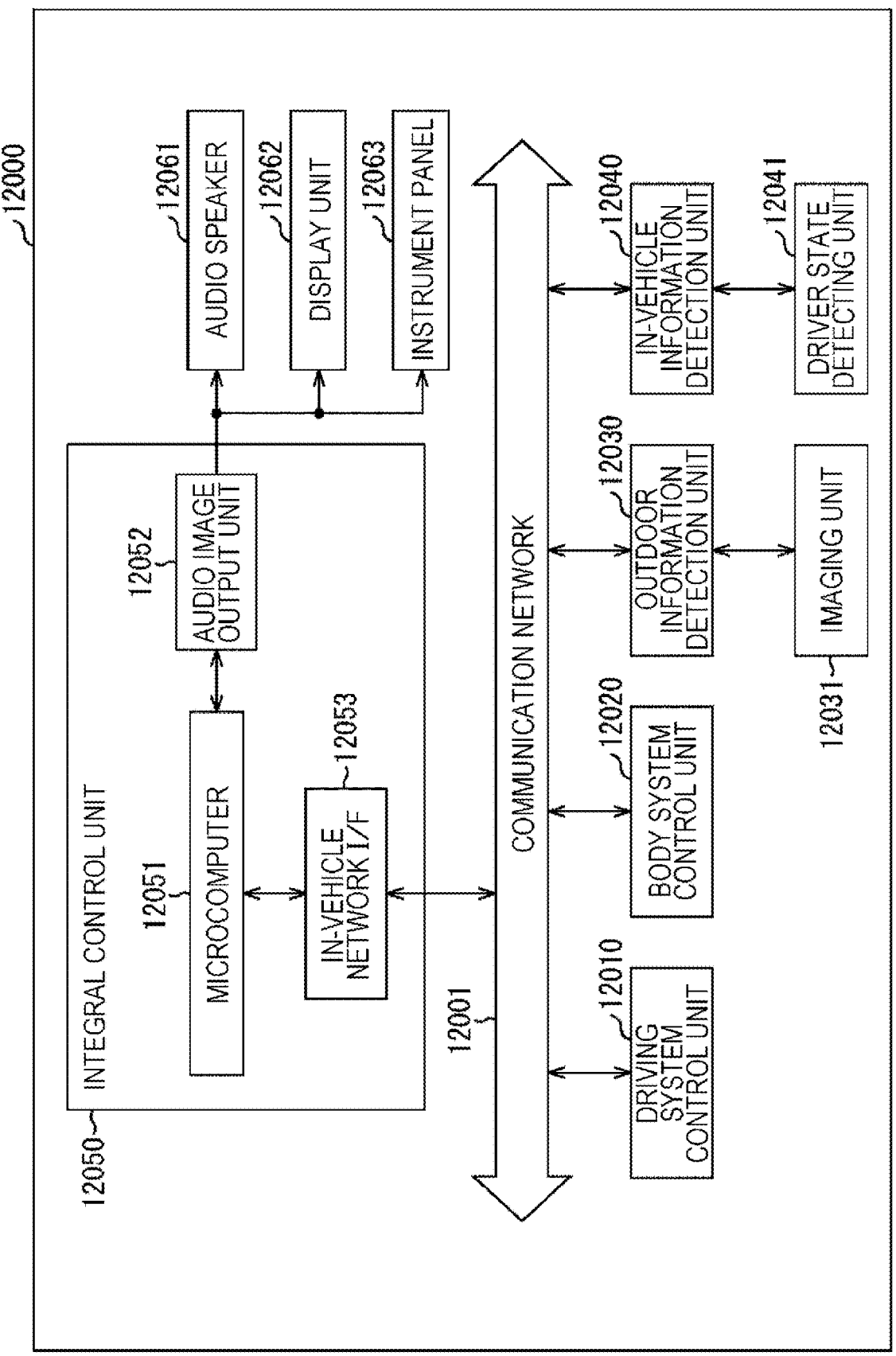
FIG. 40 is a block diagram illustrating an example of a schematic configuration of a vehicle control system.

FIG. 40 is a block diagram illustrating a schematic configuration example of a vehicle control system, which is an example of a movable body control system obtained by applying the technology according to an embodiment of the present disclosure thereto.

A vehicle control system 12000 includes a plurality of electronic control units connected to each other through a communication network 12001. In the example illustrated in FIG. 40, the vehicle control system 12000 includes a driving system control unit 12010, a body system control unit 12020, an outdoor information detection unit 12030, an in-vehicle information detection unit 12040, and an integral control unit 12050. In addition, a microcomputer 12051, an audio image output unit 12052, and an in-vehicle network interface (I/F) 12053 are illustrated as a functional configuration of the integral control unit 12050.

The driving system control unit 12010 controls an operation of a device relevant to a driving system of the vehicle according to various programs. For example, the driving system control unit 12010 functions as a control device of a driving force generating device for generating a driving force of a vehicle, such as an internal-combustion engine or a driving motor, a driving force transfer mechanism for transferring the driving force to a wheel, a steering mechanism adjusting a rudder angle of the vehicle, a braking device generating a braking force of the vehicle, and the like.

The body system control unit 12020 controls the operations of various devices mounted on a vehicle body according to various programs. For example, the body system control unit 12020 functions as a control device of a keyless entry system, a smart key system, an electric window device, and various lamps such as a head lamp, a back lamp, a brake lamp, a winker lamp, or a fog lamp. In this case, an electric wave transmitted from a portable machine instead of a key or signals of various switches can be input into the body system control unit 12020. The body system control unit 12020 receives the input of the electric wave or the signal, and controls the door lock device, the electric window device, the lamp, and the like of the vehicle.

The outdoor information detection unit 12030 detects the outside information of the vehicle on which the vehicle control system 12000 is mounted. For example, an imaging unit 12031 is connected to the outdoor information detection unit 12030. The outdoor information detection unit 12030 images the outdoor image by the imaging unit 12031, and receives the imaged image. The outdoor information detection unit 12030 may perform object detection processing or distance detection processing of a person, a car, an obstacle, a sign, characters on a road surface, or the like, on the basis of the received image.

The imaging unit 12031 is an optical sensor which receives light and outputs an electric signal according to the amount of the received light. The imaging unit 12031 is capable of outputting the electric signal as an image, and is capable of outputting the electric signal as distance measuring information. In addition, the light received by the imaging unit 12031 may be visible light, or may be non-visible light such as an infrared ray.

The in-vehicle information detection unit 12040 detects in-vehicle information. For example, a driver state detecting unit 12041 detecting the state of the driver is connected to the in-vehicle information detection unit 12040. The driver state detecting unit 12041, for example, includes a camera imaging the driver, and the in-vehicle information detection unit 12040 may calculate a fatigue degree or a concentration degree of the driver, or may determine whether or not the driver dozes off, on the basis of detection information input from the driver state detecting unit 12041.

The microcomputer 12051 calculates a control target value of the driving force generating device, the steering mechanism, or the braking device on the basis of the in-vehicle information and the outdoor information, which are acquired in the outdoor information detection unit 12030 or the in-vehicle information detection unit 12040, and is capable of outputting a control command to the driving system control unit 12010. For example, the microcomputer 12051 is capable of performing cooperative control for realizing the function of an advanced driver assistance system (ADAS) including collision avoidance or impact relaxation of the vehicle, following running based on an inter-vehicle distance, vehicle speed maintaining running, collision warning of the vehicle, lane departure warning of the vehicle, and the like.

In addition, the microcomputer 12051 controls driving force generating device, the steering mechanism, the braking device, or the like, on the basis of the information around the vehicle, which is acquired in the outdoor information detection unit 12030 or the in-vehicle information detection unit 12040, and is capable of performing cooperative control for automated driving in which the vehicle autonomously runs without depending on the operation of the driver.

In addition, the microcomputer 12051 is capable of outputting the control command to the body system control unit 12020, on the basis of the outdoor information, which is acquired in the outdoor information detection unit 12030. For example, the microcomputer 12051 controls the head lamp according to the position of a leading vehicle or an oncoming vehicle, which is detected by the outdoor information detection unit 12030, and thus, is capable of performing cooperative control for glare-proof such as switching the high beam with a low beam.

The audio image output unit 12052 transmits at least one output signal of an audio and an image to an output device which is capable of visually or auditorily notifying a person on board or the outdoor of the vehicle of the information. In the example of FIG. 40, an audio speaker 12061, a display unit 12062, and an instrument panel 12063 are exemplified as the output device. The display unit 12062, for example, may include at least one of an on-board display and a head-up display.

Figure 41:
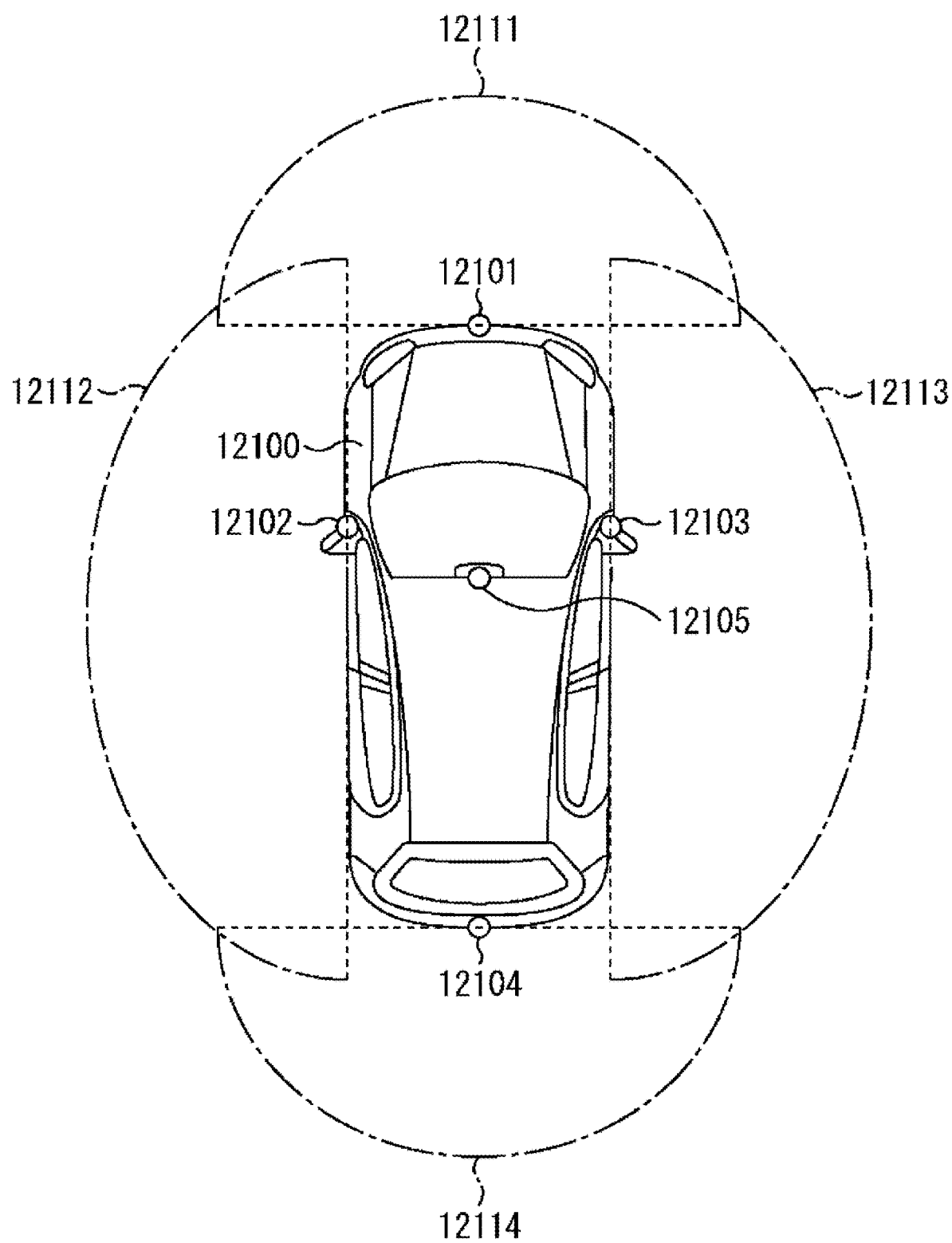
FIG. 41 is an explanatory diagram describing an example of a disposition position of an outdoor information detecting unit and an imaging unit.

FIG. 41 is a diagram illustrating an example of a disposition position of the imaging unit 12031.

In FIG. 41, the imaging unit 12031 includes imaging units 12101, 12102, 12103, 12104, and 12105.

The imaging units 12101, 12102, 12103, 12104, and 12105, for example, are disposed in positions such as a front nose, a side mirror, a rear bumper, a back door of a vehicle 12100, and an upper portion of a front glass of a vehicle interior. The imaging unit 12101 provided in the front nose and the imaging unit 12105 provided in the upper portion of the front glass of the vehicle interior mainly acquire a front image of the vehicle 12100. The imaging units 12102 and 12103 provided in the side mirror mainly acquire a side image of the vehicle 12100. The imaging unit 12104 provided in the rear bumper or the back door mainly acquires a rear image of the vehicle 12100. The imaging unit 12105 provided in the upper portion of the front glass of the vehicle interior is mainly used for detecting a leading vehicle, a pedestrian, an obstacle, a traffic light, a traffic sign, a traffic lane, or the like.

Furthermore, FIG. 41 illustrates an example of shooting ranges of the imaging units 12101 to 12104. The imaging range 12111 illustrates an imaging range of the imaging unit 12101 provided in the front nose, imaging ranges 12112 and 12113 illustrate imaging ranges of the imaging units 12102 and 12103 respectively provided in the side mirror, and the imaging range 12114 illustrates an imaging range of the imaging unit 12104 provided in the rear bumper or the back door. For example, image data items imaged in the imaging units 12101 to 12104 are superimposed on each other, and thus, an overhead image is obtained in which the vehicle 12100 is viewed from the upper side.

At least one of the imaging units 12101 to 12104 may have a function of acquiring the distance information. For example, at least one of the imaging units 12101 to 12104 may be a stereo camera formed of a plurality of imaging elements, or may be an imaging element including a pixel for detecting a phase difference.

For example, the microcomputer 12051 obtains a distance to each solid object in the imaging ranges 12111 to 12114, and a temporal change of the distance (a relative speed with respect to the vehicle 12100), on the basis of the distance information obtained from the imaging units 12101 to 12104, and thus, in particular, it is possible to extract the solid object running at a predetermined speed (for example, greater than or equal to 0 km/h) in approximately the same direction as that of the vehicle 12100 as the leading vehicle, in the closest solid object on a traveling path of the vehicle 12100. Further, the microcomputer 12051 sets the inter-vehicle distance to be ensured in advance immediately before the leading vehicle, and thus, is capable of performing automatic brake control (also including following stop control), automatic acceleration control (also including following start control), or the like. Thus, it is possible to perform the cooperative control for the automated driving in which the vehicle autonomously runs without depending on the operation of the driver.

For example, it is possible for the microcomputer 12051 to extract solid object data relevant to the solid object by sorting the data into other solid objects such as a two-wheeled vehicle, an ordinary vehicle, a large vehicle, a pedestrian, and a telegraph pole, on the basis of the distance information obtained from the imaging units 12101 to 12104, and to use the data for automatically avoiding the obstacle. For example, the microcomputer 12051 distinguishes the obstacle around the vehicle 12100 between an obstacle which is visible to the driver of the vehicle 12100 and an obstacle which is not visible. Then, the microcomputer 12051 determines collision risk representing a dangerous extent of the collision with respect to each of the obstacles, and in the case of a situation in which the collision risk is greater than or equal to a set value, that is, there is a possibility of the collision, an alarm is output to the driver through the audio speaker 12061 or the display unit 12062, or forced deceleration and avoidance steering is performed through the driving system control unit 12010, and thus, it is possible to perform driving assistance for avoiding the collision.

At least one of the imaging units 12101 to 12104 may be an infrared ray camera detecting an infrared ray. For example, the microcomputer 12051 determines whether or not the pedestrian exists in the imaged images of the imaging units 12101 to 12104, and thus, it is possible to recognize the pedestrian. Such recognition of the pedestrian, for example, is performed in the order of extracting a characteristic point in the imaged images of the imaging units 12101 to 12104 as the infrared ray camera and the order of determining whether or not there is the pedestrian by performing pattern matching processing with respect to a set of characteristic points representing the outline of the object. The microcomputer 12051 determines that the pedestrian exists in the imaged images of the imaging units 12101 to 12104, and in a case where the pedestrian is recognized, the audio image output unit 12052 controls the display unit 12062 such that a rectangular outline for emphasis is displayed by being superimposed on the recognized pedestrian. In addition, the audio image output unit 12052 may control the display unit 12062 such that an icon or the like representing the pedestrian is displayed in a desired position.

As described above, an example of the vehicle control system, which can be obtained by applying the technology according to an embodiment of the present disclosure thereto, has been described. In the configurations described above, the technology according to an embodiment of the present disclosure, for example, can be applied to the imaging unit 12031. Specifically, for example, the imaging device 10 of FIG. 1 can be applied to the imaging unit 12031. By applying the technology according to an embodiment of the present disclosure to the imaging unit 12031, for example, it is possible to more specifically acquire the outdoor information with a higher accuracy, and to realize improvement or the like or the safety of the automated driving.

Furthermore, the embodiment of the present technology are not limited to the embodiments described above, and can be variously changed within a range not departing from the gist of the present technology.

<Combination Example of Configurations>

In addition, for example, the present technology is capable of having the following configurations.

According to the present disclosure, an imaging device is provided comprising a filter layer configured to selectively filter incident light according to wavelengths of the light, and a photoelectric conversion layer configured to receive light filtered by the filter layer and to produce an electric charge in response to the received light, wherein the filter layer includes a first filter region corresponding to a first pixel of the imaging device, the first filter region having a first thickness and a plurality of through holes formed therein, wherein the first filter region transmits light incident on the first filter region with a first peak transmission wavelength, and a second filter region corresponding to a second pixel of the imaging device, the second filter region having a second thickness greater than the first thickness and having a plurality of through holes formed therein, wherein the second filter region transmits light incident on the second filter region with a second peak transmission wavelength that is greater than the first peak transmission wavelength.

According to some embodiments, the plurality of through holes formed in the first filter region have a first hole pitch, and the plurality of through holes formed in the second filter region have a second hole pitch, and wherein the second hole pitch is greater than the first hole pitch.

According to some embodiments, the first filter region and second filter region are plasmon filters.

According to some embodiments, the plurality of through holes formed in the first filter region and the plurality of through holes formed in the second filter region are each arranged in an array.

According to some embodiments, the array is a hexagonal array.

According to some embodiments, the filter layer further comprises a plurality of non-through holes formed therein.

According to some embodiments, the plurality of through holes formed in the first filter region are arranged in a first array and wherein a plurality of non-through holes is formed in the first filter region and arranged in a second array overlapping the first array.

According to some embodiments, the second thickness is at least twice as great as the first thickness.

According to some embodiments, the imaging device further comprises a first lens corresponding to the first pixel configured to direct light to the first filter region.

According to some embodiments, the filter layer comprises aluminum, silver and/or gold.

According to some embodiments, the imaging device further comprises a first dielectric film disposed on a first side of the filter layer between the filter layer and the photoelectric conversion layer and a second dielectric film disposed on a second side of the filter layer opposing the first side.

According to some embodiments, the first filter region is contiguous with the second filter region and wherein the first filter region and second filter region have a coplanar side.

Further according to the present disclosure, an imaging device is provided comprising a filter layer configured to selectively filter incident light according to wavelengths of the light, and a photoelectric conversion layer configured to receive light filtered by the filter layer and to produce an electric charge in response to the received light, wherein the filter layer includes a first filter region corresponding to a first pixel of the imaging device, the first filter region having a first thickness and a dot array formed therein, wherein the first filter region transmits light incident on the first filter region with a first peak absorption wavelength, an a second filter region corresponding to a second pixel of the imaging device, the second filter region having a second thickness greater than the first thickness and having a dot array formed therein, wherein the second filter region transmits light incident on the second filter region with a second peak absorption wavelength that is greater than the first peak absorption wavelength.

According to some embodiments, the filter layer comprises a dielectric material disposed between at least some of the dots of the dot array formed within the first filter region and between at least some of the dots of the dot array formed within the second filter region.

According to some embodiments, dots of the dot array formed in the first filter region have a first hole pitch, wherein dots of the dot array formed in the second filter region have a second hole pitch, and wherein the second hole pitch is greater than the first hole pitch.

According to some embodiments, the first filter region and second filter region are plasmon filters.

According to some embodiments, the dot array formed in the first filter region and the dot array formed in the second filter region are hexagonal arrays or square arrays.

According to some embodiments, the second thickness is at least twice as great as the first thickness.

According to some embodiments, the imaging device further comprises a first lens corresponding to the first pixel configured to direct light to the first filter region.

According to some embodiments, the filter layer comprises aluminum, silver and/or gold.

(1)

An imaging element, including:

a metal thin film filter which is disposed on an incident side of light from a photoelectric conversion element in at least a part of pixels, and of which a film thickness of a conductor thin film is different according to the pixel.

(2)

The imaging element according to (1), in which the film thickness of the conductor thin film of the metal thin film filter is different according to a transmission band or an absorption band of the metal thin film filter.

(3)

The imaging element according to (2), in which a transmission band of a first metal thin film filter in a first pixel is a wavelength shorter than a transmission band of a second metal thin film filter in a second pixel, and a conductor thin film of the first metal thin film filter is thinner than a conductor thin film of the second metal thin film filter.

(4)

The imaging element according to (3), in which the metal thin film filter is a plasmon filter having a hole array structure, and a hole pitch of the first metal thin film filter is narrower than a hole pitch of the second metal thin film filter.

(5)

The imaging element according to (2), in which an absorption band of a first metal thin film filter in a first pixel is a wavelength shorter than an absorption band of a second metal thin film filter in a second pixel, and a conductor thin film of the first metal thin film filter is thicker than a conductor thin film of the second metal thin film filter.

(6)

The imaging element according to (5), in which the metal thin film filter is a plasmon filter having a dot array structure, and a dot pitch of the first metal thin film filter is narrower than a dot pitch of the second metal thin film filter.

(7)
The imaging element according to any of (1) to (6), in which the film thickness of the conductor thin film of the metal thin film filter has two or more types of film thicknesses.

(8)
The imaging element according to according to any of (1) to (4), further including:
a transmission filter which is disposed on the incident side of the light from the metal thin film filter, and includes a transmission band having a transmission band of the metal thin film filter.

(9)
A manufacturing method of an imaging element, including:
a first step of forming a metal film on an interlayer film in a first pixel and a second pixel;
a second step of removing the metal film in the first pixel;
a third step of further forming a metal film in the first pixel and the second pixel; and
a fourth step of forming a hole on the metal film in the first pixel and the second pixel.

(10)
A manufacturing method of an imaging element, including:
a first step of forming a first groove in a portion other than a portion corresponding to a hole of a metal thin film filter of an interlayer film in a first pixel;
a second step of forming a second groove of which a depth is different from a depth of the first groove in the portion other than the portion corresponding to the hole of the metal thin film filter of the interlayer film in a second pixel;
a third step of forming a metal film on the interlayer film in the first pixel and the second pixel and of filling the first groove and the second groove with the metal film; and
a fourth step of removing the metal film up to a front surface of the interlayer film in the first pixel and the second pixel.

(11)
A metal thin film filter which is disposed on an incident side of light from a photoelectric conversion element in at least a part of pixels, and of which a film thickness of a conductor thin film is different according to the pixel.

(12)
An electronic device, including:
an imaging element; and
a signal processing unit that processes a signal which is output from the imaging element,
in which the imaging element includes a metal thin film filter which is disposed on an incident side of light from a photoelectric conversion element in at least a part of pixels, and of which a film thickness of a conductor thin film is different according to the pixel.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

10 Imaging device
11 Optical system
12, 12A to 12C Imaging element
14 Signal processing unit
31 Pixel array
51 Pixel
61 Photodiode
101 On-chip microlens
102 Interlayer film
103 Narrow band filter layer
104 Interlayer film
105 Photoelectric conversion element layer
106 Signal wiring layer
107 Color filter layer
108 Filter layer
121A to 121D Plasmon filter
131A to 131C Conductor thin film
132A to 132C' Hole
133A, 133B Dot
134A, 134B Dielectric layer
151 Plasmon filter
161A Movable thin film
162 SiO2 film
163 SiN film
164 SiO2 substrate
203, 221 Semiconductor chip
301 Conductor thin film
302A, 302B Hole
321 Oxide film
322 Metal film
351 Conductor thin film
352A, 352B Hole
371 Oxide film
374 Metal film
NB Narrow band filter
P Transmission filter

The invention claimed is:

1. An imaging device, comprising:
a filter layer configured to selectively filter incident light according to wavelengths of the light; and
a photoelectric conversion layer configured to receive light filtered by the filter layer and to produce an electric charge in response to the received light,
wherein the filter layer includes:
a first filter region corresponding to a first pixel of the imaging device, the first filter region having a first thickness and a plurality of through holes formed therein, wherein the first filter region transmits light incident on the first filter region with a first peak transmission wavelength; and
a second filter region corresponding to a second pixel of the imaging device, the second filter region having a second thickness greater than the first thickness and having a plurality of through holes formed therein, wherein the second filter region transmits light incident on the second filter region with a second peak transmission wavelength that is greater than the first peak transmission wavelength.

2. The imaging device of claim 1, wherein the plurality of through holes formed in the first filter region have a first hole pitch, wherein the plurality of through holes formed in the second filter region have a second hole pitch, and wherein the second hole pitch is greater than the first hole pitch.

3. The imaging device of claim 1, wherein the first filter region and second filter region are plasmon filters.

4. The imaging device of claim 1, wherein the plurality of through holes formed in the first filter region and the plurality of through holes formed in the second filter region are each arranged in an array.

5. The imaging device of claim 4, wherein the array is a hexagonal array.

6. The imaging device of claim 1, wherein the filter layer further comprises a plurality of non-through holes formed therein.

7. The imaging device of claim 6, wherein the plurality of through holes formed in the first filter region are arranged in a first array and wherein a plurality of non-through holes is formed in the first filter region and arranged in a second array overlapping the first array.

8. The imaging device of claim 1, wherein the second thickness is at least twice as great as the first thickness.

9. The imaging device of claim 1, further comprising a first lens corresponding to the first pixel configured to direct light to the first filter region.

10. The imaging device of claim 1, wherein the filter layer comprises aluminum, silver and/or gold.

11. The imaging device of claim 1, further comprising a first dielectric film disposed on a first side of the filter layer between the filter layer and the photoelectric conversion layer and a second dielectric film disposed on a second side of the filter layer opposing the first side.

12. The imaging device of claim 1, wherein the first filter region is contiguous with the second filter region and wherein the first filter region and second filter region have a coplanar side.

13. An imaging device, comprising:
a filter layer configured to selectively filter incident light according to wavelengths of the light; and
a photoelectric conversion layer configured to receive light filtered by the filter layer and to produce an electric charge in response to the received light,
wherein the filter layer includes:
a first filter region corresponding to a first pixel of the imaging device, the first filter region having a first thickness and a dot array formed therein, wherein the first filter region transmits light incident on the first filter region with a first peak absorption wavelength; and
a second filter region corresponding to a second pixel of the imaging device, the second filter region having a second thickness greater than the first thickness and having a dot array formed therein, wherein the second filter region transmits light incident on the second filter region with a second peak absorption wavelength that is greater than the first peak absorption wavelength.

14. The imaging device of claim 13, wherein the filter layer comprises a dielectric material disposed between at least some of the dots of the dot array formed within the first filter region and between at least some of the dots of the dot array formed within the second filter region.

15. The imaging device of claim 13, wherein dots of the dot array formed in the first filter region have a first hole pitch, wherein dots of the dot array formed in the second filter region have a second hole pitch, and wherein the second hole pitch is greater than the first hole pitch.

16. The imaging device of claim 13, wherein the first filter region and second filter region are plasmon filters.

17. The imaging device of claim 13, wherein the dot array formed in the first filter region and the dot array formed in the second filter region are hexagonal arrays or square arrays.

18. The imaging device of claim 13, wherein the second thickness is at least twice as great as the first thickness.

19. The imaging device of claim 13, further comprising a first lens corresponding to the first pixel configured to direct light to the first filter region.

20. The imaging device of claim 13, wherein the filter layer comprises aluminum, silver and/or gold.

* * * * *